(12) United States Patent
Yamazaki et al.

(10) Patent No.: US 8,945,962 B2
(45) Date of Patent: Feb. 3, 2015

(54) THIN FILM TRANSISTOR, DISPLAY DEVICE HAVING THIN FILM TRANSISTOR, AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Yoshiyuki Kurokawa, Sagamihara (JP); Yasuhiro Jinbo, Atsugi (JP); Satoshi Kobayashi, Atsugi (JP); Daisuke Kawae, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/845,443

(22) Filed: Mar. 18, 2013

(65) Prior Publication Data

US 2013/0217191 A1 Aug. 22, 2013

Related U.S. Application Data

(63) Continuation of application No. 12/238,517, filed on Sep. 26, 2008, now abandoned.

(30) Foreign Application Priority Data

Oct. 5, 2007 (JP) ................................ 2007-262739
Oct. 12, 2007 (JP) ................................ 2007-267085

(51) Int. Cl.
*H01L 21/00* (2006.01)
*H01L 29/66* (2006.01)
(Continued)

(52) U.S. Cl.
CPC .......... *H01L 29/66765* (2013.01); *H01L 29/04* (2013.01); *H01L 29/78696* (2013.01); *H01L 28/40* (2013.01); *H01L 29/41733* (2013.01); *H01L 29/4908* (2013.01)
USPC ................ 438/34; 438/253; 257/66; 257/306

(58) Field of Classification Search
CPC .......... G03F 7/26; G03F 7/0005; H01L 21/32
USPC .............................. 257/66, 306; 438/253, 34
See application file for complete search history.

(56) References Cited

U.S. PATENT DOCUMENTS 4,409,134 A 10/1983 Yamazaki
5,256,509 A 10/1993 Hayashi et al.
(Continued)

FOREIGN PATENT DOCUMENTS

CN 101043047 9/2007
EP 0 473 988 A 3/1992
(Continued)

OTHER PUBLICATIONS

Arai et al., "41.2: Micro Silicon Technology for Active Matrix OLED Display," SID Digest '07: SID International Symposium Digest of Technical Papers, 2007, vol. 38, pp. 1370-1373.

(Continued)

*Primary Examiner* — Jamie C Niesz
(74) *Attorney, Agent, or Firm* — Eric J. Robinson; Robinson Intellectual Property Law Office, P.C.

(57) ABSTRACT

In a method for manufacturing a semiconductor device including a transistor and a conductive film over a substrate, a first insulating film and a second insulating film are formed over the transistor and the conductive film sequentially. Then, an opening and a recessed portion are formed in the second insulating film using one multi-tone photomask, wherein the opening is deeper than the recessed portion in the second insulating film. By using the opening, a first contact hole exposing one of the electrodes of the transistor is formed through the first and second insulating films and, by using the recessed portion, a second contact hole exposing the first insulating film is formed through the second insulating film. Moreover, an electrode is formed on and in contact with the one of the electrodes in the first contact hole and the first insulating film in the second contact hole.

25 Claims, 55 Drawing Sheets

(51) Int. Cl.
*H01L 29/04* (2006.01)
*H01L 29/786* (2006.01)
*H01L 49/02* (2006.01)
*H01L 29/417* (2006.01)
*H01L 29/49* (2006.01)

(56) References Cited

U.S. PATENT DOCUMENTS

| | | |
|---|---|---|
| 5,453,858 A | 9/1995 | Yamazaki |
| 5,495,121 A | 2/1996 | Yamazaki et al. |
| 5,591,987 A | 1/1997 | Yamazaki et al. |
| 5,648,662 A | 7/1997 | Zhang et al. |
| 5,686,349 A | 11/1997 | Nakata |
| 5,701,167 A | 12/1997 | Yamazaki |
| 5,716,871 A | 2/1998 | Yamazaki et al. |
| 5,766,989 A | 6/1998 | Maegawa et al. |
| 5,811,328 A | 9/1998 | Zhang et al. |
| 5,825,050 A | 10/1998 | Hirakawa |
| 5,849,601 A | 12/1998 | Yamazaki |
| 5,910,019 A | 6/1999 | Watanabe et al. |
| 5,989,969 A | 11/1999 | Watanabe et al. |
| 6,023,075 A | 2/2000 | Yamazaki |
| 6,078,059 A | 6/2000 | Nakata |
| 6,124,155 A | 9/2000 | Zhang et al. |
| 6,166,399 A | 12/2000 | Zhang et al. |
| 6,252,249 B1 | 6/2001 | Yamazaki |
| 6,268,235 B1 | 7/2001 | Sakakura et al. |
| 6,306,213 B1 | 10/2001 | Yamazaki |
| 6,335,213 B1 | 1/2002 | Zhang et al. |
| 6,570,552 B2 | 5/2003 | Yamazaki |
| 6,756,258 B2 | 6/2004 | Zhang et al. |
| 6,797,548 B2 | 9/2004 | Zhang et al. |
| 6,847,064 B2 | 1/2005 | Zhang et al. |
| 6,855,957 B1 | 2/2005 | Yamazaki et al. |
| 7,067,844 B2 | 6/2006 | Yamazaki |
| 7,098,479 B1 | 8/2006 | Yamazaki |
| 7,115,448 B2 | 10/2006 | Tsujimura et al. |
| 7,115,902 B1 | 10/2006 | Yamazaki |
| 7,148,542 B2 | 12/2006 | Yamazaki et al. |
| 7,205,171 B2 | 4/2007 | Luo et al. |
| 7,375,372 B2 | 5/2008 | Luo et al. |
| 7,687,325 B2 | 3/2010 | Yamazaki et al. |
| 7,759,735 B2 | 7/2010 | Maekawa |
| 7,824,952 B2 | 11/2010 | Choi et al. |
| 8,003,420 B2 | 8/2011 | Maekawa |
| 8,183,559 B2 | 5/2012 | Tsutsui |
| 2003/0076452 A1* | 4/2003 | Kim et al. ............... 349/43 |
| 2004/0188685 A1 | 9/2004 | Lin et al. |
| 2004/0207023 A1 | 10/2004 | Nishiyama et al. |
| 2005/0012097 A1 | 1/2005 | Yamazaki |
| 2005/0017243 A1 | 1/2005 | Zhang et al. |
| 2006/0091394 A1 | 5/2006 | Honda |
| 2006/0246639 A1 | 11/2006 | Choi et al. |
| 2007/0018165 A1 | 1/2007 | Yamazaki |
| 2007/0035676 A1 | 2/2007 | Hosoya |
| 2007/0090351 A1 | 4/2007 | Park et al. |
| 2007/0247558 A1* | 10/2007 | Lin ........................ 349/43 |
| 2008/0003526 A1* | 1/2008 | Kim et al. ............... 430/313 |
| 2008/0044962 A1 | 2/2008 | Zhang et al. |
| 2008/0105877 A1 | 5/2008 | Yamazaki et al. |
| 2008/0143912 A1* | 6/2008 | Kim ........................ 349/48 |
| 2008/0188050 A1 | 8/2008 | Sekiguchi et al. |
| 2008/0308807 A1 | 12/2008 | Yamazaki et al. |
| 2009/0020759 A1 | 1/2009 | Yamazaki |
| 2009/0039351 A1 | 2/2009 | Kobayashi et al. |
| 2009/0039352 A1 | 2/2009 | Kobayashi et al. |
| 2009/0045401 A1 | 2/2009 | Yamazaki et al. |
| 2009/0047758 A1 | 2/2009 | Yamazaki et al. |
| 2009/0047759 A1 | 2/2009 | Yamazaki et al. |
| 2009/0200551 A1 | 8/2009 | Won et al. |
| 2010/0044713 A1 | 2/2010 | Miyaguchi et al. |

FOREIGN PATENT DOCUMENTS

| | | |
|---|---|---|
| EP | 0535979 A | 4/1993 |
| EP | 0592227 A | 4/1994 |
| EP | 0731491 A | 9/1996 |
| EP | 1367659 A | 12/2003 |
| EP | 1 837 913 A | 9/2007 |
| JP | 60-098680 A | 6/1985 |
| JP | 60-160170 A | 8/1985 |
| JP | 61-087371 A | 5/1986 |
| JP | 62-067872 A | 3/1987 |
| JP | 63-258072 A | 10/1988 |
| JP | 04-025178 A | 1/1992 |
| JP | 04-242724 A | 8/1992 |
| JP | 05-226656 A | 9/1993 |
| JP | 06-077483 A | 3/1994 |
| JP | 06-196701 A | 7/1994 |
| JP | 06-326312 A | 11/1994 |
| JP | 10-261801 A | 9/1998 |
| JP | 11-121761 A | 4/1999 |
| JP | 11-177094 A | 7/1999 |
| JP | 2001-007024 A | 1/2001 |
| JP | 2001-127296 A | 5/2001 |
| JP | 2001-217424 A | 8/2001 |
| JP | 2002-246605 A | 8/2002 |
| JP | 2005-039283 A | 2/2005 |
| JP | 2005-049832 A | 2/2005 |
| JP | 2005-167051 A | 6/2005 |
| JP | 2005-322845 A | 11/2005 |
| JP | 2007-005508 A | 1/2007 |
| JP | 2007-035964 A | 2/2007 |
| JP | 2007-049171 A | 2/2007 |
| KR | 2006-0050514 A | 5/2006 |
| TW | 234575 | 11/1994 |
| TW | 235374 | 12/1994 |
| TW | 368695 | 9/1999 |
| TW | 489353 | 6/2002 |
| TW | 200308093 | 12/2003 |

OTHER PUBLICATIONS

Lee et al., "How to Achieve High Mobility Thin Film Transistors by Direct Deposition of Silicon Using 13.56 MHz RF PECVD?", IEDM 06: Technical Digest of International Electron Devices Meeting, Dec. 11, 2006, pp. 295-298.

Lee et al., "Directly Deposited Nanocrystalline Silicon Thin-Film Transistors with Ultra High Mobilities," Appl. Phys. Lett. (Applied Physics Letters), Dec. 18, 2006, vol. 89, No. 25, pp. 252101-1-252101-3.

Lee et al., "High-Mobility Nanocrystalline Silicon Thin-Film Transistors Fabricated by Plasma-Enhanced Chemical Vapor Deposition," Appl. Phys. Lett. (Applied Physics Letters), May 24, 2005, vol. 86, pp. 222106-1-222106-3.

Lee et al., "High-Mobility N-Channel and P-Channel Nanocrystalline Silicon Thin-Film Transistors," IEDM 05: Technical Digest of International Electron Devices Meeting, 2005, pp. 937-940.

Esmaeili-Rad et al., "High Stability, Low Leakage Nanocrystalline Silicon Bottom Gate Thin Film Transistors for AMOLED Displays," IEDM 06: Technical Digest of International Electron Devices Meeting, 2006, pp. 303-306.

Lee et al., "Leakage Current Mechanisms in Top-Gate Nanocrystalline Silicon Thin-Film Transistors," Appl. Phys. Lett. (Applied Physics Letters), Feb. 28, 2008, vol. 92, pp. 083509-1-083509-3.

Esmaeili-Rad et al., "Absence of Defect State Creation in Nanocrystalline Silicon Thin-Film Transistors Deduced from Constant Current Stress Measurements," Appl. Phys. Lett. (Applied Physics Letters) Sep. 12, 2007, vol. 91, No. 11, pp. 113511-1-113511-3.

Lee et al., "Stability of nc-Si:H TFTs with Silicon Nitride Gate Dielectric," IEEE Transactions on Electron Devices, Jan. 2007, vol. 54, No. 1, pp. 45-51.

Sazonov et al., "Low-Temperature Materials and Thin Film Transistors for Flexible Electronics," Proceedings of the IEEE, Aug. 1, 2005, vol. 93, No. 8, pp. 1420-1428.

Esmaeili-Rad et al., "Stability of Nanocrystalline Silicon Bottom-Gate Thin-Film Transistors With Silicon Nitride Gate Dielectric," J. Appl. Phys. (Journal of Applied Physics), Sep. 28, 2007, vol. 102, No. 6, pp. 064512-1-064512-7.

(56) References Cited

OTHER PUBLICATIONS

Lee et al., "Top-Gate TFTs using 13.56MHz PECVD Microcrystalline Silicon," IEEE Electron Device Letters, Sep. 5, 2005, vol. 26, No. 9, pp. 637-639.

Lee et al., "Postdeposition Thermal Annealing and Material Stability of 75° C. Hydrogenated Nanocrystalline Silicon Plasma-Enhanced Chemical Vapor Deposition Films," J. Appl. Phys. (Journal of Applied Physics), Aug. 4, 2005, vol. 98, No. 3, pp. 034305-1-034305-7.

Chinese Office Action (Application No. 200810168087.8) dated Jul. 18, 2012.

Taiwanese Office Action (Application No. 97137937) Dated Jan. 17, 2014.

Korean Office Action (Application No. 2008-0096096) Dated Oct. 2, 2014.

* cited by examiner

THIN FILM TRANSISTOR, DISPLAY DEVICE HAVING THIN FILM TRANSISTOR, AND METHOD FOR MANUFACTURING THE SAME

BACKGROUND OF THE INVENTION

1. Field of the Invention

The present invention relates to a thin film transistor, a display device having the thin film transistor at least in a pixel portion, and a method for manufacturing the thin film transistor and the display device.

2. Description of the Related Art

In recent years, technology for forming thin film transistors using a thin semiconductor film (with a thicknesses of from several tens of nanometers to several hundreds of nanometers, approximately) formed over a substrate having an insulating surface has been attracting attention. Thin film transistors are applied to a wide range of electronic devices such as ICs or electro-optical devices, and prompt development of thin film transistors that are to be used as switching elements in display devices, in particular, is being pushed.

As a switching element in a display device, a thin film transistor including an amorphous semiconductor film, a thin film transistor including a polycrystalline semiconductor film, or the like is used. As a method for forming a polycrystalline semiconductor film, a technique is known in which a pulsed excimer laser beam is processed into a linear shape with an optical system, and an amorphous silicon film is scanned with the linear beam, thereby being crystallized.

As a switching element in a display device, further, a thin film transistor including a microcrystalline semiconductor film is used (see Reference 1: Japanese Published Patent Application No. H4-242724; and Reference 2: Japanese Published Patent Application No. 2005-49832).

SUMMARY OF THE INVENTION

A thin film transistor including a polycrystalline semiconductor film has advantages that the field effect mobility thereof is two or more orders of magnitude higher than that of a thin film transistor including an amorphous semiconductor film, and that a pixel portion and a peripheral driver circuit of a display device can be formed over one substrate. However, the thin film transistor including a polycrystalline semiconductor film requires a more complicated process than the thin film transistor including an amorphous semiconductor film because of crystallization of the semiconductor film. Thus, there are problems such as a reduction in yield and an increase in cost.

Further, an inverted-staggered thin film transistor including a microcrystalline semiconductor film has problems in that the crystallinity of an interface region between a gate insulating film and a microcrystalline semiconductor film is low and electric characteristics are poor.

In view of the above problems, it is an object of the present invention to provide a thin film transistor having excellent electric characteristics, a display device having the thin film transistor, and a method for manufacturing the thin film transistor and the display device.

An aspect of the present invention is a thin film transistor including a gate insulating film formed over a gate electrode, a microcrystalline semiconductor film formed over the gate insulating film, a pair of buffer layers formed over the microcrystalline semiconductor film, a pair of semiconductor films to which an impurity element imparting one conductivity type is added and which is formed over the pair of buffer layers, and wirings formed over the pair of semiconductor films to which the impurity element imparting one conductivity type is added; in which a part of the gate insulating film or the entire gate insulating film, and/or a part of the microcrystalline semiconductor film or the entire microcrystalline semiconductor film includes an impurity element which serves as a donor.

Further, typically, a feature of the thin film transistor of the present invention is that a region of the microcrystalline semiconductor film which is in contact with the gate insulating film includes the impurity element which serves as a donor. In that case, the entire microcrystalline semiconductor film can include the impurity element which serves as a donor. Further, only a region of the microcrystalline semiconductor film which is in contact with the gate insulating film can include the impurity element which serves as a donor. In that case, a first microcrystalline semiconductor film including the impurity element which serves as a donor is formed in the region which is in contact with the gate insulating film, and a second microcrystalline semiconductor film is formed over the first microcrystalline semiconductor film. The second microcrystalline semiconductor film does not include the impurity element which serves as a donor at a higher concentration than the detection limit of secondary ion mass spectrometry (SIMS).

Alternatively, a feature of the thin film transistor of the present invention is that the gate insulating film includes the impurity element which serves as a donor.

Further alternatively, a feature of the thin film transistor of the present invention is that a first microcrystalline semiconductor film that is in contact with a gate insulating film, a second microcrystalline semiconductor film that is in contact with the first microcrystalline semiconductor film and includes an impurity element which serves as a donor, and a third microcrystalline semiconductor film that is in contact with the second microcrystalline semiconductor film including the impurity element which serves as a donor are formed. The first microcrystalline semiconductor film and the third microcrystalline semiconductor film do not include the impurity element which serves as a donor at a higher concentration than the detection limit of SIMS.

Here, the gate insulating film or the microcrystalline semiconductor film includes the impurity element which serves as a donor at a peak concentration of from $6 \times 10^{15}$ to $3 \times 10^{18}$ atoms/cm$^3$ inclusive, preferably from $3 \times 10^{16}$ to $3 \times 10^{17}$ atoms/cm$^3$ inclusive. Further, the concentration of the impurity element which serves as a donor is determined by the peak value of the concentration distribution (concentration profile) which is measured by SIMS.

Another feature of the present invention is that a gate insulating film or a microcrystalline semiconductor film which includes an impurity element which serves as a donor is formed and a thin film transistor is formed in which the microcrystalline semiconductor film serves as a channel formation region. In the microcrystalline semiconductor film that serves as a channel formation region, the peak concentration of the impurity element which serves as a donor is from $6 \times 10^{15}$ to $3 \times 10^{18}$ atoms/cm$^3$ inclusive, preferably from $3 \times 10^{16}$ to $3 \times 10^{17}$ atoms/cm$^3$ inclusive.

Typically, a gate insulating film is formed over a gate electrode; gas including an impurity element which serves as a donor is introduced into a reaction chamber, and then a microcrystalline semiconductor film including the impurity element which serves as a donor is formed over the gate insulating film, using deposition gas including silicon or germanium, and hydrogen; and a thin film transistor is manufactured using the microcrystalline semiconductor film.

Alternatively, a gate insulating film is formed over a gate electrode; a first microcrystalline semiconductor film including an impurity element which serves as a donor is formed over the gate insulating film, using gas including the impurity element which serves as a donor, deposition gas including silicon or germanium, and hydrogen; a second microcrystalline semiconductor film is formed over the first microcrystalline semiconductor film, using deposition gas including silicon or germanium, and hydrogen; and a thin film transistor is manufactured using the first microcrystalline semiconductor film and the second microcrystalline semiconductor film.

Further alternatively, a gate insulating film including an impurity element which serves as a donor is formed over a gate electrode, using gas including the impurity element which serves as a donor, and deposition gas including silicon or germanium; a microcrystalline semiconductor film including the impurity element which serves as a donor is formed over the gate insulating film including the impurity element which serves as a donor, using deposition gas including silicon or germanium, and hydrogen; and a thin film transistor is manufactured using the microcrystalline semiconductor film.

Further alternatively, a protective film including an impurity element which serves as a donor is formed on an inner wall of a reaction chamber of a plasma CVD apparatus, using gas including the impurity element which serves as a donor, deposition gas including silicon or germanium, and hydrogen; then, a substrate provided with a gate electrode is carried in the reaction chamber; a gate insulating film is formed over the gate electrode; a microcrystalline semiconductor film is formed over the gate insulating film, using deposition gas including silicon or germanium, and hydrogen; and a thin film transistor is manufactured using the microcrystalline semiconductor film.

Further alternatively, gas including an impurity element which serves as a donor is fed into a reaction chamber of a plasma CVD apparatus; then, a gate insulating film including the impurity element which serves as a donor is formed over a substrate provided with a gate electrode; a microcrystalline semiconductor film is formed over the gate insulating film, using deposition gas including silicon or germanium, and hydrogen; and a thin film transistor is manufactured using the microcrystalline semiconductor film.

Further alternatively, a gate insulating film is formed over a substrate provided with a gate electrode; gas including an impurity element which serves as a donor is fed into a reaction chamber of a plasma CVD apparatus; then, a microcrystalline semiconductor film including the impurity element which serves as a donor is formed over the gate insulating film, using deposition gas including silicon or germanium, and hydrogen; and a thin film transistor is manufactured using the microcrystalline semiconductor film including the impurity element which serves as a donor.

Further alternatively, a first gate insulating film is formed over a substrate provided with a gate electrode; gas including an impurity element which serves as a donor is fed into a reaction chamber of a plasma CVD apparatus; then, a second gate insulating film including the impurity element which serves as a donor is formed over the first gate insulating film, using non-deposition gas including oxygen or nitrogen, and deposition gas including silicon; a microcrystalline semiconductor film is formed over the second gate insulating film; and a thin film transistor is manufactured using the microcrystalline semiconductor film.

Further alternatively, a first gate insulating film is formed over a substrate provided with a gate electrode; a second gate insulating film is formed over the first gate insulating film; then, gas including an impurity element which serves as a donor for a semiconductor is fed into a reaction chamber of a plasma CVD apparatus; subsequently, a third gate insulating film including the impurity element which serves as a donor is formed over the second gate insulating film, using non-deposition gas including oxygen or nitrogen, and deposition gas including silicon; a microcrystalline semiconductor film is formed over the third gate insulating film, using deposition gas including silicon or germanium, and hydrogen; and a thin film transistor is manufactured using the microcrystalline semiconductor film.

The impurity element which serves as a donor is phosphorus, arsenic, or antimony.

A gate insulating film including an impurity element which serves as a donor is formed over a gate electrode, or an impurity element which serves as a donor is adsorbed onto a gate insulating film, whereby crystallinity can be increased at an interface with the gate insulating film in forming the microcrystalline semiconductor film. Thus, a thin film transistor can be manufactured in which the microcrystalline semiconductor film whose crystallinity has been increased at the interface with the gate insulating film is used for a channel formation region.

Further, with regard to a microcrystalline semiconductor film in contact with a gate insulating film, forming a microcrystalline semiconductor film including an impurity element which serves as a donor can increase the speed of carrier travel in the microcrystalline semiconductor film, so that a thin film transistor with high field effect mobility and high on-current can be manufactured.

The peak concentration of the impurity element which serves as a donor and is included in the gate insulating film or the microcrystalline semiconductor film is set to be from $6\times10^{15}$ to $3\times10^{18}$ atoms/cm$^3$ inclusive, preferably from $3\times10^{16}$ to $3\times10^{17}$ atoms/cm$^3$ inclusive, so that an accumulation-type thin film transistor (i.e., a thin film transistor in which a channel formation region includes an n-type impurity element at a low concentration) can be manufactured. When the peak concentration of the impurity element which serves as a donor and is included in the gate insulating film or the microcrystalline semiconductor film is lower than $6\times10^{15}$ atoms/cm$^3$, the amount of the impurity element which serves as a donor is insufficient, and thus an increase in the field effect mobility and in the on-current cannot be expected. Further, when the peak concentration of the impurity element which serves as a donor and is included in the gate insulating film or the microcrystalline semiconductor film is higher than $3\times10^{18}$ atoms/cm$^3$, the threshold value shifts to the minus side of the gate voltage, and the transistor does not function well; therefore, it is preferable that the concentration of the impurity element which serves as a donor be from $6\times10^{15}$ to $3\times10^{18}$ atoms/cm$^3$ inclusive, preferably from $3\times10^{16}$ to $3\times10^{17}$ atoms/cm$^3$ inclusive.

Further, a buffer layer is formed successively over the microcrystalline semiconductor film, whose crystallinity at the interface with the gate insulating film has been increased, and source and drain regions and source and drain wirings are formed over the buffer layer, so that a thin film transistor is formed.

Another feature of the present invention is that a pixel electrode connected to the thin film transistor is formed and a display device is manufactured.

Further, thin film transistors (TFTs) are manufactured using the microcrystalline semiconductor film of the present invention, and a display device is manufactured using the thin film transistors for a pixel portion and further for a driver circuit. Since the microcrystalline semiconductor film of the present invention has high crystallinity at the interface with the gate insulating film, a thin film transistor including the microcrystalline semiconductor film has a field effect mobility of from 2.5 to 10 cm$^2$/V·sec, which is 5 to 20 times as high as that of a thin film transistor including an amorphous semiconductor film; thus, a part of the driver circuit or the entire driver circuit can be formed over the same substrate as that of the pixel portion, so that a system-on-panel can be manufactured.

Display devices include light-emitting devices and liquid crystal display devices. A light-emitting device includes a light-emitting element and a liquid crystal display device includes a liquid crystal element. A light-emitting element includes, in its category, an element whose luminance is controlled with current or voltage; specifically, an organic electroluminescent (EL) element and an inorganic EL element.

In addition, the display devices include a panel in which a display element is sealed, and a module in which an IC and the like including a controller are mounted on the panel. The present invention relates to one mode of an element substrate before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

A display device in this specification means an image display device, a light-emitting device, or a light source (including a lighting device). Further, the display device includes any of the following modules in its category: a module including a connector such as a flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

According to the present invention, a microcrystalline semiconductor film which has high crystallinity from an interface with an insulating film can be formed, and a thin film transistor with excellent electric characteristics can be manufactured using the microcrystalline semiconductor film for a channel formation region. Further, a display device having the thin film transistor can be manufactured.

DETAILED DESCRIPTION OF THE INVENTION

Figure 1A:
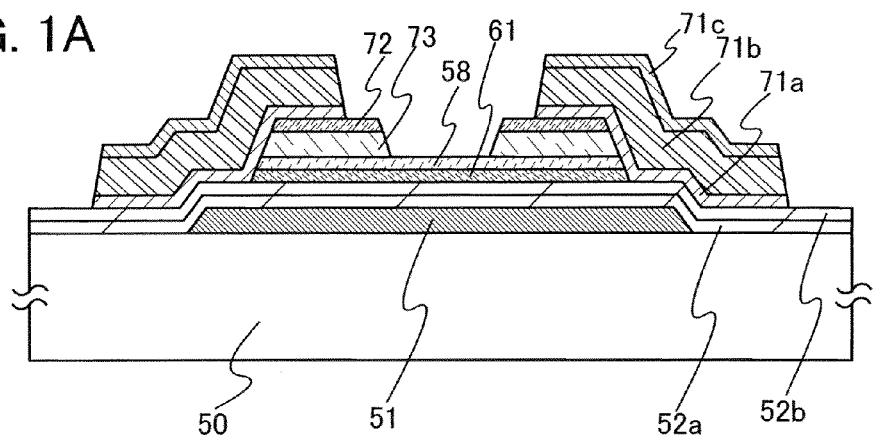
FIGS. 1A and 1D are cross-sectional views illustrating a thin film transistor of the present invention.

Hereinafter, embodiment modes and embodiments of the present invention are described with reference to the drawings. Note that the present invention is not limited to the following description, and it is easily understood by those skilled in the art that the modes and details disclosed herein can be modified in various ways without departing from the spirit and scope of the present invention. Therefore, the present invention should not be interpreted as being limited to the description of the embodiment modes to be given below. In the structures of the present invention to be described hereinafter, reference numerals which designate the same parts are used in common in different drawings.

Embodiment Mode 1

This embodiment mode describes structures of a thin film transistor which has high crystallinity at an interface between a microcrystalline semiconductor film and a gate insulating film, and has higher field effect mobility and higher on-current than a thin film transistor having a conventional microcrystalline semiconductor film in a channel formation region, with reference to FIGS. 1A to 1F, FIGS. 2A to 2F, FIGS. 3A and 3B, FIGS. 4A to 4D, and FIGS. 5A and 5B.

In a thin film transistor shown in FIG. 1A, a gate electrode 51 is formed over a substrate 50; gate insulating films 52a and 52b are formed over the gate electrode 51; a microcrystalline semiconductor film 61 including an impurity element which serves as a donor (hereinafter also referred to as the microcrystalline semiconductor film 61) is formed over the gate insulating films 52a and 52b; a microcrystalline semiconductor film 58 not including an impurity element which serves as a donor at a higher concentration than the detection limit of SIMS (hereinafter also referred to as the microcrystalline semiconductor film 58) is formed over the microcrystalline semiconductor film 61; a pair of buffer layers 73 are formed partly over the microcrystalline semiconductor film 58; a pair of semiconductor films 72 (hereinafter also referred to as source and drain regions 72) to which an impurity element imparting one conductivity type is added are formed over the pair of buffer layers 73; and wirings 71a to 71c are formed over the pair of semiconductor films 72 to which the impurity element imparting one conductivity type is added. In other words, in the microcrystalline semiconductor film formed over the gate insulating film 52b, the microcrystalline semiconductor film on the gate insulating film 52b side includes the impurity element which serves as a donor.

The microcrystalline semiconductor film 61 includes the impurity element which serves as a donor at a peak concentration of from $6\times10^{15}$ to $3\times10^{18}$ atoms/cm$^3$ inclusive, preferably from $3\times10^{16}$ to $3\times10^{17}$ atoms/cm$^3$ inclusive. Further, the microcrystalline semiconductor film 61 including the impurity element which serves as a donor has a thickness of from 1 to 50 nm inclusive. Examples of the microcrystalline semiconductor film are a microcrystalline silicon film, a microcrystalline silicon film including germanium, and the like. Further, examples of the impurity element which serves as a donor are phosphorus, arsenic, antimony, and the like.

The peak concentration of the impurity element which serves as a donor and is included in the microcrystalline semiconductor film is set to be in the above range, whereby the interface between the gate insulating film 52b and the microcrystalline semiconductor film 61 can have improved crystallinity and the microcrystalline semiconductor film 61 can have lower resistivity; thus, a thin film transistor with high mobility and high on-current can be manufactured. When the peak concentration of the impurity element which serves as a donor and is included in the microcrystalline semiconductor film is lower than $6\times10^{15}$ atoms/cm$^3$, the amount of the impurity element which serves as a donor is insufficient, and thus an increase in the field effect mobility and in the on-current cannot be expected. Further, when the peak concentration of the impurity element which serves as a donor and is included in the microcrystalline semiconductor film is higher than $3\times10^{18}$ atoms/cm$^3$, the threshold value shifts to the minus side of the gate voltage, and the transistor does not function well; therefore, it is preferable that the concentration of the impurity element which serves as a donor be from $6\times10^{15}$ to $3\times10^{18}$ atoms/cm$^3$ inclusive, more preferably from $3\times10^{16}$ to $3\times10^{17}$ atoms/cm$^3$ inclusive.

The microcrystalline semiconductor film here is a film including a semiconductor having an intermediate structure between amorphous and crystalline (including single crystalline and polycrystalline) structures. This semiconductor is in a third state, in which the semiconductor is stable in free energy, and is a crystalline semiconductor having short-range order and lattice distortion; columnar or needle-like crystals with a diameter of from 0.5 to 20 nm have grown in a direction of the normal to the surface of the substrate. Further, an amorphous semiconductor is present between a plurality of microcrystalline semiconductors. A Raman spectrum of microcrystalline silicon, which is a typical example of a microcrystalline semiconductor, is located in lower wave numbers than 520 cm$^{-1}$, which represents a peak of a Raman spectrum of single crystalline silicon. That is to say, a peak of a Raman spectrum of microcrystalline silicon lies between 520 cm$^{-1}$ and 480 cm$^{-1}$, which represent a peak of a Raman spectrum of single crystalline silicon and that of amorphous silicon, respectively. Furthermore, the microcrystalline semiconductor film includes hydrogen or halogen at 1 at. % or more in order to terminate a dangling bond. The microcrystalline semiconductor film may further include a rare gas element such as helium, argon, krypton, or neon to further promote lattice distortion, so that the stability is enhanced and a favorable microcrystalline semiconductor film can be obtained. Such description about a microcrystalline semiconductor film is disclosed in, for example, U.S. Pat. No. 4,409,134.

The microcrystallines semiconductor film 61 including the impurity element which serves as a donor and the microcrystalline semiconductor film 58 are each formed with a thickness of from 1 to 200 nm inclusive, preferably from 1 to 100 nm inclusive, more preferably from 1 to 50 nm inclusive. The microcrystalline semiconductor film 61 including the impurity element which serves as a donor functions as a channel formation region of the thin film transistor which is completed later; if the thickness of the microcrystalline semiconductor film 61 is small, the microcrystalline semiconductor film 61 and also the microcrystalline semiconductor film 58 serve as the channel formation region of the thin film transistor which is completed later. When at least the microcrystalline semiconductor film 61 including the impurity element which serves as a donor is formed with a thickness of from 1 to 50 nm inclusive, the thin film transistor can be a complete depletion type.

Further, it is preferable that a concentration of oxygen and a concentration of nitrogen in the microcrystalline semiconductor film each be less than ten times that of the impurity element which serves as a donor, typically lower than $3\times10^{19}$ atoms/cm$^3$, preferably lower than $3\times10^{18}$ atoms/cm$^3$; and that a concentration of carbon be lower than or equal to $3\times10^{18}$ atoms/cm$^3$. Low concentrations of oxygen, nitrogen, and carbon in the microcrystalline semiconductor film can suppress generation of defects in the microcrystalline semiconductor film. Furthermore, oxygen and/or nitrogen in the microcrystalline semiconductor film hinders crystallization. Therefore, the microcrystalline semiconductor film includes oxygen and nitrogen at relatively low concentrations and includes the impurity element which serves as a donor, whereby the crystallinity of the microcrystalline semiconductor film can be enhanced.

The microcrystalline semiconductor film including the impurity element which serves as a donor of this embodiment mode includes the impurity element which serves as a donor; therefore, by adding an impurity element which serves as an acceptor to the microcrystalline semiconductor film which serves as the channel formation region of the thin film transistor at the same time as or after formation of the microcrystalline semiconductor film, the threshold value can be controlled. A typical example of the impurity element which serves as an acceptor is boron, and impurity gas such as $B_2H_6$ or $BF_3$ is preferably mixed into silicon hydride at from 1 to 1000 ppm, preferably from 1 to 100 ppm. Further, a concentration of boron is preferably set to be approximately one-tenth that of the impurity element which serves as a donor, e.g., from $1\times10^{14}$ to $6\times10^{16}$ atoms/cm$^3$.

An amorphous semiconductor film, an amorphous semiconductor film including halogen such as fluorine or chlorine, or an amorphous semiconductor film including nitrogen is used as the pair of buffer layers 73. The buffer layers 73 have a thickness of from 50 to 200 nm. Examples of the amorphous semiconductor film are an amorphous silicon film, an amorphous silicon film including germanium, and the like.

The pair of buffer layers 73, which are formed of an amorphous semiconductor film, have a larger energy gap and a higher resistivity than the microcrystalline semiconductor film 58; further, mobility in the pair of buffer layers 73 is one-fifth to one-tenth that of the microcrystalline semiconductor film 58. In the thin film transistor which is completed later, therefore, the buffer layers 73 function as high resistant regions and thus can reduce leakage current which is generated between the source and drain regions 72 and the microcrystalline semiconductor film 61.

For the substrate 50, an alkali-free glass substrate manufactured by a fusion method or a float method, such as barium borosilicate glass, aluminoborosilicate glass, or aluminosilicate glass; a ceramic substrate; a plastic substrate which has high heat resistance enough to withstand a process temperature of this manufacturing process; or the like can be used. Further, a metal (e.g., stainless steel alloy) substrate whose surface is provided with an insulating film may be used.

The gate electrode 51 is formed of a metal material. As a metal material, aluminum, chromium, titanium, tantalum, molybdenum, copper, or the like is used. The gate electrode 51 is preferably formed of aluminum or a stacked-layer structure of aluminum and a barrier metal. As a barrier metal, a metal with a high melting point, such as titanium, molybdenum, or chromium, is used. A barrier metal is preferably provided in order to prevent hillocks and oxidation of aluminum.

The gate electrode 51 is formed with a thickness of from 50 to 300 nm inclusive. The thickness of from 50 to 100 nm inclusive of the gate electrode 51 can prevent a disconnection of a semiconductor film and a wiring, which are formed later. Further, the thickness of from 150 to 300 nm inclusive of the gate electrode 51 can lower the resistance of the gate electrode 51, and increase the size of the substrate.

Since the semiconductor film and the wiring are formed over the gate electrode 51, the gate electrode 51 is preferably processed to have a tapered end portion so that the semiconductor film and the wiring thereover are not disconnected. Further, although not illustrated, a wiring or a capacitor wiring which is connected to the gate electrode can also be formed at the same time when the gate electrode is formed.

The gate insulating films 52*a* and 52*b* can each be formed using a silicon oxide film, a silicon nitride film, a silicon oxynitride film, or a silicon nitride oxide film with a thickness of from 50 to 150 nm. This embodiment mode presents an example in which a silicon nitride film or a silicon nitride oxide film is formed as the gate insulating film 52*a*, and a silicon oxide film or a silicon oxynitride film is formed as the gate insulating film 52*b* to form a stacked-layer structure. Instead of a two-layer structure, the gate insulating film can be formed using a single layer of a silicon oxide film, a silicon nitride film, a silicon oxynitride film, or a silicon nitride oxide film.

By forming the gate insulating film 52*a* using a silicon nitride film or a silicon nitride oxide film, adhesion between the substrate 50 and the gate insulating film 52*a* is increased, and further, impurities from the substrate 50 can be prevented from diffusing into the microcrystalline semiconductor film 61 including the impurity element which serves as a donor when a glass substrate is used for the substrate 50. Furthermore, oxidation of the gate electrode 51 can be prevented. That is to say, film peeling can be prevented, and electric characteristics of the thin film transistor which is completed later can be improved. Further, the gate insulating films 52*a* and 52*b* each having a thickness of greater than or equal to 50 nm are preferable because the gate insulating films 52*a* and 52*b* having the above thickness can alleviate reduction in coverage which is caused by unevenness due to the gate electrode 51.

Note that a silicon oxynitride film means a film that includes more oxygen than nitrogen, and includes oxygen, nitrogen, silicon, and hydrogen at concentrations ranging from 55 to 65 at. %, 1 to 20 at. %, 25 to 35 at. %, and 0.1 to 10 at. %, respectively. Further, a silicon nitride oxide film means a film that includes more nitrogen than oxygen, and includes oxygen, nitrogen, silicon, and hydrogen at concentrations ranging from 15 to 30 at. %, 20 to 35 at. %, 25 to 35 at. %, and 15 to 25 at. %, respectively.

If an n-channel thin film transistor is formed, the semiconductor films 72 to which the impurity element imparting one conductivity type is added may be doped with phosphorus, which is a typical impurity element; for example, impurity gas such as $PH_3$ may be added to silicon hydride. If a p-channel thin film transistor is formed, the semiconductor films 72 to which the impurity element imparting one conductivity type is added may be doped with boron, which is a typical impurity element; for example, impurity gas such as $B_2H_6$ may be added to silicon hydride. The semiconductor films 72 to which the impurity element imparting one conductivity type is added include phosphorus or boron at a concentration of from $1\times10^{19}$ to $1\times10^{21}$ atoms/cm$^3$, thereby having ohmic contact with the conductive film; thus, the semiconductor films 72 to which the impurity element imparting one conductivity type is added function as the source and drain regions. The semiconductor films 72 to which the impurity element imparting one conductivity type is added can be formed using a microcrystalline semiconductor or an amorphous semiconductor. The semiconductor films 72 to which the impurity element imparting one conductivity type is added are formed with a thickness of from 2 to 50 nm inclusive. Reduction in the thickness of the semiconductor film to which the impurity element imparting one conductivity type is added can improve the throughput.

The wirings 71*a* to 71*c* are preferably formed with a single layer or stacked layers using aluminum; copper; or an aluminum alloy to which an element for preventing hillocks or an element for improving heat resistance property, such as silicon, titanium, neodymium, scandium, or molybdenum, is added. Alternatively, a film in contact with the semiconductor film to which the impurity element imparting one conductivity type is added may be formed of titanium, tantalum, molybdenum, or tungsten, or nitride of such an element; and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or nitride thereof to form a stacked-layer structure. This embodiment mode shows the conductive film having a three-layer structure of the wirings 71*a* to 71*c*; a stacked-layer structure in which the wirings 71*a* and 71*c* are formed using molybdenum films and the conductive film 71*b* is formed using an aluminum film, or a stacked-layer structure in which the wirings 71*a* and 71*c* are formed using titanium films and the wiring 71*b* is formed using an aluminum film is formed.

Figure 1B:
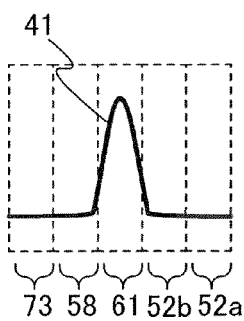
FIGS. 1B, 1C, 1E, and 1F are diagrams showing peak concentrations of an impurity element which serves as a donor in stacked films.
Figure 1C:
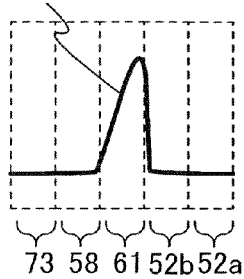

Next, with SIMS, concentration distribution of the impurity element which serves as a donor in a stacked-layer portion including the gate insulating films 52*a* and 52*b*, the microcrystalline semiconductor film 61 including the impurity element which serves as a donor, the microcrystalline semiconductor film 58 not including the impurity element which serves as a donor at a higher concentration than the detection limit of SIMS, and the buffer layers 73 is schematically shown by curves 41 and 42 in FIGS. 1B and 1C.

As shown in FIG. 1B, a concentration of the impurity element which serves as a donor in the thin film transistor shown in FIG. 1A has a peak value in the microcrystalline semiconductor film 61 including the impurity element which serves as a donor. As shown in FIG. 1B, a peak of the concentration distribution of the impurity element which serves as a donor may be located in or around the center of the microcrystalline semiconductor film 61 including the impurity element which serves as a donor. Further, as in the concentration distribution of the impurity element which serves as a donor which is shown by the curve 42 in FIG. 1C, a peak of the concentration distribution of the impurity element which serves as a donor may be located at or around the interface between the gate insulating film 52*b* and the microcrystalline semiconductor film 61 including the impurity element which serves as a donor.

Figure 1D:
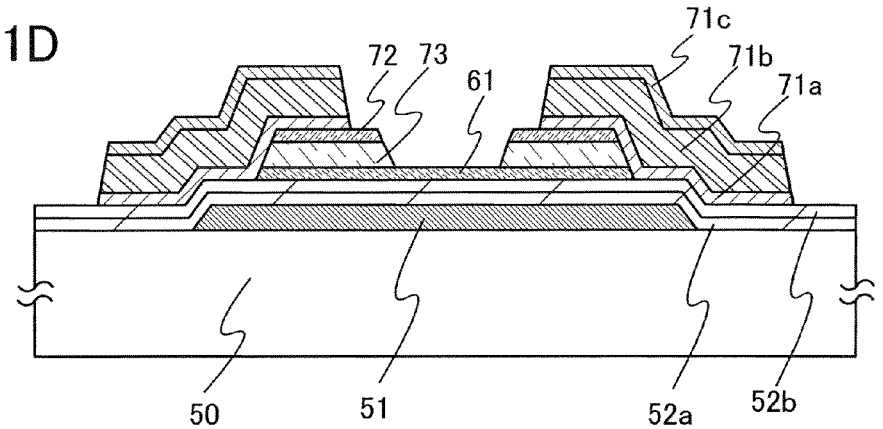

It is not essential that the impurity element which serves as a donor in the microcrystalline semiconductor film be included only in a part on the gate insulating film side. As shown in FIG. 1D, for example, an impurity element which serves as a donor may be included in an entire microcrystalline semiconductor film. That is to say, a microcrystalline semiconductor film 61 including an impurity element which serves as a donor may be formed between a gate insulating film 52*b* and a pair of buffer layers 73.

In a thin film transistor shown in FIG. 1D, a gate electrode 51 is formed over a substrate 50; a gate insulating film 52*a* and the gate insulating film 52*b* are formed over the gate electrode 51; the microcrystalline semiconductor film 61 including the impurity element which serves as a donor is formed over the gate insulating film 52*b*; the pair of buffer layers 73 are formed over the microcrystalline semiconductor film 61 including the impurity element which serves as a donor; a pair of semiconductor films 72 to which an impurity element imparting one conductivity type is added are formed over the pair of buffer layers 73; and wirings 71*a* to 71*c* are formed over the pair of semiconductor films 72 to which the impurity element imparting one conductivity type is added.

A feature of this mode is that the microcrystalline semiconductor film 61 including the impurity element which serves as a donor is formed between the gate insulating film 52*b* and the pair of buffer layers 73. It is preferable that the peak concentration of the impurity element which serves as a donor be from $6\times10^{15}$ to $3\times10^{18}$ atoms/cm$^3$ inclusive, more preferably from $3\times10^{16}$ to $3\times10^{17}$ atoms/cm$^3$ inclusive. Further, the microcrystalline semiconductor film 61 including the impurity element which serves as a donor has a thickness of from 5 to 100 nm inclusive, preferably from 10 to 50 nm inclusive. Furthermore, the peak concentration of the impurity element which serves as a donor may satisfy the above range in the entire microcrystalline semiconductor film 61; or the concentration of the impurity element which serves as a donor may have a peak at or around the interface between the gate insulating film 52b and the microcrystalline semiconductor film 61, and may decrease from the gate insulating film 52b toward the pair of buffer layers 73. Still furthermore, when the peak concentration of oxygen and the peak concentration of nitrogen in the microcrystalline semiconductor film 61 including the impurity element which serves as a donor are each less than ten times that of the impurity element which serves as a donor and further when the peak concentration of the impurity element which serves as an acceptor (a typical example is boron) is less than or equal to one-tenth that of the impurity element which serves as a donor, crystallinity of the microcrystalline semiconductor film including the impurity element which serves as a donor can be increased further.

The peak concentration of the impurity element which serves as a donor and is included in the microcrystalline semiconductor film is set to be in the above range, whereby the interface between the gate insulating film 52b and the microcrystalline semiconductor film 61 can have improved crystallinity and the microcrystalline semiconductor film 61 can have lower resistivity; thus, a thin film transistor with high field effect mobility and high on-current can be manufactured. When the peak concentration of the impurity element which serves as a donor and is included in the microcrystalline semiconductor film is lower than $6\times10^{15}$ atoms/cm$^3$, the amount of the impurity element which serves as a donor is insufficient, and thus an increase in the field effect mobility and in the on-current cannot be expected. Further, when the peak concentration of the impurity element which serves as a donor and is included in the microcrystalline semiconductor film is higher than $3\times10^{18}$ atoms/cm$^3$, the threshold value shifts to the minus side of the gate voltage, and the transistor does not function well; therefore, it is preferable that the concentration of the impurity element which serves as a donor be from $6\times10^{15}$ to $3\times10^{18}$ atoms/cm$^3$ inclusive, preferably from $3\times10^{16}$ to $3\times10^{17}$ atoms/cm$^3$ inclusive.

Figure 1E:
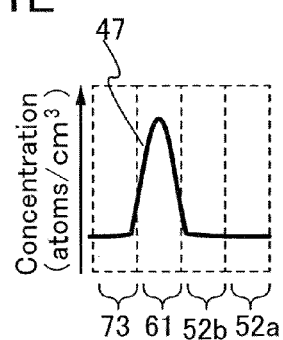
Figure 1F:
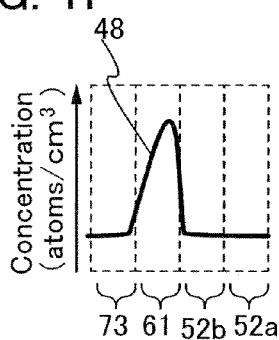

Next, with SIMS, concentration distribution of the impurity element which serves as a donor in a stacked-layer portion including the gate insulating films 52a and 52b, the microcrystalline semiconductor film 61 including the impurity element which serves as a donor, and the buffer layers 73 is schematically shown by curves 47 and 48 in FIGS. 1E and 1F.

As shown by the curve 47 in FIG. 1E, a concentration of the impurity element which serves as a donor in the thin film transistor shown in FIG. 1D has a peak value in the microcrystalline semiconductor film 61 which includes the impurity element which serves as a donor and which is provided between the gate insulating film 52b and the buffer layers 73. Further, as in the concentration distribution of the impurity element which serves as a donor which is shown by the curve 48 in FIG. 1F, a peak of the concentration distribution of the impurity element which serves as a donor may be located at or around the interface between the gate insulating film 52b and the microcrystalline semiconductor film 61 including the impurity element which serves as a donor, and the concentration may decrease toward the buffer layers 73.

Next, a different mode from the above is presented with reference to FIGS. 2A to 2F.

Figure 2A:
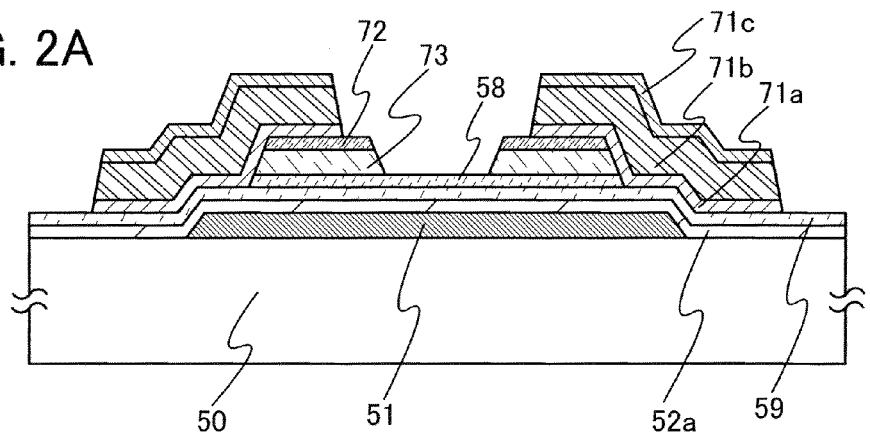
FIGS. 2A and 2E are cross-sectional views illustrating a thin film transistor of the present invention.

FIG. 2A shows a cross section of a thin film transistor of this embodiment mode.

In the thin film transistor shown in FIG. 2A, a gate electrode 51 is formed over a substrate 50; a gate insulating film 52a is formed over the gate electrode 51; a gate insulating film 59 including an impurity element which serves as a donor is formed over the gate insulating film 52a; a microcrystalline semiconductor film 58 is formed over the gate insulating film 59; a pair of buffer layers 73 are formed over the microcrystalline semiconductor film 58; a pair of semiconductor films 72 to which an impurity element imparting one conductivity type is added are formed over the pair of buffer layers 73; and wirings 71a to 71c are formed over the pair of semiconductor films 72 to which the impurity element imparting one conductivity type is added.

It is preferable that the peak concentration of phosphorus in the gate insulating film 59 including the impurity element which serves as a donor be from $6\times10^{15}$ to $3\times10^{18}$ atoms/cm$^3$ inclusive, preferably from $3\times10^{16}$ to $3\times10^{17}$ atoms/cm$^3$ inclusive. Further, the microcrystalline semiconductor film 58 has a thickness of from 1 to 50 nm inclusive.

The gate insulating film 52a can be formed using a similar material to that of the gate insulating film 52a shown in FIGS. 1A and 1D. Further, the gate insulating film 59 including the impurity element which serves as a donor can be formed using a silicon oxide film, a silicon nitride film, a silicon oxynitride film, a silicon nitride oxide film, or the like including the impurity element which serves as a donor (e.g., phosphorus, arsenic, or antimony).

Figure 2B:
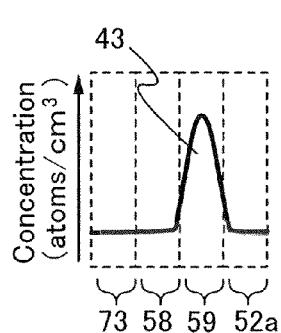
FIGS. 2B, 2C, 2D, and 2F are diagrams showing peak concentrations of an impurity element which serves as a donor in stacked films.
Figure 2C:
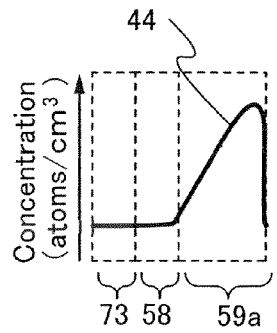
Figure 2D:
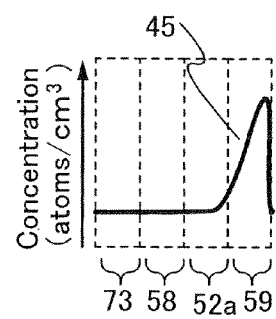

Next, with SIMS, concentration distribution of the impurity element which serves as a donor in a stacked-layer portion including the gate insulating film 52a, the gate insulating film 59 including the impurity element which serves as a donor, the microcrystalline semiconductor film 58, and the buffer layers 73 is schematically shown by curves 43, 44, and 45 in FIGS. 2B to 2D.

As shown in FIG. 2B, a concentration of the impurity element which serves as a donor in the thin film transistor shown in FIG. 2A has a peak value in the gate insulating film 59 which includes the impurity element which serves as a donor and which is formed between the gate insulating film 52a and the microcrystalline semiconductor film 58.

Although a mode is presented here in which the gate insulating film 52a does not include the impurity element which serves as a donor at a higher concentration than the detection limit of SIMS and only the gate insulating film 59 includes the impurity element which serves as a donor, the present invention is not limited to this structure. For example, a gate insulating film may consist of one layer and may include an impurity element which serves as a donor. With SIMS, concentration distribution of the impurity element which serves as a donor in the stacked-layer portion including a gate insulating film 59a including an impurity element which serves as a donor, the microcrystalline semiconductor film 58, and the buffer layers 73 in the above case is schematically shown by the curve 44 in FIG. 2C. In FIG. 2C, the curve 44, which shows concentration distribution of the impurity element which serves as a donor, has a peak on the gate electrode side in the gate insulating film 59a including the impurity element which serves as a donor, and the concentration decreases from the gate electrode side toward the microcrystalline semiconductor film 58 side. Note that the shape of the curve that shows the concentration distribution of the impurity element which serves as a donor is not limited to that shown in FIG. 2C, and a concentration may have a peak in or around the center of the gate insulating film 59a including the impurity element which serves as a donor.

In FIG. 2A, further, positions of the gate insulating film 52a and the gate insulating film 59 including the impurity element which serves as a donor may be reversed. In other words, the gate insulating film 59 including the impurity element which serves as a donor may be formed over the gate electrode 51, and the gate insulating film 52a may be formed over the gate insulating film 59 including the impurity element which serves as a donor. With SIMS, concentration distribution of the impurity element which serves as a donor in a stacked-layer portion including the gate insulating film 59 including the impurity element which serves as a donor, the gate insulating film 52a, the microcrystalline semiconductor film 58, and the buffer layers 73 in the above case is schematically shown by the curve 45 in FIG. 2D. In FIG. 2D, the curve 45, which shows concentration distribution of the impurity element which serves as a donor, has a peak on the gate electrode side in the gate insulating film 59 including the impurity element which serves as a donor, and the concentration decreases from the gate electrode side toward the gate insulating film 52a side. Note that the shape of the curve that shows the concentration distribution of the impurity element which serves as a donor is not limited to that shown in FIG. 2D, and a concentration may have a peak in or around the center of the gate insulating film 59 including the impurity element which serves as a donor.

Figure 2E:
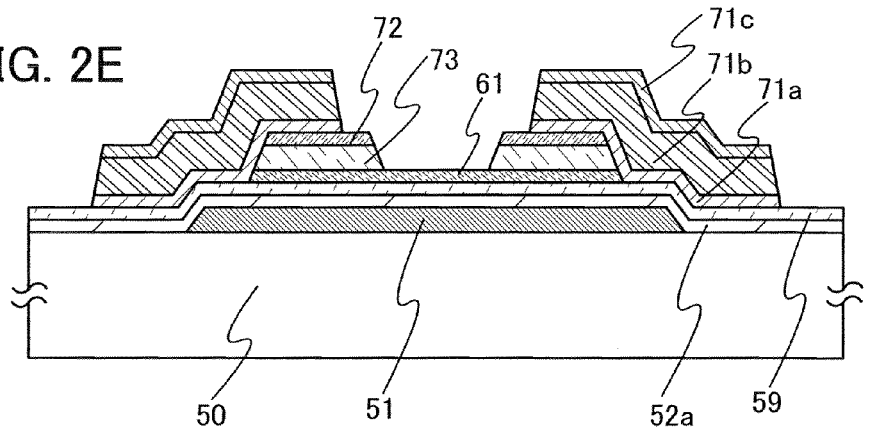

In a thin film transistor shown in FIG. 2E, a gate electrode 51 is formed over a substrate 50; a gate insulating film 52a is formed over the gate electrode 51; a gate insulating film 59 including an impurity element which serves as a donor is formed over the gate insulating film 52a; a microcrystalline semiconductor film 61 including an impurity element which serves as a donor is formed over the gate insulating film 59 including the impurity element which serves as a donor; a pair of buffer layers 73 are formed over the microcrystalline semiconductor film 61; a pair of semiconductor films 72 to which an impurity element imparting one conductivity type is added are formed over the pair of buffer layers 73; and wirings 71a to 71c are formed over the pair of semiconductor films 72 to which the impurity element imparting one conductivity type is added.

Figure 2F:
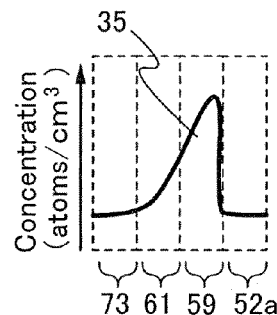

Next, with SIMS, concentration distribution of the impurity element which serves as a donor in a stacked-layer portion including the gate insulating film 52a, the gate insulating film 59 including the impurity element which serves as a donor, the microcrystalline semiconductor film 61 including the impurity element which serves as a donor, and the buffer layers 73 is schematically shown by a curve 35 in FIG. 2F.

As shown in FIG. 2F, the concentration of the impurity element which serves as a donor in the thin film transistor shown in FIG. 2E has a peak value in the gate insulating film 59 including the impurity element which serves as a donor. Further, the peak is present at or around the interface between the gate insulating film 52a and the gate insulating film 59 including the impurity element which serves as a donor. Furthermore, the shape of the curve that shows the concentration distribution of the impurity element which serves as a donor is not limited to that shown in FIG. 2F, and the concentration may have a peak in or around the center of the gate insulating film 59 including the impurity element which serves as a donor.

A feature of this mode is that the gate insulating film 59, which is in contact with the microcrystalline semiconductor film 58 or the microcrystalline semiconductor film 61 including the impurity element which serves as a donor, includes the impurity element which serves as a donor. When the gate insulating film 59 on the microcrystalline semiconductor film 58 or 61 side includes the impurity element which serves as a donor, the impurity element which serves as a donor is deposited on a surface of the gate insulating film 59, whereby crystallinity of the microcrystalline semiconductor film 58 or 61 can be increased in starting deposition of the microcrystalline semiconductor film 58 or 61.

Further, another feature is that the gate insulating film on the gate electrode 51 side includes the impurity element which serves as a donor. When the gate insulating film on the gate electrode 51 side includes the impurity element which serves as a donor, the impurity element can be diffused into the gate insulating film on the microcrystalline semiconductor film side at a low concentration. Accordingly, crystallinity can be increased at the interface between the gate insulating film 59 and the microcrystalline semiconductor film 58 or 61 and resistivity of the microcrystalline semiconductor film 58 or 61 can be reduced; thus, a thin film transistor with high field effect mobility and high on-current can be manufactured.

When the peak concentration of the impurity element which serves as a donor and is included in the gate insulating film 59 is lower than $6 \times 10^{15}$ atoms/cm$^3$, the amount of the impurity element which serves as a donor is insufficient, and thus an increase in the field effect mobility and in the on-current cannot be expected. Further, when the peak concentration of the impurity element which serves as a donor and is included in the gate insulating film 59 is higher than $3 \times 10^{18}$ atoms/cm$^3$, the threshold value shifts to the minus side of the gate voltage, and the transistor does not function well; therefore, it is preferable that the concentration of the impurity element which serves as a donor be from $6 \times 10^{15}$ to $3 \times 10^{18}$ atoms/cm$^3$ inclusive, preferably from $3 \times 10^{16}$ to $3 \times 10^{17}$ atoms/cm$^3$ inclusive.

By forming the microcrystalline semiconductor film 61 including the impurity element which serves as a donor over the gate insulating film 59 including the impurity element which serves as a donor, crystallinity of the microcrystalline semiconductor film 61 can be increased in starting deposition of the microcrystalline semiconductor film 61; in addition, resistivity of the microcrystalline semiconductor film can be reduced further because the impurity element which serves as a donor is included also in the microcrystalline semiconductor film 61, which functions as a channel. Thus, a thin film transistor with high on-current and high field effect mobility can be manufactured.

Figure 3A:
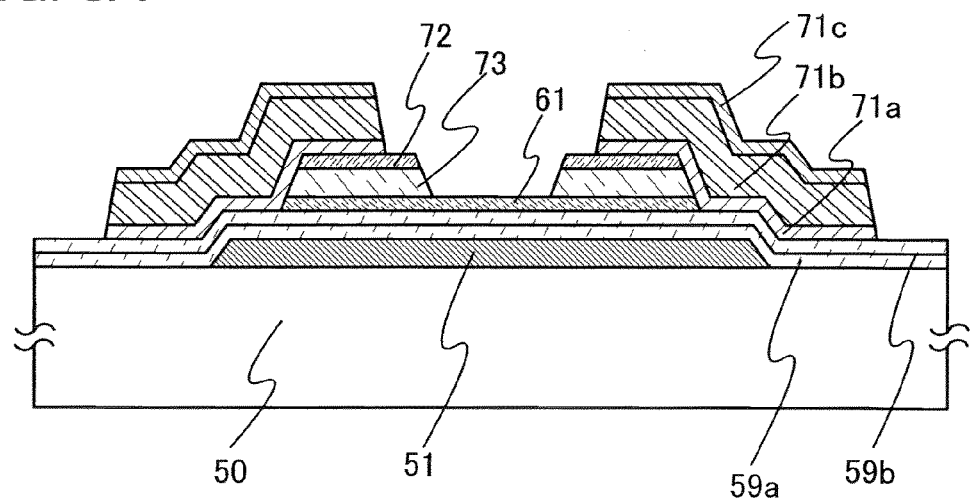
FIG. 3A is a cross-sectional view illustrating a thin film transistor of the present invention.
Figure 3B:
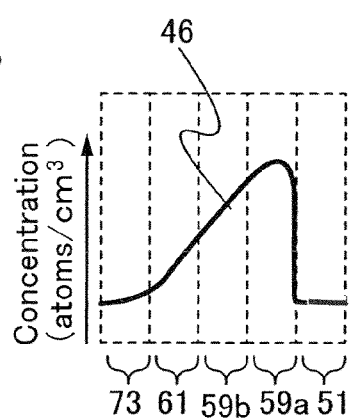
FIG. 3B is a diagram showing a peak concentration of an impurity element which serves as a donor in stacked films.

Next, a different mode from the above is presented with reference to FIGS. 3A and 3B.

FIG. 3A shows a cross section of a thin film transistor of this embodiment mode.

In a thin film transistor shown in FIG. 3A, a gate electrode 51 is formed over a substrate 50; gate insulating films 59a and 59b including the impurity element which serves as a donor are formed over the gate electrode 51; a microcrystalline semiconductor film 61 including an impurity element which serves as a donor is formed over the gate insulating film 59b including the impurity element which serves as a donor; a pair of buffer layers 73 are formed over the microcrystalline semiconductor film 61 including the impurity element which serves as a donor; a pair of semiconductor films 72 to which an impurity element imparting one conductivity type is added are formed over the pair of buffer layers 73; and wirings 71a to 71c are formed over the pair of semiconductor films 72 to which the impurity element imparting one conductivity type is added.

It is preferable that the peak concentration of the impurity element which serves as a donor in the gate insulating films 59a and 59b including the impurity element which serves as a donor and in the microcrystalline semiconductor film 61 including the impurity element which serves as a donor be from $6 \times 10^{15}$ to $3 \times 10^{18}$ atoms/cm$^3$ inclusive, more preferably from $3 \times 10^{16}$ to $3 \times 10^{17}$ atoms/cm$^3$ inclusive.

Next, with SIMS, concentration distribution of the impurity element which serves as a donor in a stacked-layer portion including the gate electrode 51, the gate insulating films 59a and 59b including the impurity element which serves as a donor, the microcrystalline semiconductor film 61 including the impurity element which serves as a donor, and the buffer layers 73 is schematically shown by a curve 46 in FIG. 3B.

As shown in FIG. 3B, the concentration of the impurity element which serves as a donor in the thin film transistor shown in FIG. 3A satisfies the above concentration range in the gate insulating films 59a and 59b and the microcrystalline semiconductor film 61, and has a peak therein. The peak is located at or around the interface between the gate electrode 51 and the gate insulating film 59a. The shape of the curve 46, which shows concentration distribution of the impurity element which serves as a donor, is not limited to that shown in FIG. 3B; the concentration may have a peak in or around the center of the gate insulating film 59a including the impurity element which serves as a donor, in or around the center of the gate insulating film 59b including the impurity element which serves as a donor, or at or around the interface between the gate insulating films 59a and 59b including the impurity element which serves as a donor. Alternatively, the concentration may have a peak at or around the interface between the gate insulating film 59b including the impurity element which serves as a donor and the microcrystalline semiconductor film 61 including the impurity element which serves as a donor. Further alternatively, the concentration may have a peak in the center of the microcrystalline semiconductor film 61 including the impurity element which serves as a donor.

Figure 4A:
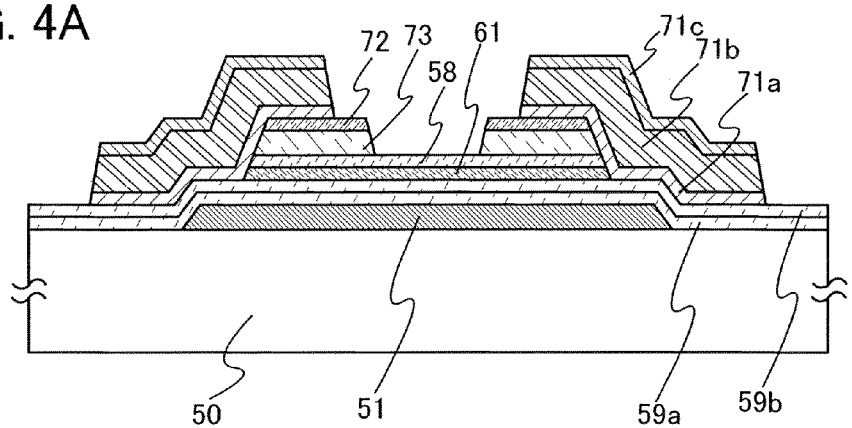
FIGS. 4A and 4C are cross-sectional views illustrating a thin film transistor of the present invention.

The thin film transistor shown in FIG. 3A may have a microcrystalline semiconductor film 58 between the microcrystalline semiconductor film 61 including the impurity element which serves as a donor and the buffer layers 73 (see FIG. 4A). Here, specifically, the microcrystalline semiconductor film 58 does not include the impurity element which serves as a donor at a higher concentration than the detection limit of SIMS. At the detection limit of SIMS, theoretically, the profile should be flat; practically, however, the profile hardly is flat because the signal/noise (S/N) ratio is poor at a low concentration region of ions measured. Therefore, a mean value of the concentrations of ions measured in the low concentration region is set to be the detection limit.

Figure 4B:
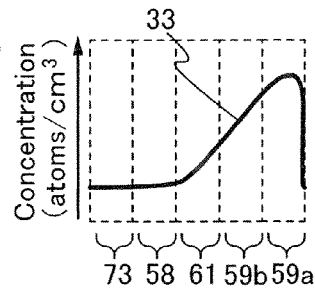
FIGS. 4B and 4D are diagrams showing a peak concentration of an impurity element which serves as a donor in stacked films.

Next, with SIMS, concentration distribution of the impurity element which serves as a donor in a stacked-layer portion including the gate insulating films 59a and 59b including the impurity element which serves as a donor, the microcrystalline semiconductor film 61 including the impurity element which serves as a donor, the microcrystalline semiconductor film 58, and the buffer layers 73 is schematically shown by a curve 33 in FIG. 4B.

As shown in FIG. 4B, the concentration of the impurity element which serves as a donor in the thin film transistor shown in FIG. 4A has a peak value in the gate insulating film 59a including the impurity element which serves as a donor.

Forming the microcrystalline semiconductor film 58 over the microcrystalline semiconductor film 61 including the impurity element which serves as a donor can prevent the impurity element which serves as a donor in the microcrystalline semiconductor film 61 from being diffused into the pair of buffer layers 73. If the impurity element which serves as a donor is diffused into the pair of buffer layers 73, which are high resistant regions, resistance of the pair of buffer layers 73 decreases and leakage current flows between the microcrystalline semiconductor film 61 including the impurity element which serves as a donor and the source and drain regions 72, thereby degrading switching characteristics. Therefore, it is preferable to form the microcrystalline semiconductor film 58 not including the impurity element which serves as a donor at a higher concentration than the detection limit of SIMS between the microcrystalline semiconductor film 61 including the impurity element which serves as a donor and the pair of buffer layers 73. The shape of the curve 33, which shows concentration distribution of the impurity element which serves as a donor, is not limited to that shown in FIG. 4D; the concentration may have a peak in or around the center of the gate insulating film 59a including the impurity element which serves as a donor, in or around the center of the gate insulating film 59b including the impurity element which serves as a donor, or at or around the interface between the gate insulating films 59a and 59b including the impurity element which serves as a donor. Alternatively, the concentration may have a peak at or around the interface between the gate insulating film 59b including the impurity element which serves as a donor and the microcrystalline semiconductor film 61 including the impurity element which serves as a donor. Further alternatively, the concentration may have a peak in the center of the microcrystalline semiconductor film 61 including the impurity element which serves as a donor.

Figure 4C:
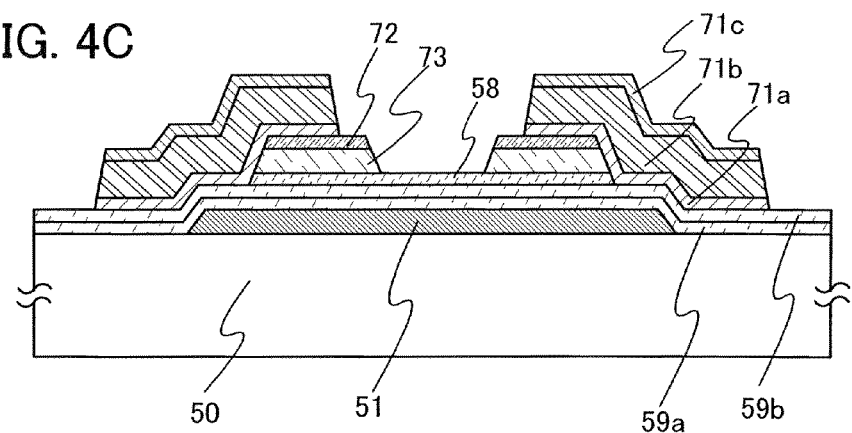

In FIG. 3A, further, the microcrystalline semiconductor film 58 may be formed instead of the microcrystalline semiconductor film 61 including the impurity element which serves as a donor (see FIG. 4C).

Figure 4D:
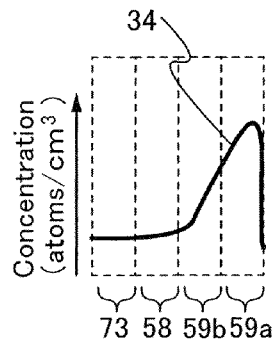

Next, with SIMS, concentration distribution of the impurity element which serves as a donor in a stacked-layer portion including the gate insulating films 59a and 59b including the impurity element which serves as a donor, the microcrystalline semiconductor film 58, and the buffer layers 73 is schematically shown by a curve 34 in FIG. 4D.

As shown in FIG. 4D, the concentration of the impurity element which serves as a donor in the thin film transistor shown in FIG. 4C has a peak value in the gate insulating film 59a including the impurity element which serves as a donor.

Figure 5A:
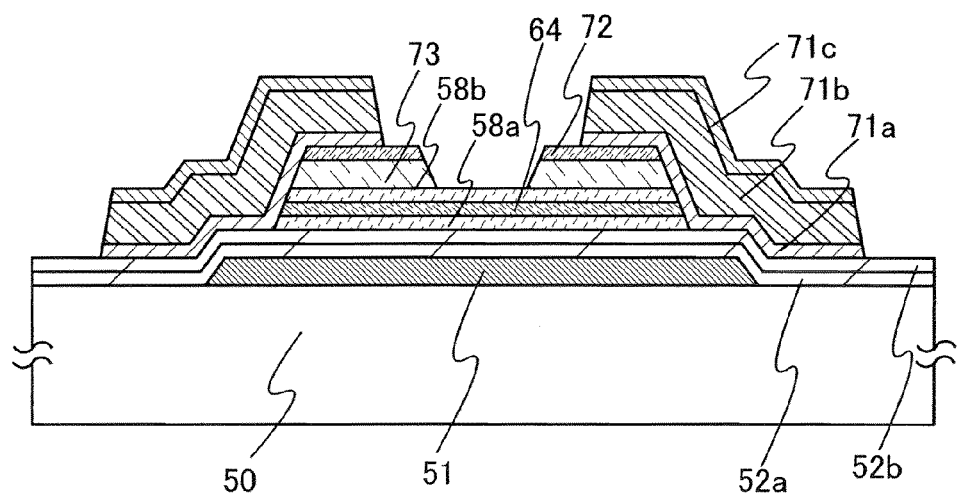
FIG. 5A is a cross-sectional view illustrating a thin film transistor of the present invention.
Figure 5B:
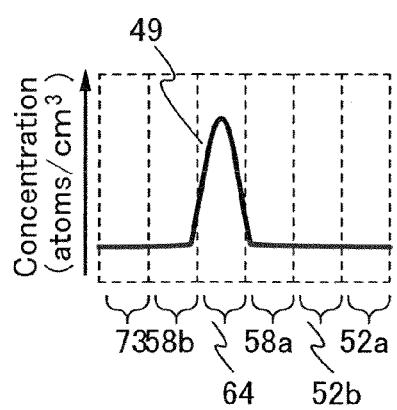
FIG. 5B is a diagram showing a peak concentration of an impurity element which serves as a donor in stacked films.

Next, a different mode from the above is presented with reference to FIGS. 5A and 5B.

FIG. 5A shows a cross section of a thin film transistor of this embodiment mode.

In the thin film transistor shown in FIG. 5A, a gate electrode 51 is formed over a substrate 50; gate insulating films 52a and 52b are formed over the gate electrode 51; a first microcrystalline semiconductor film 58a is formed over the gate insulating film 52b; a second microcrystalline semiconductor film 64 including an impurity element which serves as a donor is formed over the first microcrystalline semiconductor film 58a; a third microcrystalline semiconductor film 58b is formed over the second microcrystalline semiconductor film 64 including the impurity element which serves as a donor; a pair of buffer layers 73 are formed over the third microcrystalline semiconductor film 58b; a pair of semiconductor films 72 to which an impurity element imparting one conductivity type is added are formed over the pair of buffer layers 73; and wirings 71a to 71c are formed over the pair of semiconductor films 72 to which the impurity element imparting one conductivity type is added.

A feature of this mode is that the second microcrystalline semiconductor film 64 including the impurity element which serves as a donor is formed between the first microcrystalline semiconductor film 58a and the third microcrystalline semiconductor film 58b, which do not include the impurity element which serves as a donor at a higher concentration than the detection limit of SIMS. It is preferable that the peak concentration of the impurity element which serves as a donor be from $6 \times 10^{15}$ to $3 \times 10^{18}$ atoms/cm$^3$ inclusive, more preferably from $3 \times 10^{16}$ to $3 \times 10^{17}$ atoms/cm$^3$ inclusive.

Next, with SIMS, concentration distribution of the impurity element which serves as a donor in a stacked-layer portion including the gate insulating films 52a and 52b, the first microcrystalline semiconductor film 58a, the second microcrystalline semiconductor film 64 including the impurity element which serves as a donor, the third microcrystalline semiconductor film 58b, and the buffer layer 73 is schematically shown by a curve 49 in FIG. 5B.

As shown in FIG. 5B, the concentration of the impurity element which serves as a donor in the thin film transistor shown in FIG. 5A satisfies the above peak concentration in the second microcrystalline semiconductor film 64 including the impurity element which serves as a donor. Further, the concentration has a peak value in the center of the second microcrystalline semiconductor film 64 including the impurity element which serves as a donor. Furthermore, the shape of the curve that shows the concentration distribution of the impurity element which serves as a donor is not limited to that shown in FIG. 5B. The concentration may have a peak at or around the interface between the first microcrystalline semiconductor film 58a and the second microcrystalline semiconductor film 64 including the impurity element which serves as a donor, and may decrease toward the third microcrystalline semiconductor film 58b.

In the above manner, the accumulation-type thin film transistor in which the gate insulating film and/or the microcrystalline semiconductor film includes the impurity element which servers as a donor is formed, whereby crystallinity can be increased at the interface between the gate insulating film and the microcrystalline semiconductor film, and resistivity of the microcrystalline semiconductor film can be reduced; thus, a thin film transistor with high field effect mobility and high on-current can be manufactured.

Further, forming a channel formation region with a microcrystalline semiconductor film suppresses variation in threshold voltage, improves field effect mobility, and lowers subthreshold swing (S value); thus, a thin film transistor can achieve high performance. Accordingly, a display device can be driven at a high frequency, whereby the panel size can be increased and pixels in the display device can be made with high density.

Embodiment Mode 2

This embodiment mode presents a thin film transistor in which a gate insulating film has a different structure from that of the thin film transistors shown in Embodiment Mode 1, with reference to FIG. 6 and FIGS. 7A to 7D. Here, as shown in FIG. 6 and FIGS. 7A to 7D, the thin film transistor has three gate insulating films instead of the two gate insulating films which are shown in FIGS. 1A to 1F, FIGS. 2A to 2F, FIGS. 3A and 3B, FIGS. 4A to 4D, and FIGS. 5A and 5B.

Figure 6:
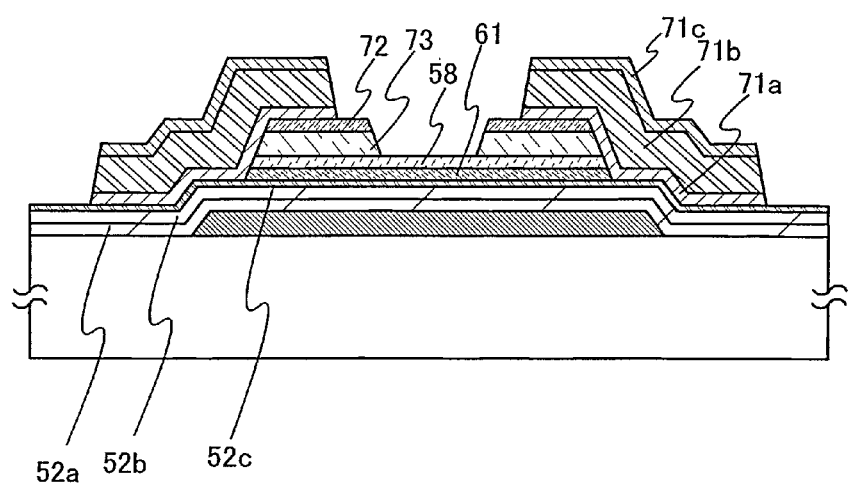
FIG. 6 is a cross-sectional view illustrating a thin film transistor of the present invention.

Instead of the gate insulating films 52a and 52b of the thin film transistor shown in FIG. 1A, three gate insulating films 52a, 52b, and 52c may be formed as shown in FIG. 6. The gate insulating films 52a and 52b, which are first and second layers, can be formed in a similar manner to Embodiment Mode 1. As the gate insulating film 52c, which is a third layer, a silicon nitride film or a silicon nitride oxide film with a thickness of from 1 to 5 nm approximately can be formed.

Figure 7A:
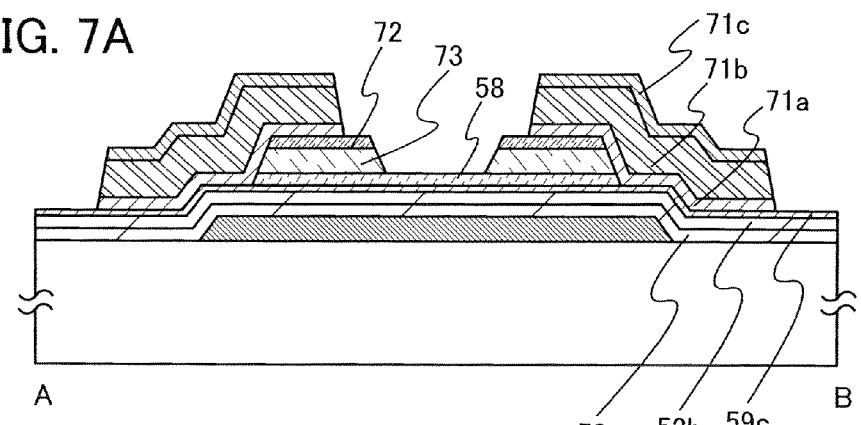
FIGS. 7A and 7C are cross-sectional views illustrating a thin film transistor of the present invention.

Further, instead of the two gate insulating films 52a and 52b, as shown in FIG. 7A, gate insulating films 52a and 52b and a gate insulating film 59c including an impurity element which serves as a donor may be formed over a substrate 50 and a gate electrode 51. Then, a microcrystalline semiconductor film 58, a pair of buffer layers 73, a pair of semiconductor films 72 to which an impurity element imparting one conductivity type is added, and wirings 71a to 71c can be formed thereover.

As the gate insulating films 52a and 52b, which are first and second layers, a silicon nitride film, a silicon nitride oxide film, a silicon oxide film, or a silicon oxynitride film can be formed by a plasma CVD method or a sputtering method in a similar manner to Embodiment Mode 1. As the gate insulating film 59c including the impurity element which serves as a donor, which is a third layer, a silicon nitride film or a silicon nitride oxide film with a thickness of from 1 to 5 nm approximately which includes phosphorus, arsenic, or antimony can be formed.

Figure 7B:
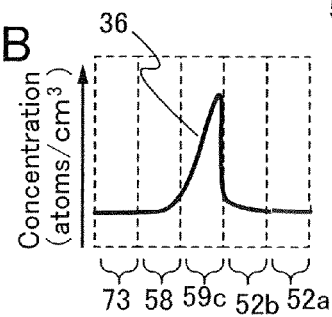
FIGS. 7B and 7D are diagrams showing peak concentrations of an impurity element which serves as a donor in stacked films.

Next, with SIMS, concentration distribution of the impurity element which serves as a donor in a stacked-layer portion including the gate insulating films 52a and 52b, the gate insulating film 59c including the impurity element which serves as a donor, the microcrystalline semiconductor film 58, and the pair of buffer layers 73 is schematically shown by a curve 36 in FIG. 7B.

As shown in FIG. 7B, the concentration of the impurity element which serves as a donor in the thin film transistor shown in FIG. 7A has a peak value in the gate insulating film 59c including the impurity element which serves as a donor. Further, the peak is present at or around the interface between the gate insulating film 52b and the gate insulating film 59c including the impurity element which serves as a donor. Furthermore, the shape of the curve that shows the concentration distribution of the impurity element which serves as a donor is not limited to that shown in FIG. 7B, and the concentration may have a peak in or around the center of the gate insulating film 59c including the impurity element which serves as a donor.

Figure 7C:
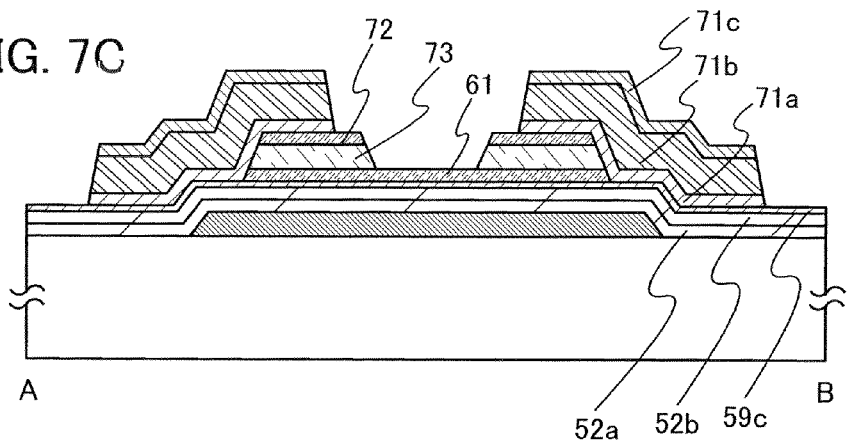

Instead of the microcrystalline semiconductor film 58 shown in FIG. 7A, a microcrystalline semiconductor film 61 including an impurity element which serves as a donor may be formed (see FIG. 7C). For example, after forming a gate insulating film 59c including an impurity element which serves as a donor, a microcrystalline semiconductor is deposited under the condition of forming the microcrystalline semiconductor film 58, with the impurity element which serves as a donor remaining in a reaction chamber. Subsequently, buffer layers 73 are formed and then the process presented in Embodiment Mode 1 is carried out, so that a thin film transistor can be formed in which gate insulating films 52a and 52b and the gate insulating film 59c including the impurity element which serves as a donor are formed over a gate electrode 51; the microcrystalline semiconductor film 61 including the impurity element which serves as a donor is formed over the gate insulating film 59c; and the buffer layers 73 are formed over the microcrystalline semiconductor film 61, as shown in FIG. 7C.

Figure 7D:
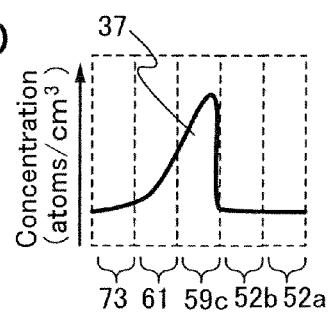

Next, with SIMS, concentration distribution of the impurity element which serves as a donor in a stacked-layer portion including the gate insulating films 52a and 52b, the gate insulating film 59c including the impurity element which serves as a donor, the microcrystalline semiconductor film 61 including the impurity element which serves as a donor, and the pair of buffer layers 73 is schematically shown by a curve 37 in FIG. 7D.

As shown in FIG. 7D, the concentration of the impurity element which serves as a donor in the thin film transistor shown in FIG. 7C has a peak value in the gate insulating film 59c including the impurity element which serves as a donor. Further, the peak is present at or around the interface between the gate insulating film 52b and the gate insulating film 59c including the impurity element which serves as a donor. Furthermore, the shape of the curve that shows the concentration distribution of the impurity element which serves as a donor is not limited to that shown in FIG. 7D, and the concentration may have a peak in or around the center of the gate insulating film 59c including the impurity element which serves as a donor.

When a silicon nitride film or a silicon nitride oxide film with a thickness of from 1 to 5 nm approximately, or a silicon nitride film or a silicon nitride oxide film which includes an impurity element which serves as a donor and has a thickness of from 1 to 5 nm approximately is formed as the gate insulating film 52c or 59c, which is the third layer, a plasma CVD method can be employed. Further, it is also possible to have the gate insulating film 52b undergo nitridation treatment with high-density plasma to form a silicon nitride layer on a surface of the gate insulating film 52b. By high-density plasma nitridation, a silicon nitride layer that includes nitrogen at a higher concentration can be obtained. The high-density plasma is generated by use of high-frequency microwaves, for example, microwaves with a frequency of 2.45 GHz. With high-density plasma, which has the characteristic of having a low electron temperature, a layer can be formed with less plasma damage and fewer defects compared to a layer formed by conventional plasma treatment because the kinetic energy of an active species is low. In addition, with use of high-density plasma, carrier mobility can be increased because the level of roughness on the surface of the gate insulating film 52b can be reduced.

In a microcrystalline semiconductor film, an amorphous semiconductor and a crystalline semiconductor are mixed. Thus, when the amorphous semiconductor comes to be in contact with silicon oxide or silicon oxynitride, hydrogen in the amorphous semiconductor tends to react with the silicon oxide or the silicon oxynitride, so that hydrogen concentration in the microcrystalline semiconductor film decreases and the interface between the gate insulating film and the microcrystalline semiconductor film deteriorates. Therefore, a silicon nitride film or a silicon nitride oxide film with a small thickness that is formed as a base film for the microcrystalline semiconductor film can serve as a blocking film for preventing hydrogen from diffusing, so that deterioration of the interface between the gate insulating film and the microcrystalline semiconductor film can be reduced.

It is possible to apply the above structure of the gate insulating film to the gate insulating film of the thin film transistors shown in FIGS. 1A and 1D, FIGS. 2A and 2E, FIG. 3A, FIGS. 4A and 4C, and FIG. 5A.

Embodiment Mode 3

This embodiment mode describes processes for manufacturing the thin film transistors described in Embodiment Mode 1.

With regard to a thin film transistor including a microcrystalline semiconductor film, an n-channel thin film transistor has higher field effect mobility than a p-channel thin film transistor; thus, an n-channel thin film transistor is more suitable for a driver circuit. Further, it is preferable that all the thin film transistors formed over one substrate have the same polarity so that the number of manufacturing steps is reduced. In description of this embodiment mode, an n-channel thin film transistor is used.

First, manufacturing processes of the thin film transistors shown in FIGS. 1A and 1D are described below.

Figure 9A:
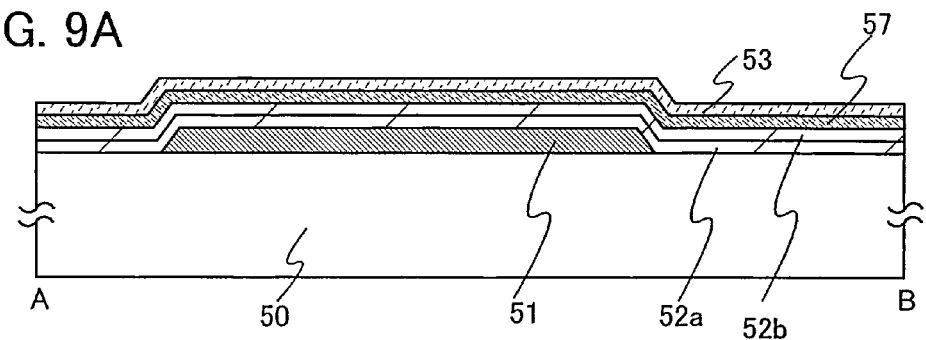
FIGS. 9A to 9C are cross-sectional views illustrating a method for manufacturing a display device of the present invention.

As shown in FIG. 9A, a gate electrode 51 is formed over a substrate 50, and gate insulating films 52a and 52b are formed over the gate electrode 51.

The gate electrode 51 is formed by a sputtering method, a CVD method, a plating method, a printing method, a droplet discharge method, or the like using any of the metal materials described in Embodiment Mode 1. In this embodiment mode, a molybdenum film is formed as a conductive film over the substrate 50 by a sputtering method and is etched with use of a resist mask that is formed using a first photomask, whereby the gate electrode 51 is formed.

Each of the gate insulating films 52a and 52b can be formed by a CVD method, a sputtering method, or the like using a silicon oxide film, a silicon nitride film, a silicon oxynitride film, or a silicon nitride oxide film.

Next, after an impurity element which serves as a donor is adsorbed onto the gate insulating film 52b, a microcrystalline semiconductor film is deposited by a plasma CVD method using a deposition gas including silicon or germanium, and hydrogen, whereby a microcrystalline semiconductor film 57 including the impurity element which serves as a donor is formed.

Figure 8:
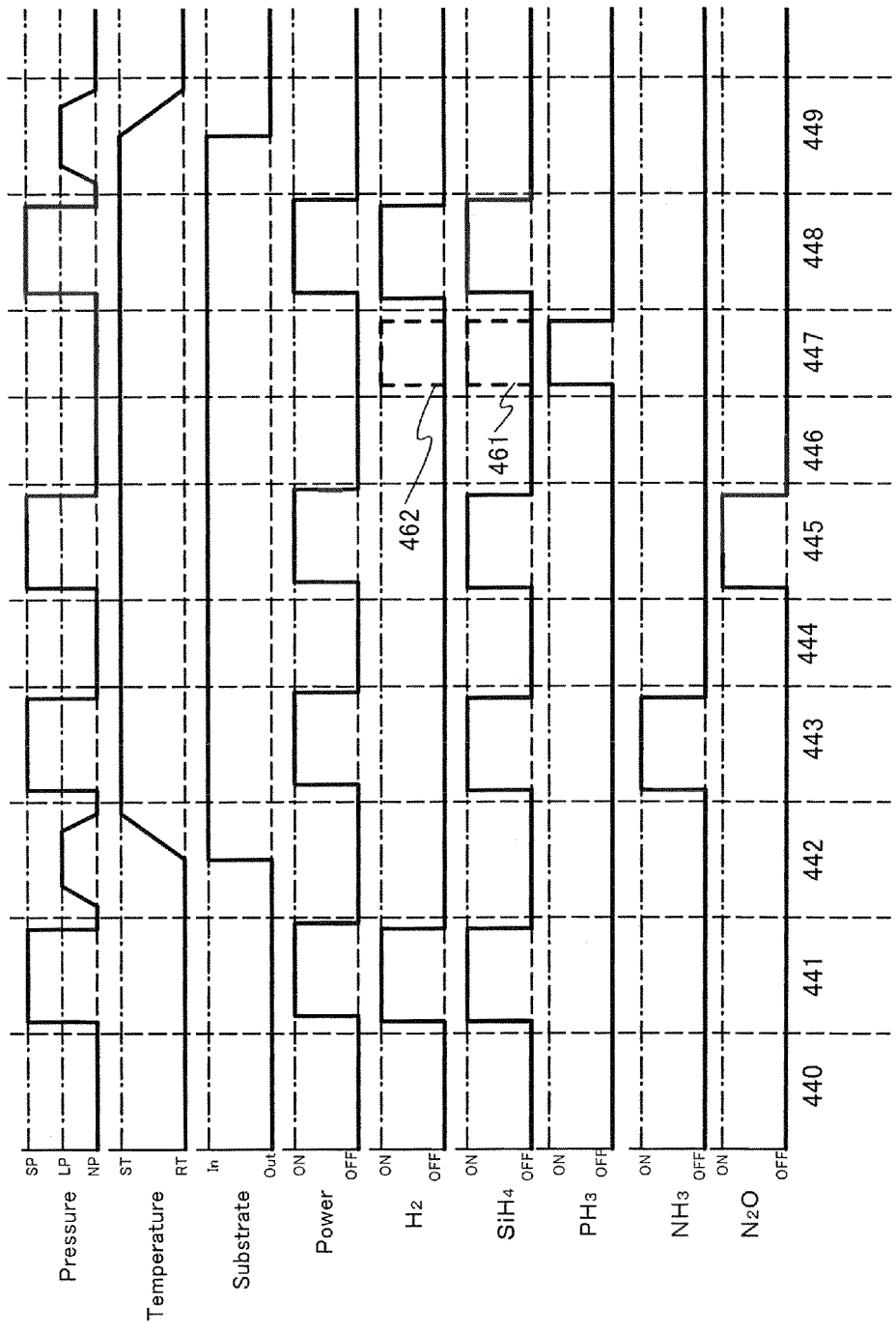
FIG. 8 is an example of a timing chart illustrating a process for forming gate insulating films and a microcrystalline semiconductor film.

As a typical example of a method for forming a microcrystalline semiconductor film including an impurity element which serves as a donor, a process for forming a microcrystalline silicon film including phosphorus is described in chronological order with reference to FIG. 8.

FIG. 8 is a typical example of a timing chart for describing steps of forming the gate insulating films 52a and 52b and the microcrystalline semiconductor film 57 including the impurity element which serves as a donor. FIG. 8 shows a procedure starting from a step of vacuum evacuation 440 from atmospheric pressure in a reaction chamber of a plasma CVD apparatus. Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a film formation treatment (2) 445 for forming the gate insulating film 52b, a vacuum evacuation treatment 446, a flush treatment 447, a film formation treatment (3) 448 for forming the microcrystalline semiconductor film 57 including the impurity element which serves as a donor, and substrate carrying-out 449.

First, vacuum evacuation is performed in a reaction chamber to a predetermined degree of vacuum (hereinafter, such a pressure is called as NP (Normal Pressure)). In the case of high vacuum evacuation, vacuum evacuation is performed with use of a turbo molecular pump or the like to obtain a pressure lower than $10^{-1}$ Pa as a degree of vacuum. Alternatively, vacuum evacuation may be performed with use of a cryopump to reduce a pressure in the reaction chamber to be lower than $10^{-5}$ Pa, i.e., to an ultrahigh vacuum. In addition, preferably, a heat treatment is performed to the reaction chamber so as to degas the inner wall of the reaction chamber. Further, the temperature is stabilized by operating a heater for heating the substrate. The substrate heating temperature is from 100 to 300° C., preferably from 120 to 220° C.

In the precoating treatment 441, the inner wall of the reaction chamber of the plasma CVD apparatus is precoated with a film having a composition that is the same as or similar to the gate insulating film. Accordingly, it is possible to prevent a metal used to form the reaction chamber from entering the gate insulating film as an impurity. In other words, by covering the inner wall of the reaction chamber with the film having a composition that is the same as or similar to the gate insulating film, the inner wall of the reaction chamber can be prevented from being etched by plasma, and the concentration of the impurity which enters the gate insulating film from the reaction chamber can be reduced.

In the substrate carrying-in 442, the substrate is carried into the reaction chamber from a load lock chamber connected to the reaction chamber. The pressure in the reaction chamber at this time is the same as that in the load lock chamber (hereinafter such a pressure is called as LP (Load Lock Pressure)).

In the film formation treatment (1) 443 for forming the gate insulating film 52a, source gases, which are hydrogen, silane, and ammonia in this example, are introduced and mixed, so that a pressure in the reaction chamber reaches a predetermined value (hereinafter such a pressure is called as SP (Setting Pressure)), and a silicon nitride film is formed by glow discharge plasma which is generated by application of high-frequency power. Nitrogen may also be introduced in addition to the above source gases. After the gate insulating film 52a is formed, introduction of the above source gases is halted, and the power is turned off, and then, generation of plasma is halted.

In the vacuum evacuation treatment 444, vacuum evacuation is performed in the reaction chamber to a predetermined degree of vacuum.

In the film formation treatment (2) 445 for forming the gate insulating film 52b, source gases, which are hydrogen, silane, and dinitrogen monoxide in this example, are introduced and mixed, and a silicon oxynitride film is formed by glow discharge plasma which is generated by application of high-frequency power. After the gate insulating film 52b is formed, introduction of the above source gases is halted, and the power is turned off, and then, generation of plasma is halted.

In the vacuum evacuation treatment 446, vacuum evacuation is performed in the reaction chamber to a predetermined degree of vacuum.

In the flush treatment 447, gas including an impurity element which serves as a donor is introduced to the reaction chamber, and the impurity element which serves as a donor is adsorbed onto the surface of the gate insulating film 52b, furthermore, onto the inner wall of the reaction chamber. In this embodiment mode, 0.001% to 1% phosphine (diluted with hydrogen or silane) is introduced to the reaction chamber. Phosphine is not necessarily diluted with hydrogen or silane. In addition to the gas including the impurity element which serves as a donor, deposition gas including silicon or germanium may be introduced as designated by a dashed line 461 or hydrogen may be introduced as designated by a dashed line 462, to the reaction chamber. By introducing deposition gas including silicon or germanium, or hydrogen to the reaction chamber, an impurity such as oxygen, nitrogen, or fluorine in the reaction chamber can be discharged from the reaction chamber, so that contamination of a film to be formed can be prevented.

In the film formation treatment (3) 448 for forming the microcrystalline semiconductor film 57 including the impurity element which serves as a donor, deposition gas including silicon or germanium, which is silane in this example, hydrogen, and/or rare gas are introduced and mixed in the reaction chamber, and a microcrystalline semiconductor film is formed by glow discharge plasma which is generated by application of high-frequency power. Silane is diluted with hydrogen and/or rare gas to be 10 to 2000 times thinner. Therefore, a large amount of hydrogen and/or rare gas is needed. The substrate heating temperature is from 100 to 300° C., preferably from 120 to 220° C. It is preferable that the film be formed at temperatures of from 120 to 220° C. so that a growing surface of the microcrystalline silicon film may be inactivated with hydrogen to promote growth of microcrystalline silicon. At this time, the microcrystalline semiconductor grows using the impurity element which serves as a donor and is adsorbed onto the surface of the gate insulating film 52b, which is phosphorus in this example, as a crystal nucleus. Thus, an amorphous semiconductor is not formed in an early stage of deposition of the semiconductor film, and crystals grow in a direction of the normal to the gate insulating film 52b, so that a microcrystalline semiconductor film with high crystallinity in which column-like microcrystalline semiconductors are present can be formed. In addition, the impurity element which serves as a donor and is adsorbed onto the surface of the gate insulating film 52b is included in the microcrystalline semiconductor film, so that a highly conductive microcrystalline semiconductor film 57 including the impurity element which serves as a donor can be formed.

Further, an energy band width may be adjusted to be from 0.9 to 1.1 eV by mixing germanium hydride or germanium fluoride such as $GeH_4$ or $GeF_4$ into gas such as silane. By adding germanium to silicon, the temperature characteristics of a thin film transistor can be changed.

In the substrate carrying-out 449, the substrate is carried out of the reaction chamber and carried into the load lock chamber connected to the reaction chamber. The pressure in the reaction chamber at this time is the same as that in the load lock chamber.

The film formation treatment (3) 448 for forming the microcrystalline semiconductor film 57 including the impurity element which serves as a donor is carried out after the flush treatment 447 in this embodiment mode. However, instead of these treatments, the microcrystalline semiconductor film 57 including the impurity element which serves as a donor can be formed without the flush treatment 447 as follows: deposition gas including silicon or germanium, hydrogen, and/or rare gas, and gas including an impurity element which serves as a donor are introduced and mixed, and the microcrystalline semiconductor film 57 including the impurity element which serves as a donor is formed by glow discharge plasma which is generated by application of high-frequency power.

In a conventional method for forming a microcrystalline semiconductor film, an amorphous semiconductor layer is formed in an early stage of deposition due to impurities except the impurity element which serves as a donor, lattice mismatch, or the like. In an inverted-staggered thin film transistor, carriers flow in a region of a microcrystalline semiconductor film which is near to the gate insulating film. Thus, when an amorphous semiconductor layer is formed at the interface between a gate insulating film and the microcrystalline semiconductor film, field effect mobility decreases, and further, the amount of current reduces, so that electric characteristics of the thin film transistor deteriorate.

However, by forming the microcrystalline semiconductor film including the impurity element which serves as a donor over the gate insulating film as in this embodiment mode, crystallinity in a film thickness direction can be improved, and crystallinity at the interface between the gate insulating film and the microcrystalline semiconductor film can be improved.

Next, as shown in FIG. 9A, a microcrystalline semiconductor film 53 is formed over the microcrystalline semiconductor film 57 including the impurity element which serves as a donor. The microcrystalline semiconductor film 53 is formed as follows: deposition gas including silicon or germanium, which is silane in this example, hydrogen, and/or rare gas are introduced and mixed in a reaction chamber, and the microcrystalline semiconductor film is formed by glow discharge plasma which is generated by application of high-frequency power. Silane is diluted with hydrogen and/or rare gas to be 10 to 2000 times thinner. Therefore, a large amount of hydrogen and/or rare gas is needed. The substrate heating temperature is from 100 to 300° C., preferably from 120 to 220° C. It is preferable that the film be formed at temperatures of from 120 to 220° C. so that a growing surface of the microcrystalline silicon film is inactivated with hydrogen to promote growth of microcrystalline silicon. By forming the microcrystalline semiconductor film 53 in a reaction chamber different from that for forming the microcrystalline semiconductor film 57 including the impurity element which serves as a donor, the microcrystalline semiconductor film 53, which does not include the impurity element which serves as a donor at a higher concentration than the detection limit of SIMS, can be formed. Also by forming the microcrystalline semiconductor film successively without the substrate carrying-out 449 shown in FIG. 8, the microcrystalline 53, which does not include the impurity element which serves as a donor at a higher concentration than the detection limit of SIMS, can be formed. In this case, in the flush treatment 447, it is preferable to reduce the concentration of the impurity element which serves as a donor and is adsorbed onto the gate insulating film 52b and the inner wall of the reaction chamber.

Figure 9B:
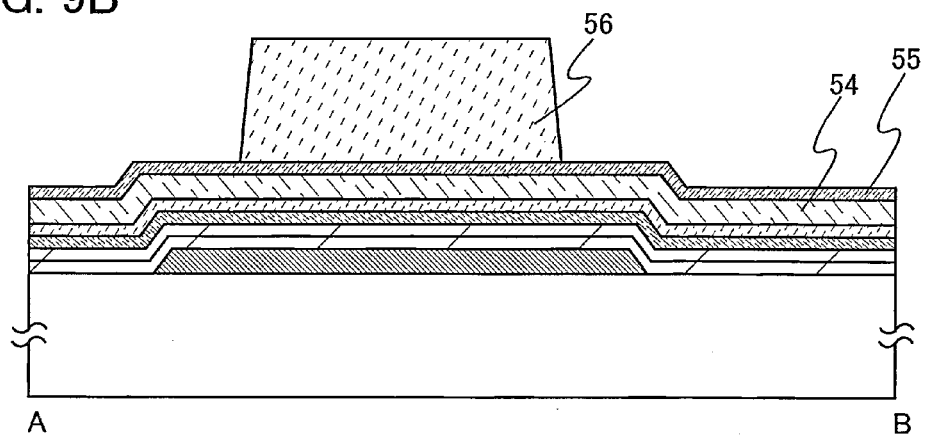

Next, as shown in FIG. 9B, a buffer layer 54 and a semiconductor film 55 to which an impurity element imparting one conductivity type is added are formed over the microcrystalline semiconductor film 53. Then, a resist mask 56 is formed over the semiconductor film 55 to which the impurity element imparting one conductivity type is added.

As the buffer layer 54, an amorphous semiconductor film can be formed by a plasma CVD method using deposition gas including silicon or germanium. Alternatively, by diluting deposition gas including silicon or germanium with one or plural kinds of rare gases selected from helium, argon, krypton, and neon, an amorphous semiconductor film can be formed. Furthermore, an amorphous semiconductor film including hydrogen can be formed using hydrogen with a flow rate of 1 to 10 times, preferably 1 to 5 times as high as that of deposition gas including silicon or germanium. In addition, halogen such as fluorine or chlorine, or nitrogen may be added to the above hydrogenated semiconductor film.

Still furthermore, as the buffer layer 54, an amorphous semiconductor film can be formed by sputtering a semiconductor such as silicon or germanium, which is used as a target, with hydrogen or rare gas.

The buffer layer 54 is preferably formed using an amorphous semiconductor film which does not include crystal grains. Therefore, if the buffer layer 54 is formed by a high-frequency plasma CVD method with a frequency of several tens of MHz to several hundreds MHz or a microwave plasma CVD method, film formation conditions are preferably controlled such that an amorphous semiconductor film does not include crystal grains.

The buffer layer 54 is partly etched to be a pair of buffer layers in a later step for forming source and drain regions. At this time, the pair of buffer layers function as high resistant regions; thus, typically, it is preferable to form the buffer layer 54 with a thickness of from 30 to 500 nm inclusive, preferably from 50 to 200 nm inclusive. In a display device including a thin film transistor to which a high voltage (e.g., approximately 15 V) is applied, typically, in a liquid crystal display device, if the buffer layer 54 is formed thickly, withstand voltage is increased, so that deterioration of the thin film transistor can be prevented even if a high voltage is applied to the thin film transistor.

Since the buffer layer 54 is formed using an amorphous semiconductor film or an amorphous semiconductor film including hydrogen, nitrogen, or halogen, the buffer layer 54 has a larger energy gap and higher resistivity than the microcrystalline semiconductor film 53 and low mobility which is one-fifth to one-tenth that of the microcrystalline semiconductor film 53. Therefore, in a thin film transistor to be completed later, the buffer layers formed between the source and drain regions and the microcrystalline semiconductor film 53 function as high resistant regions and the microcrystalline semiconductor film 57 including the impurity element which serves as a donor functions as a channel formation region. Accordingly, off-current of the thin film transistor can be reduced. In addition, when the thin film transistor is used as a switching element of a display device, the display device can have an improved contrast.

The buffer layer 54 can also be formed at temperatures of from 300 to 400° C. by a plasma CVD method after forming the microcrystalline semiconductor film 53. By this treatment, hydrogen is supplied to the microcrystalline semiconductor film 53, and the same effect as hydrogenizing the microcrystalline semiconductor film 53 can be obtained. In other words, by depositing the buffer layer 54 over the microcrystalline semiconductor film 53, hydrogen is diffused into the microcrystalline semiconductor film 53, so that a dangling bond can be terminated.

By forming the buffer layer 54 after forming the microcrystalline semiconductor film 57 including the impurity element which serves as a donor without forming the microcrystalline semiconductor film 53, the thin film transistor as shown in FIG. 1D can be manufactured.

With regard to the semiconductor film 55 to which the impurity element imparting one conductivity type is added, in the case where an n-channel thin film transistor is formed, phosphorus may be added as a typical impurity element, and impurity gas such as $PH_3$ may be added to silicon hydride. When a p-channel thin film transistor is formed, boron may be added as a typical impurity element, and impurity gas such as $B_2H_6$ may be added to silicon hydride. The semiconductor film 55 to which the impurity element imparting one conductivity type is added can be formed of a microcrystalline semiconductor or an amorphous semiconductor. The semiconductor film 55 to which the impurity element imparting one conductivity type is added is formed with a thickness of from 2 to 50 nm inclusive. By forming a semiconductor film to which an impurity element imparting one conductivity type is added with a small thickness, throughput can be improved.

Then, the resist mask 56 is formed over the semiconductor film 55 to which the impurity element imparting one conductivity type is added.

The resist mask 56 is formed by a photolithography technique. Here, using a second photomask, the resist mask 56 is formed by exposing a resist that is applied on the semiconductor film 55 to which the impurity element imparting one conductivity type is added to light and developing the resist.

Figure 9C:
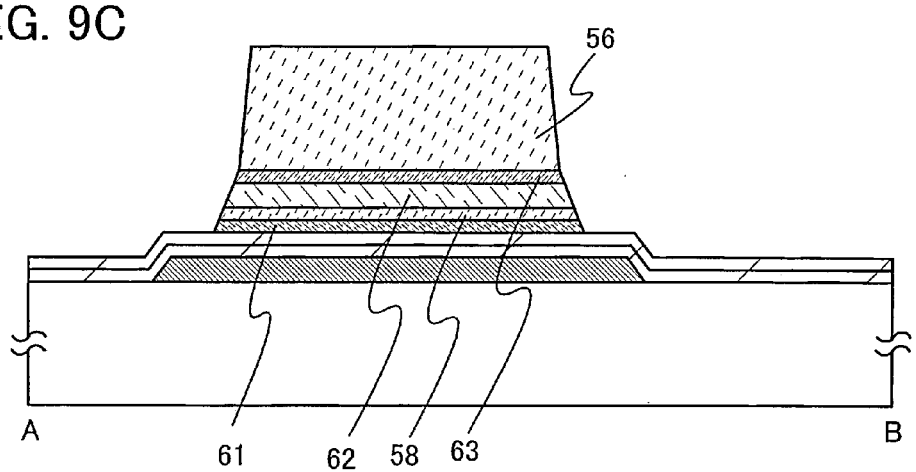

Next, the microcrystalline semiconductor film 57 including the impurity element which serves as a donor, the microcrystalline semiconductor film 53, the buffer layer 54, and the semiconductor film 55 to which the impurity element imparting one conductivity is added are etched to be separated using the resist mask 56, whereby a microcrystalline semiconductor film 61 including the impurity element which serves as a donor, a microcrystalline semiconductor film 58, a buffer layer 62, and a semiconductor film 63 to which the impurity element imparting one conductivity type is added are formed as shown in FIG. 9C. After that, the resist mask 56 is removed.

Figure 12A:
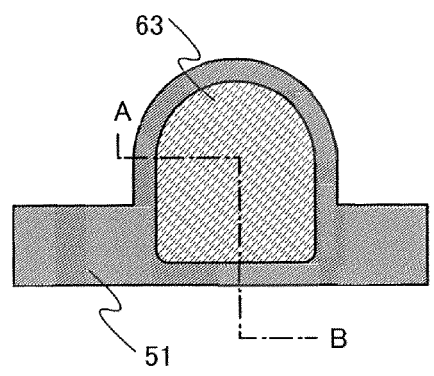
FIGS. 12A to 12C are top views illustrating a method for manufacturing a display device of the present invention.

FIG. 9C is a cross-sectional view taken along a line A-B in FIG. 12A (except for the resist mask 56).

With side surfaces of end portions of the microcrystalline semiconductor film 61, the microcrystalline semiconductor film 58, and the buffer layer 62 having inclines, the microcrystalline semiconductor film 58 and the source and drain regions have a larger distance therebetween, so that leakage current between the microcrystalline semiconductor film 61 and the source and drain regions formed over the buffer layer can be prevented. In addition, leakage current between wirings and the microcrystalline semiconductor film 61 can also be prevented. The inclination angle of the side surfaces of the end portions of the microcrystalline semiconductor film 61, the microcrystalline semiconductor film 58, and the buffer layer 62 is from 30° to 90°, preferably from 45° to 80°. With such an angle, disconnection of the wirings due to a step shape can be prevented.

Figure 10A:
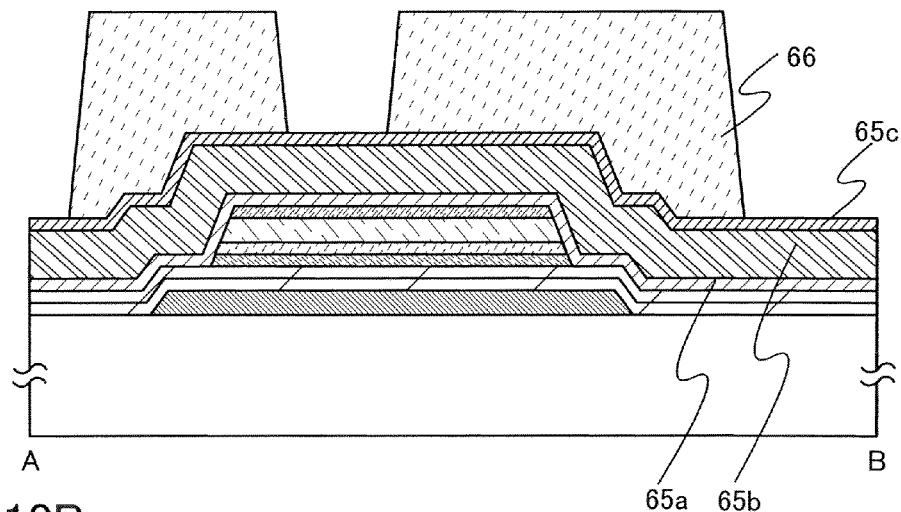
FIGS. 10A to 10C are cross-sectional views illustrating a method for manufacturing a display device of the present invention.

Next as shown in FIG. 10A, conductive films 65a to 65c are formed over the semiconductor film 63 to which the impurity element imparting one conductivity type is added and the gate insulating film 52b, and then, a resist mask 66 is formed over the conductive films 65a to 65c. The conductive films 65a to 65 are formed by a sputtering method, a CVD method, a printing method, a droplet discharge method, a vapor deposition method, or the like. Here, as the conductive film, a conductive film having a three-layer structure in which the conductive films 65a to 65c are stacked is shown; a molybdenum film is used for each of the conductive films 65a and 65c and an aluminum film is used for the conductive film 65b, or a titanium film is used for each of the conductive films 65a and 65c and an aluminum film is used for the conductive film 65b. The conductive films 65a to 65c are formed by a sputtering method or a vacuum evaporation method.

The resist mask 66 can be formed in a manner similar to the resist mask 56.

Figure 10B:
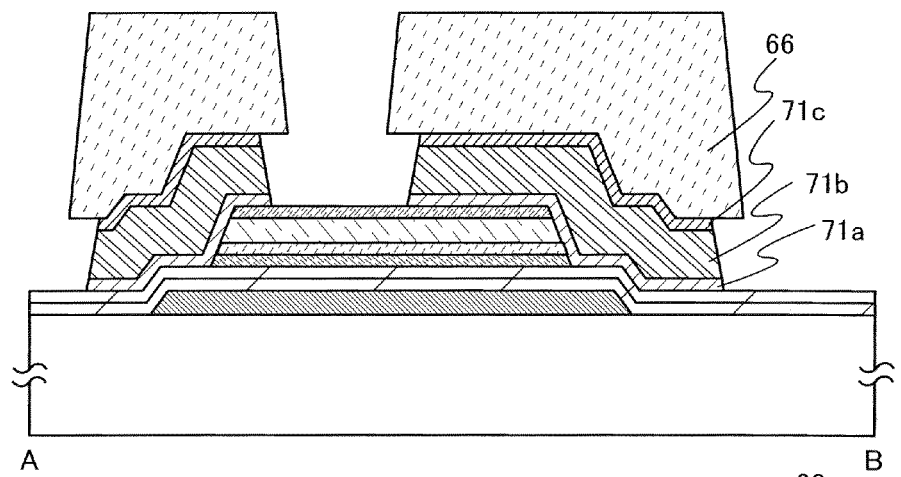

Next, as shown in FIG. 10B, the conductive films 65a to 65c are partly etched to form pairs of wirings 71a to 71c (functioning as source and drain electrodes). Here, the conductive films 65a to 65c are etched by wet etching using the resist mask 66 that is formed by a photolithography process using a third photomask, so that the conductive films 65a to 65c are etched as selected. Consequently, since the conductive films 65a to 65c are etched isotropically, the wirings 71a to 71c, which have smaller areas than the resist mask 66, can be formed.

Figure 10C:
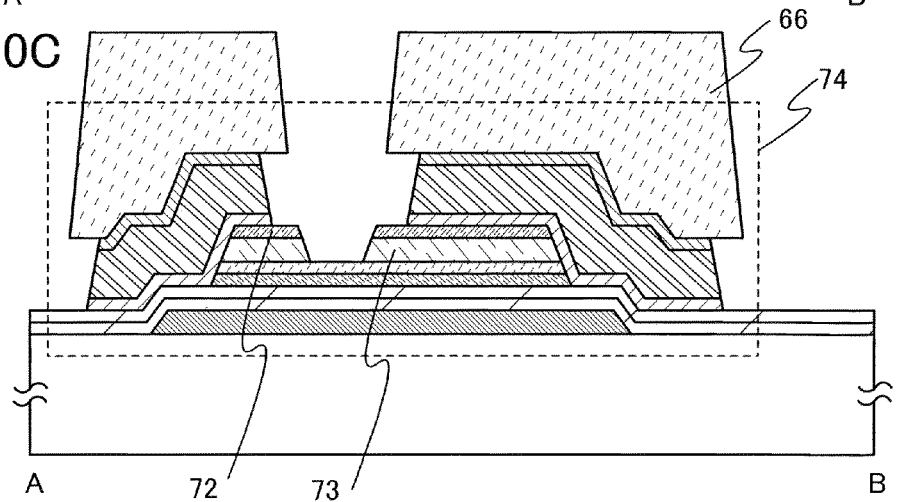

Then, the semiconductor film 63 to which the impurity element imparting one conductivity type is added is etched to be separated using the resist mask 66. As a result, a pair of source and drain regions 72 can be formed as shown in FIG. 10C. In this etching process, the buffer layer 62 is also etched partly to form a pair of buffer layers 73. At this time, the microcrystalline semiconductor film 58 may be overetched so as to form the pair of buffer layers 73. After that, the resist mask 66 is removed.

Next, dry etching is performed under such a condition that the exposed microcrystalline semiconductor film 58 is not damaged and an etching rate with respect to the microcrystalline semiconductor film 58 is low. Through this dry etching step, an etching residue on the microcrystalline semiconductor film 58 between the source region and the drain region, a residue of the resist mask, and a contamination source in an apparatus used for removal of the resist mask can be removed, whereby the source region and the drain region can be insulated surely. As a result, leakage current of the thin film transistor can be reduced, so that a thin film transistor with small off-current and high withstand voltage can be manufactured. A chlorine gas can be used for an etching gas, for example.

Figure 12B:
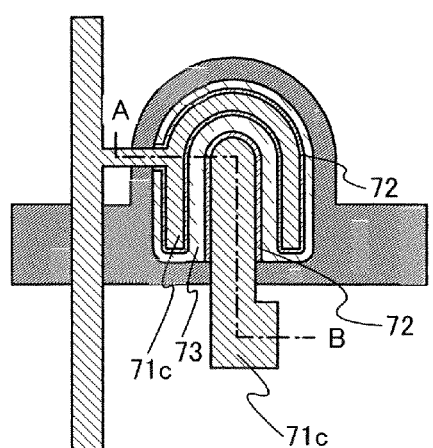

FIG. 10C is a cross-sectional view taken along a line A-B in FIG. 12B (except for the resist mask 66). As shown in FIG. 12B, end portions of the source and drain regions 72 are located outside those of the wirings 71c. Further, end portions of the pair of buffer layers 73 are located outside those of the wirings 71c and those of the source and drain regions 72. Furthermore, one of the wirings surrounds the other (specifically, the former wiring is in a U-shape or a C-shape). Accordingly, an area of a region in which carriers travel can be increased, and thus, the amount of current can be increased and an area of a thin film transistor can be reduced. Over the gate electrode, the microcrystalline semiconductor films and the wirings overlap with each other, and thus, an influence by unevenness of the gate electrode is small and reduction in coverage and generation of leakage current can be suppressed.

Through the above process, a channel-etched thin film transistor 74 can be formed.

Figure 11A:
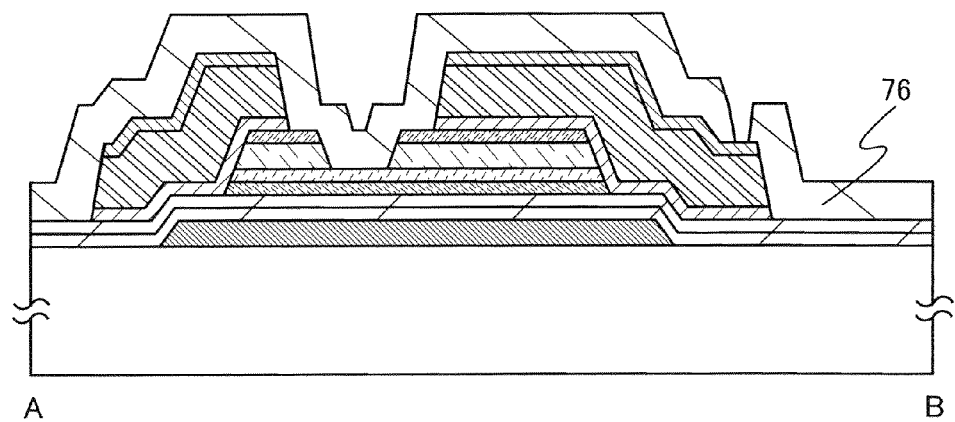
FIGS. 11A and 11B are cross-sectional views illustrating a method for manufacturing a display device of the present invention.

Next, as shown in FIG. 11A, a protective insulating film 76 is formed over the wirings 71a to 71c, the source and drain regions 72, the pair of buffer layers 73, the microcrystalline semiconductor film 58, and the gate insulating film 52b. The protective insulating film 76 can be formed in a similar manner to the gate insulating films 52a and 52b. The protective insulating film 76 prevents intrusion of a contaminating impurity such as an organic matter, a metal, or water vapor included in the air; thus, a dense film is preferably used for the protective insulating film 76. Further, by forming a silicon nitride film as the protective insulating film 76, the oxygen concentration in the buffer layers 73 can be set to be less than or equal to $5 \times 10^{19}$ atoms/cm$^3$, preferably less than or equal to $1 \times 10^{19}$ atoms/cm$^3$, which prevents the pair of buffer layers 73 from being oxidized.

Figure 11B:
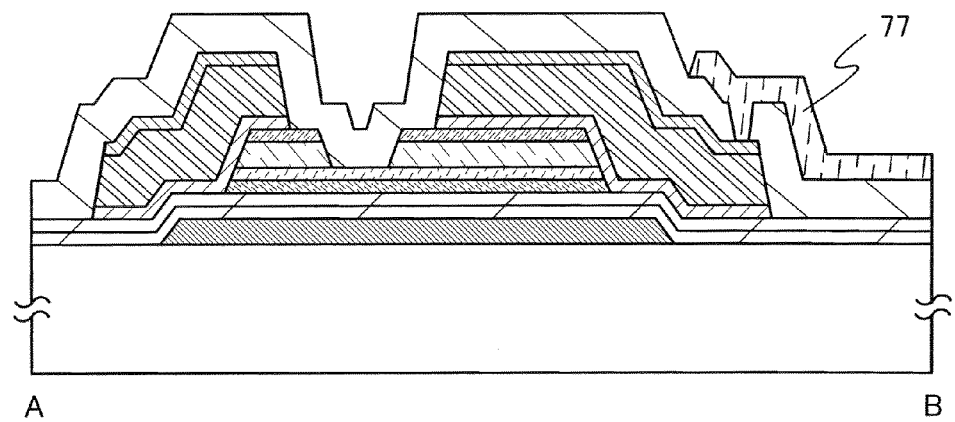
Figure 12C:
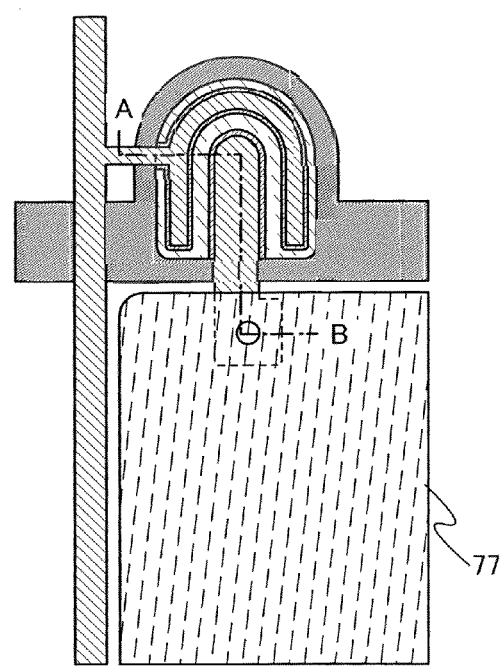

Next, as shown in FIG. 11B, a contact hole is formed in the protective insulating film 76 by partly etching the protective insulating film 76 using a resist mask formed using a fourth photomask. Then, a pixel electrode 77 that is in contact with the wiring 71c in the contact hole is formed. FIG. 11B is a cross-sectional view taken along a line A-B in FIG. 12C.

The pixel electrode 77 can be formed of a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added.

The pixel electrode 77 can be formed using a conductive composition including a conductive high-molecular compound (also referred to as a conductive polymer). It is preferable that a pixel electrode formed using a conductive composition have sheet resistance of less than or equal to 10000 Ω/square, and light transmittance of greater than or equal to 70% at a wavelength of 550 nm. In addition, the resistivity of the conductive high-molecular compound which is included in the conductive composition is preferably less than or equal to 0.1 Ω·cm.

As the conductive high-molecular compound, a "π electron conjugated conductive high-molecular compound" can be used. Examples thereof include polyaniline and derivatives thereof, polypyrrole and derivatives thereof, polythiophene and derivatives thereof, and copolymers of two or more kinds of them.

In this embodiment mode, the pixel electrode 77 is formed as follows: an ITO film is formed by a sputtering method, and a resist is applied on the ITO film, exposed to light, and developed using a fifth photomask, thereby forming a resist mask; then, the ITO film is etched using the resist mask to form the pixel electrode 77.

Accordingly, a thin film transistor and an element substrate that can be used for a display device can be formed.

Next, a process for manufacturing the thin film transistor shown in FIG. 2A is described below.

As in the step shown in FIG. 9A, a gate electrode 51 is formed over a substrate 50, and a gate insulating film 52a is formed over the gate electrode 51.

Figure 14:
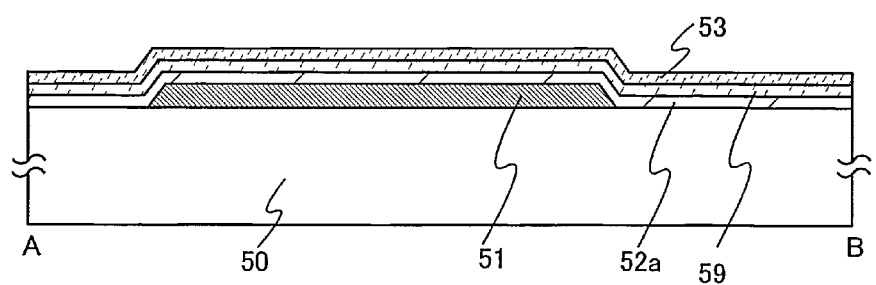
FIG. 14 is a cross-sectional view illustrating a method for manufacturing a display device of the present invention.

Next, as shown in FIG. 14, a gate insulating film 59 including an impurity element which serves as a donor is formed over the gate insulating film 52a, and a microcrystalline semiconductor film 53 is formed over the gate insulating film 59 by a plasma CVD method using deposition gas including silicon or germanium, and hydrogen.

Figure 13:
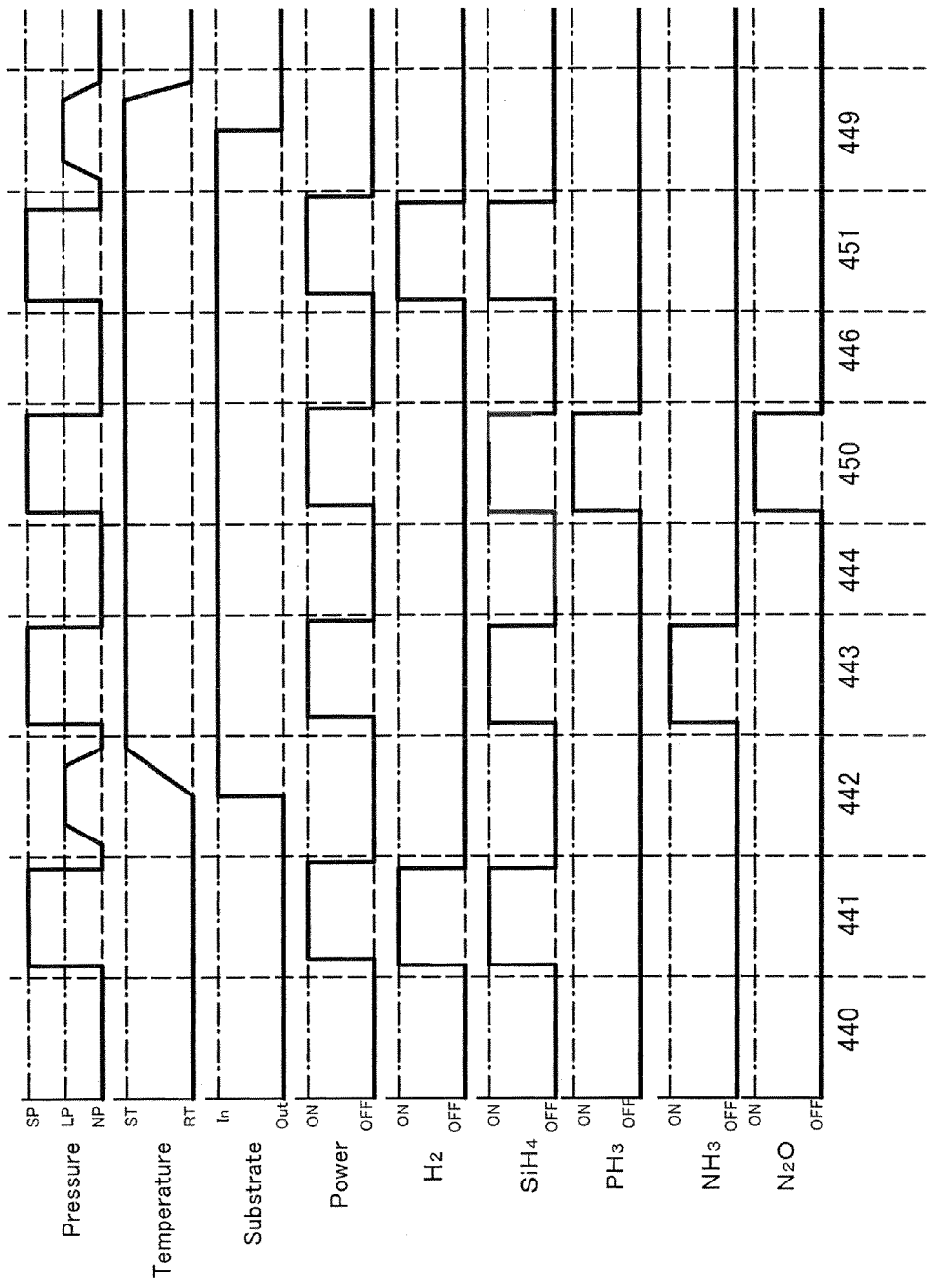
FIG. 13 is an example of a timing chart illustrating a process for forming gate insulating films and a microcrystalline semiconductor film.

As a typical example of a method for forming the gate insulating film 59 including the impurity element which serves as a donor, a process for forming a silicon oxynitride film including phosphorus is described in chronological order with reference to FIG. 13.

FIG. 13 is a typical example of a timing chart for describing steps of forming the gate insulating film 52a, the gate insulating film 59 including the impurity element which serves as a donor, and the microcrystalline semiconductor film 53. FIG. 13 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a film formation treatment (2) 450 for forming the gate insulating film 59 including the impurity element which serves as a donor, a vacuum evacuation treatment 446, a film formation treatment (3) 451 for forming the microcrystalline semiconductor film 53, and substrate carrying-out 449.

The precoating treatment 441, the substrate carrying-in 442, the film formation treatment (1) 443 for forming the gate insulating film 52a, the vacuum evacuation treatment 444, the vacuum evacuation treatment 446, and the substrate carrying-out 449 are the same as in FIG. 8, and the film formation treatment (2) 450 for forming the gate insulating film 59 including the impurity element which serves as a donor and the film formation treatment (3) 451 for forming the microcrystalline semiconductor film 53 are carried out between the vacuum evacuation treatment 444 and the substrate carrying-out 449.

In the film formation treatment (2) 450 for forming the gate insulating film 59 including the impurity element which serves as a donor, gas including the impurity element which serves as a donor is introduced to source gas for forming the gate insulating film. In this embodiment mode, silane, dinitrogen monoxide, and 0.001% to 1% phosphine (diluted with hydrogen or silane) are introduced to the reaction chamber, and a silicon oxynitride film including phosphorus is formed by glow discharge plasma. After the gate insulating film 59 including the impurity element which serves as a donor is formed, introduction of the above source gas is halted, and the power is turned off, and then, generation of plasma is halted.

In the film formation treatment (3) 451 for forming the microcrystalline semiconductor film 53, deposition gas including silicon or germanium, which is silane in this example, hydrogen, and/or rare gas are introduced and mixed in the reaction chamber, and a microcrystalline semiconductor film is formed by glow discharge plasma which is generated by application of high-frequency power. Silane is diluted with hydrogen and/or rare gas to be 10 to 2000 times thinner. Therefore, a large amount of hydrogen and/or rare gas is needed. The substrate heating temperature is from 100 to 300° C., preferably from 120 to 220° C. After the microcrystalline semiconductor film 53 is formed, introduction of the above source gas is halted, and the power is turned off, and then, generation of plasma is halted.

In order to form a microcrystalline semiconductor film which does not include the impurity element which serves as a donor at a higher concentration than the detection limit of SIMS as the microcrystalline semiconductor film 53, the following process is carried out. When the gate insulating film 59 including the impurity element which serves as a donor begins to be deposited, gas including the impurity element which serves as a donor, which is phosphine in this example, is introduced to the reaction chamber, and then, introduction of phosphine is halted, and a silicon oxynitride film is formed, so that almost all phosphorus in the reaction chamber is included in the silicon oxynitride film. Therefore, the microcrystalline semiconductor film 53, which is formed later, does not include the impurity element which serves as a donor at a higher concentration than the detection limit of SIMS. Alternatively, after the gate insulating film 59 including the impurity element which serves as a donor is formed, the substrate is carried out of the reaction chamber, and the inside of the reaction chamber is cleaned, and then, the substrate is carried into the reaction chamber again and the microcrystalline semiconductor film 53 is formed, whereby the microcrystalline semiconductor film 53, which does not include the impurity element which serves as a donor at a higher concentration than the detection limit of SIMS, can be formed. Further alternatively, after the gate insulating film 59 including the impurity element which serves as a donor is formed, the substrate is carried out of the reaction chamber, and the microcrystalline semiconductor film 53 is formed in a different reaction chamber, whereby the microcrystalline semiconductor film 53, which does not include the impurity element which serves as a donor at a higher concentration than the detection limit of SIMS, can be formed.

Further, by forming a microcrystalline semiconductor film including an impurity element which serves as a donor instead of the microcrystalline semiconductor film 53 in FIG. 14, the thin film transistor as shown in FIG. 2E can be manufactured in which the microcrystalline semiconductor film 61 including the impurity element which serves as a donor is formed over the gate insulating film 59 including the impurity element which serves as a donor. The microcrystalline semiconductor film 61 including the impurity element which serves as a donor may be formed in such a manner that after phosphine is introduced to a reaction chamber in forming the gate insulating film 59 including the impurity element which serves as a donor, a microcrystalline semiconductor film is formed while taking in phosphine remaining in the reaction chamber. Alternatively, when the microcrystalline semiconductor film is formed, phosphine may be introduced to the reaction chamber in addition to silane and hydrogen and/or argon. Further alternatively, after the gate insulating film 59 including the impurity element which serves as a donor is formed, phosphine may be supplied to the reaction chamber and attached to the inner wall of the reaction chamber, and then, the microcrystalline semiconductor film is formed.

Next, through the steps shown in FIGS. 9B and 9C and FIGS. 10A to 10C, the thin film transistor as shown in FIG. 2A can be manufactured. In addition, through the steps shown in FIGS. 11A and 11B, an element substrate which can be used for a display device can be formed.

Next, another manufacturing method of the thin film transistor shown in FIG. 2A is described below.

Figure 15:
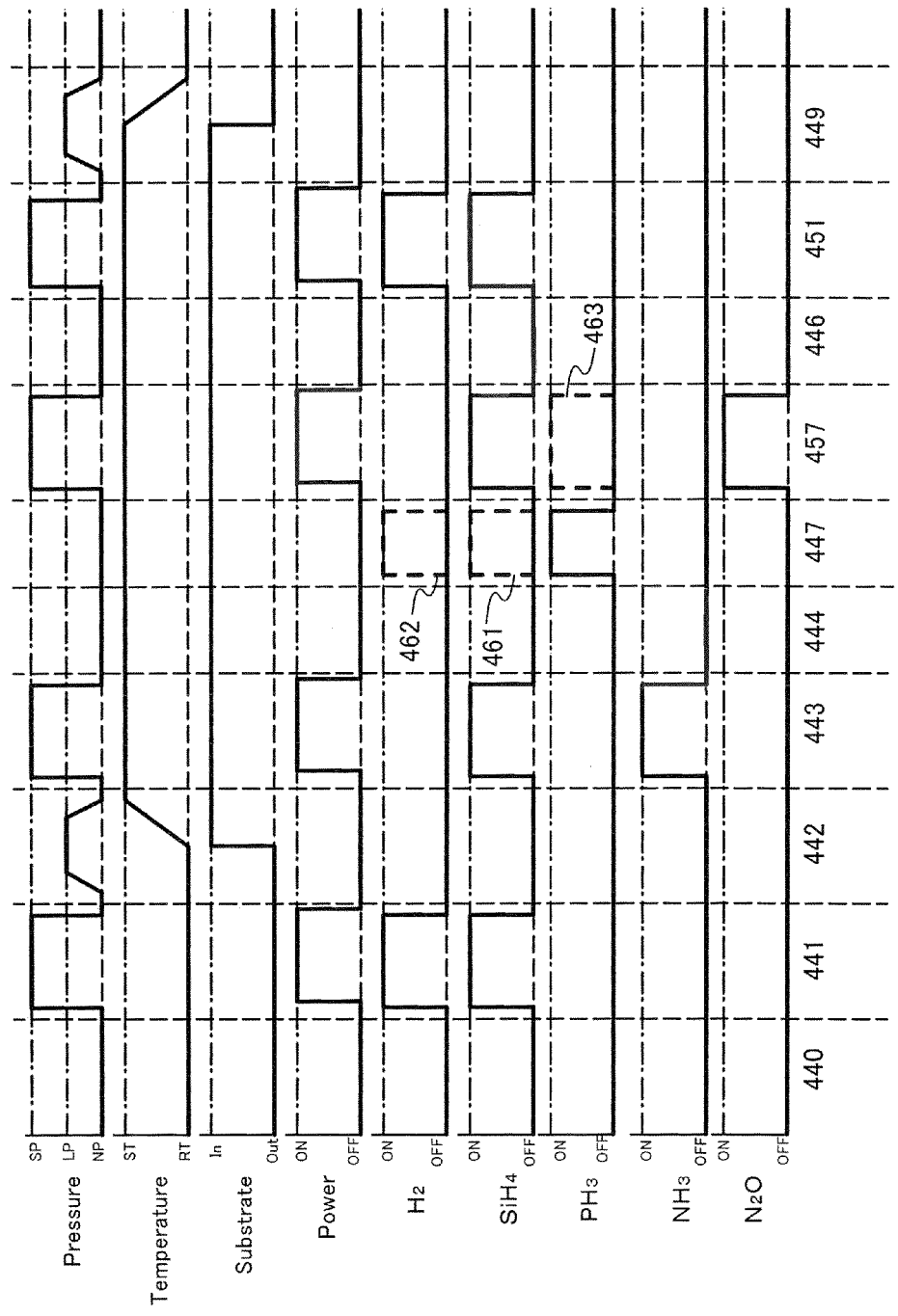
FIG. 15 is an example of a timing chart illustrating a process for forming gate insulating films and a microcrystalline semiconductor film.

As a typical example of a method for forming the gate insulating film 59 including the impurity element which serves as a donor, a process for forming a silicon oxynitride film including phosphorus is described in chronological order with reference to FIG. 15.

FIG. 15 is a typical example of a timing chart for describing steps of forming the gate insulating film 52a, the gate insulating film 59 including the impurity element which serves as a donor, and the microcrystalline semiconductor film 53. FIG. 15 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a flush treatment 447, a film formation treatment (2) 457 for forming the gate insulating film 59 including the impurity element which serves as a donor, a vacuum evacuation treatment 446, a film formation treatment (3) 451 for forming the microcrystalline semiconductor film 53, and substrate carrying-out 449.

The precoating treatment 441, the substrate carrying-in 442, the film formation treatment (1) 443 for forming the gate insulating film 52a, the vacuum evacuation treatment 444, the vacuum evacuation treatment 446, the film formation treatment (3) 451 for forming the microcrystalline semiconductor film 53, and the substrate carrying-out 449 are the same as in FIG. 13, and the flush treatment 447 and the film formation treatment (2) 457 for forming the gate insulating film 59 including the impurity element which serves as a donor are carried out between the vacuum evacuation treatment 444 and the vacuum evacuation treatment 446.

In the flush treatment 447, gas including the impurity element which serves as a donor is introduced to the reaction chamber, and the impurity element which serves as a donor is adsorbed onto the surface of the gate insulating film 52a, furthermore, onto the inner wall of the reaction chamber. In this embodiment mode, 0.001% to 1% phosphine (diluted with hydrogen or silane) is introduced to the reaction chamber. In addition to the gas including the impurity element which serves as a donor, hydrogen may be introduced as designated by a dashed line 462, or deposition gas including silicon or germanium may be introduced as designated by a dashed line 461, to the reaction chamber.

In the film formation treatment (2) 457 for forming the gate insulating film 59 including the impurity element which serves as a donor, source gases, which are hydrogen, silane, and dinitrogen monoxide in this example, are introduced to the reaction chamber, and a silicon oxynitride film is formed by glow discharge plasma which is generated by application of high-frequency power. At this time, the silicon oxynitride film is deposited while taking in the impurity element which serves as a donor and is deposited over the surface of the gate insulating film 52a and is adsorbed onto the surface of the inner wall of the reaction chamber, which is phosphorus in this example. Thus, a silicon oxynitride film including phosphorus can be formed. After the gate insulating film 59 including the impurity element which serves as a donor is formed, introduction of the above source gas is halted, and the power is turned off, and then, generation of plasma is halted.

In the film formation treatment (3) 451 for forming the microcrystalline semiconductor film 53, in order to form a microcrystalline semiconductor film which does not include the impurity element which serves as a donor at a higher concentration than the detection limit of SIMS, the following process is carried out. When the gate insulating film 59 including the impurity element which serves as a donor begins to be deposited, gas including the impurity element which serves as a donor, which is phosphine in this example, is introduced to the reaction chamber, and then, introduction of phosphine is shalted, and a silicon oxynitride film is formed, so that almost all phosphorus in the reaction chamber is included in the silicon oxynitride film. Therefore, the microcrystalline semiconductor film 53, which is formed later, does not include the impurity element which serves as a donor at a higher concentration than the detection limit of SIMS. Alternatively, after the gate insulating film 59 including the impurity element which serves as a donor is formed, the substrate is carried out of the reaction chamber, and the inside of the reaction chamber is cleaned, and then, the substrate is carried into the reaction chamber again, and the microcrystalline semiconductor film 53 is formed, whereby the microcrystalline semiconductor film 53, which does not include the impurity element which serves as a donor at a higher concentration than the detection limit of SIMS, can be formed. Further alternatively, after the gate insulating film 59 including the impurity element which serves as a donor is formed, the substrate is carried out of the reaction chamber, and the microcrystalline semiconductor film 53 is formed in a different reaction chamber, whereby the microcrystalline semiconductor film 53, which does not include the impurity element which serves as a donor at a higher concentration than the detection limit of SIMS, can be formed.

Next, through the steps shown in FIGS. 9B and 9C and FIGS. 10A to 10C, the thin film transistor as shown in FIG. 2A can be manufactured. In addition, through the steps shown in FIGS. 11A and 11B, an element substrate which can be used for a display device can be formed.

Further, by forming a microcrystalline semiconductor film including an impurity element which serves as a donor instead of the microcrystalline semiconductor film 53, the thin film transistor as shown in FIG. 2E can be manufactured in which the microcrystalline semiconductor film 61 including the impurity element which serves as a donor is formed over the gate insulating film 59 including the impurity element which serves as a donor. The microcrystalline semiconductor film 61 including the impurity element which serves as a donor may be formed in such a manner that after phosphine is introduced to a reaction chamber in forming the gate insulating film 59 including the impurity element which serves as a donor, a microcrystalline semiconductor film is formed while taking in phosphine remaining in the reaction chamber. Alternatively, when the microcrystalline semiconductor film is formed, phosphine may be introduced to the reaction chamber in addition to silane and hydrogen and/or argon. Further alternatively, after the gate insulating film 59 including the impurity element which serves as a donor is formed, phosphine may be supplied to the reaction chamber and attached to the inner wall of the reaction chamber, and then, the microcrystalline semiconductor film is formed.

Next, a process for manufacturing the thin film transistor shown in FIG. 3A is described below.

As in the step shown in FIG. 9A, a gate electrode 51 is formed over a substrate 50.

Next, after a film including the impurity element which serves as a donor is formed as a protective film on the inner wall of a reaction chamber of a plasma CVD apparatus, the substrate 50 is carried into the reaction chamber, and then, gate insulating films and a microcrystalline semiconductor film are deposited over the gate electrode 51. In this case, by making the inside of the reaction chamber vacuum and by generating plasma, the impurity element which serves as a donor is released from the protective film formed on the inner wall of the reaction chamber to the inside of the reaction chamber. The gate insulating films and the microcrystalline semiconductor film are formed while taking in the impurity element which serves as a donor and is released from the protective film, so that gate insulating films each including the impurity element which serves as a donor and a microcrystalline semiconductor film including the impurity element which serves as a donor can be formed over the gate electrode 51.

Figure 16:
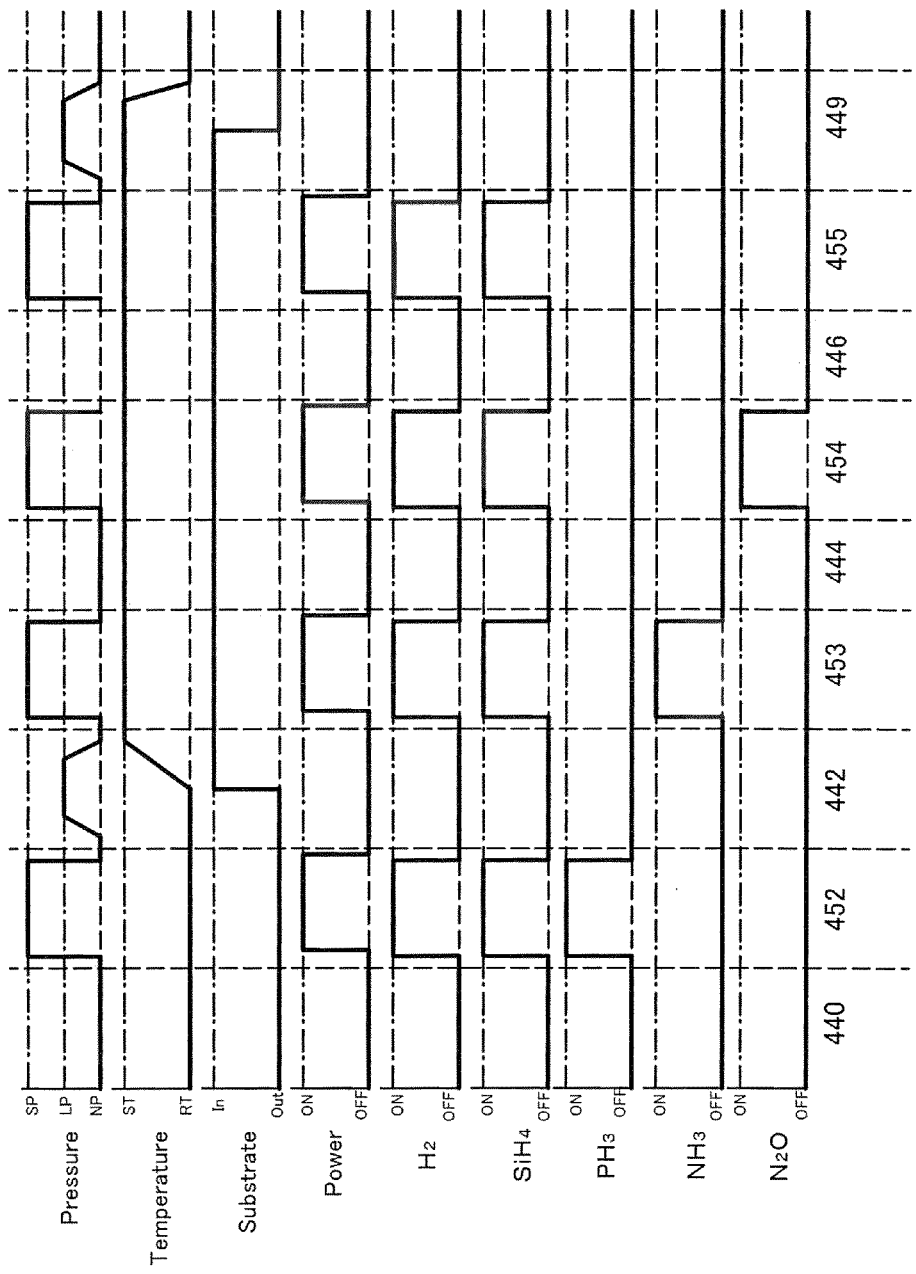
FIG. 16 is an example of a timing chart illustrating a process for forming gate insulating films and a microcrystalline semiconductor film.

As a typical example of a method for forming gate insulating films and a microcrystalline semiconductor film each including an impurity element which serves as a donor, a process for forming a silicon nitride film including phosphorus, a silicon oxynitride film including phosphorus, and a microcrystalline silicon film including phosphorus is described in chronological order with reference to FIG. 16.

FIG. 16 is a typical example of a timing chart for describing steps of forming gate insulating films 59a and 59b and a microcrystalline semiconductor film 67 each including an impurity element which serves as a donor. FIG. 16 shows a procedure starting from a step of vacuum evacuation 440 from atmospheric pressure in a reaction chamber. Then, the following treatments, which are carried out after the vacuum evacuation 440, are shown in chronological order: a precoating treatment 452, substrate carrying-in 442, a film formation treatment (1) 453 for forming the gate insulating film 59a including the impurity element which serves as a donor, a vacuum evacuation treatment 444, a film formation treatment (2) 454 for forming the gate insulating film 59b including the impurity element which serves as a donor, a vacuum evacuation treatment 446, a film formation treatment (3) 455 for forming the microcrystalline semiconductor film 67 including the impurity element which serves as a donor, and substrate carrying-out 449.

In the precoating treatment 452, the inner wall of the reaction chamber of the plasma CVD apparatus is precoated with, as a protective film, a film having composition that is the same as or similar to the gate insulating film including the impurity element which serves as a donor. In this embodiment mode, 0.001% to 1% phosphine (diluted with hydrogen), deposition gas including silicon or germanium, which is silane in this example, hydrogen, and at least one of ammonia, dinitrogen monoxide, and nitrogen are introduced to the reaction chamber. Then, by glow discharge plasma, a silicon oxynitride film including phosphorus, a silicon oxide film including phosphorus, a silicon nitride film including phosphorus, or a silicon nitride oxide film including phosphorus is formed. Accordingly, it is possible to prevent a metal used to form the reaction chamber from entering the gate insulating films as an impurity and to add the impurity element which serves as a donor to the gate insulating films and the microcrystalline semiconductor film, which are formed later.

In the substrate carrying-in 442, the substrate is carried into the reaction chamber from a load lock chamber connected to the reaction chamber. Before and after the substrate carrying-in, the pressure in the reaction chamber is reduced for performing vacuum evacuation. At that time, the impurity element which serves as a donor is released from the precoating protective film formed on the inner wall of the reaction chamber into the inside of the reaction chamber.

In the film formation treatment (1) 453 for forming the gate insulating film 59a including the impurity element which serves as a donor, source gases, which are hydrogen, silane, and ammonia in this example, are introduced and mixed. Then, a silicon nitride film is deposited by glow discharge plasma which is generated by application of high-frequency power, while taking in the impurity element which serves as a donor and is released into the inside of the reaction chamber, which is phosphorus in this example. When glow discharge plasma spreads to the inner wall of the reaction chamber, the impurity element which serves as a donor, which is phosphorus in this example, is released from the precoating protective film formed on the inner wall of the reaction chamber, in addition to the above source gases. Accordingly, a silicon nitride film including phosphorus can be formed. Nitrogen may also be introduced to the reaction chamber in addition to the above source gases. After the gate insulating film 59a including the impurity element which serves as a donor is formed, introduction of the above source gas is halted, and the power is turned off, and then, generation of plasma is halted.

In the vacuum evacuation treatment 444, vacuum evacuation is performed in the reaction chamber to a predetermined degree of vacuum.

In the film formation treatment (2) 454 for forming the gate insulating film 59b including the impurity element which serves as a donor, source gases, which are hydrogen, silane, and dinitrogen monoxide in this example, are introduced and mixed. Then, a silicon oxynitride film is deposited by glow discharge plasma which is generated by application of high-frequency power, while taking in the impurity element which serves as a donor and is released into the inside of the reaction chamber, which is phosphorus in this example. After the gate insulating film 59b including the impurity element which serves as a donor is formed, introduction of the above source gases is halted, and the power is turned off, and then, generation of plasma is halted.

In the vacuum evacuation treatment 446, vacuum evacuation is performed in the reaction chamber to a predetermined degree of vacuum.

In the film formation treatment (3) 455 for forming the microcrystalline semiconductor film 67 including the impurity element which serves as a donor, deposition gas including silicon or germanium, which is silane in this example, hydrogen, and/or rare gas are introduced and mixed in the reaction chamber, and a microcrystalline semiconductor film is formed by glow discharge plasma which is generated by application of high-frequency power. Silane is diluted with hydrogen and/or rare gas to be 10 to 2000 times thinner. Therefore, a large amount of hydrogen and/or rare gas is needed. The substrate heating temperature is from 100 to 300° C., preferably from 120 to 220° C. At this time, the microcrystalline semiconductor film is deposited while taking in the impurity element which serves as a donor and is released into the inside of the reaction chamber, and thus, a microcrystalline semiconductor film including phosphorus is formed. Therefore, an amorphous semiconductor is not formed in an early stage of deposition of the semiconductor film, and crystals grow in a direction of the normal to the gate insulating film 59b, and a microcrystalline semiconductor film with high crystallinity in which column-like microcrystalline semiconductors are present can be formed. Further, a highly conductive microcrystalline semiconductor film including the impurity element which serves as a donor can be formed.

This mode has a feature that the gate insulating films 59a and 59b and the microcrystalline semiconductor film 67 each including the impurity element which serves as a donor are formed. It is preferable that a peak concentration of the impurity element which serves as a donor be from $6 \times 10^{15}$ to $3 \times 10^{18}$ atoms/cm$^3$ inclusive, more preferably $3 \times 10^{16}$ to $3 \times 10^{17}$ atoms/cm$^3$ inclusive.

In the substrate carrying-out 449, the substrate is carried out of the reaction chamber and carried into a load lock chamber connected to the reaction chamber. The pressure in the reaction chamber at this time is the same as that in the load lock chamber.

Figure 17A:
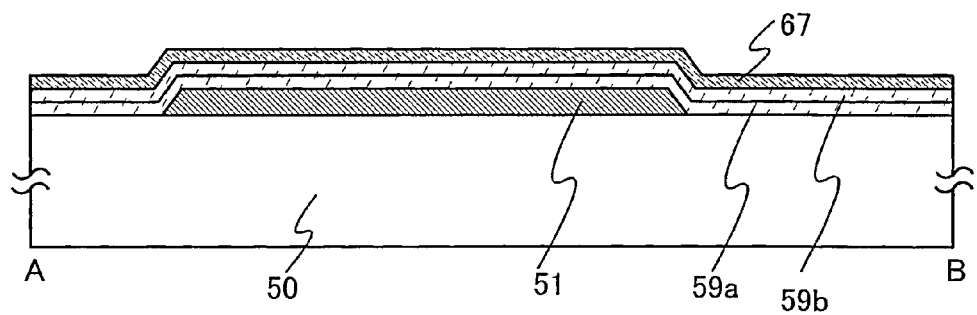
FIGS. 17A and 17B are cross-sectional views illustrating a method for manufacturing a display device of the present invention.
Figure 17B:
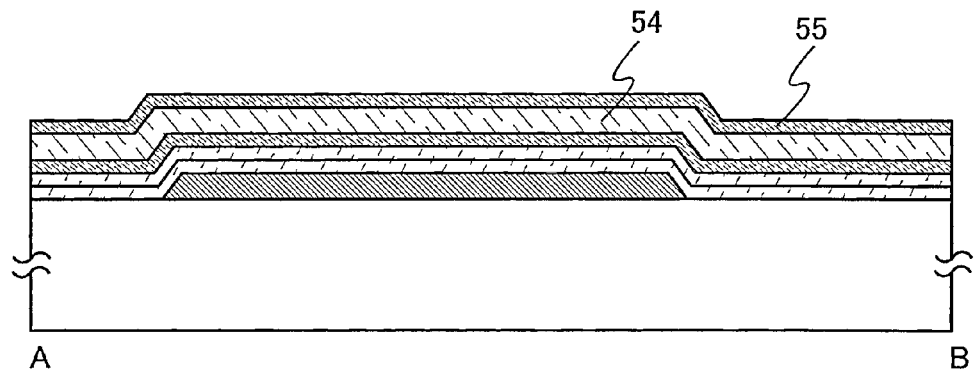

Next, as shown in FIG. 17B, a buffer layer 54 and a semiconductor film 55 to which an impurity element imparting one conductivity type is added are formed over the microcrystalline semiconductor film 67 including the impurity element which serves as a donor. Then, through the steps shown in FIGS. 9B and 9C and FIGS. 10A to 10C, the thin film transistor as shown in FIG. 3A can be manufactured. In addition, through the steps shown in FIGS. 11A and 11B, an element substrate which can be used for a display device can be formed.

Figure 19:
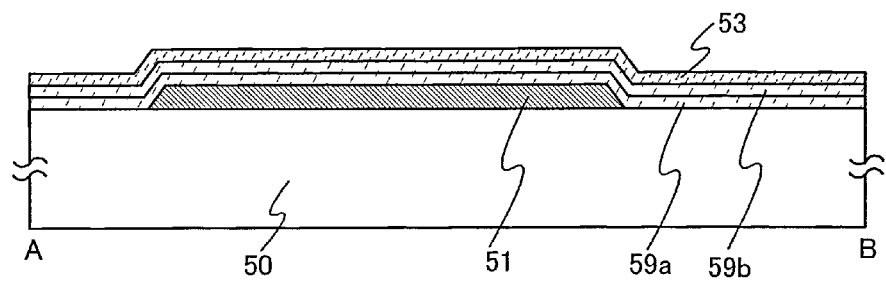
FIG. 19 is a cross-sectional view illustrating a method for manufacturing a display device of the present invention.

When a microcrystalline semiconductor film 53 which does not include the impurity element which serves as a donor at a higher concentration than the detection limit of SIMS is formed instead of the microcrystalline semiconductor film 67 including the impurity element which serves as a donor as shown in FIG. 19, the thin film transistor as shown in FIG. 4C can be manufactured. In order to form the microcrystalline semiconductor film 53, the following process is carried out. When the gate insulating film 59b including the impurity element which serves as a donor begins to be deposited, gas including the impurity element which serves as a donor, which is phosphine in this example, is introduced to a reaction chamber, and then, introduction of phosphine is stopped, and a silicon oxynitride film is formed, so that almost all phosphorus in the reaction chamber is included in the silicon oxynitride film. Therefore, the microcrystalline semiconductor film 53, which is formed later, does not include the impurity element which serves as a donor at a higher concentration than the detection limit of SIMS. Alternatively, the microcrystalline semiconductor film 53, which does not include the impurity element which serves as a donor at a higher concentration than the detection limit of SIMS, can be formed in such a manner that after the gate insulating film 59b including the impurity element which serves as a donor is formed, the substrate is carried out of the reaction chamber, and the inside of the reaction chamber is cleaned, and then, the substrate is carried into the reaction chamber again and the microcrystalline semiconductor film 53 is formed. Further alternatively, the microcrystalline semiconductor film 53, which does not include the impurity element which serves as a donor at a higher concentration than the detection limit of SIMS, can be formed in such a manner that after the gate insulating film 59b including the impurity element which serves as a donor is formed, the substrate is carried out of the reaction chamber, and the microcrystalline semiconductor film 53 is formed in a different reaction chamber.

Next, another method for manufacturing the thin film transistor shown in FIG. 3A is described below.

Figure 18:
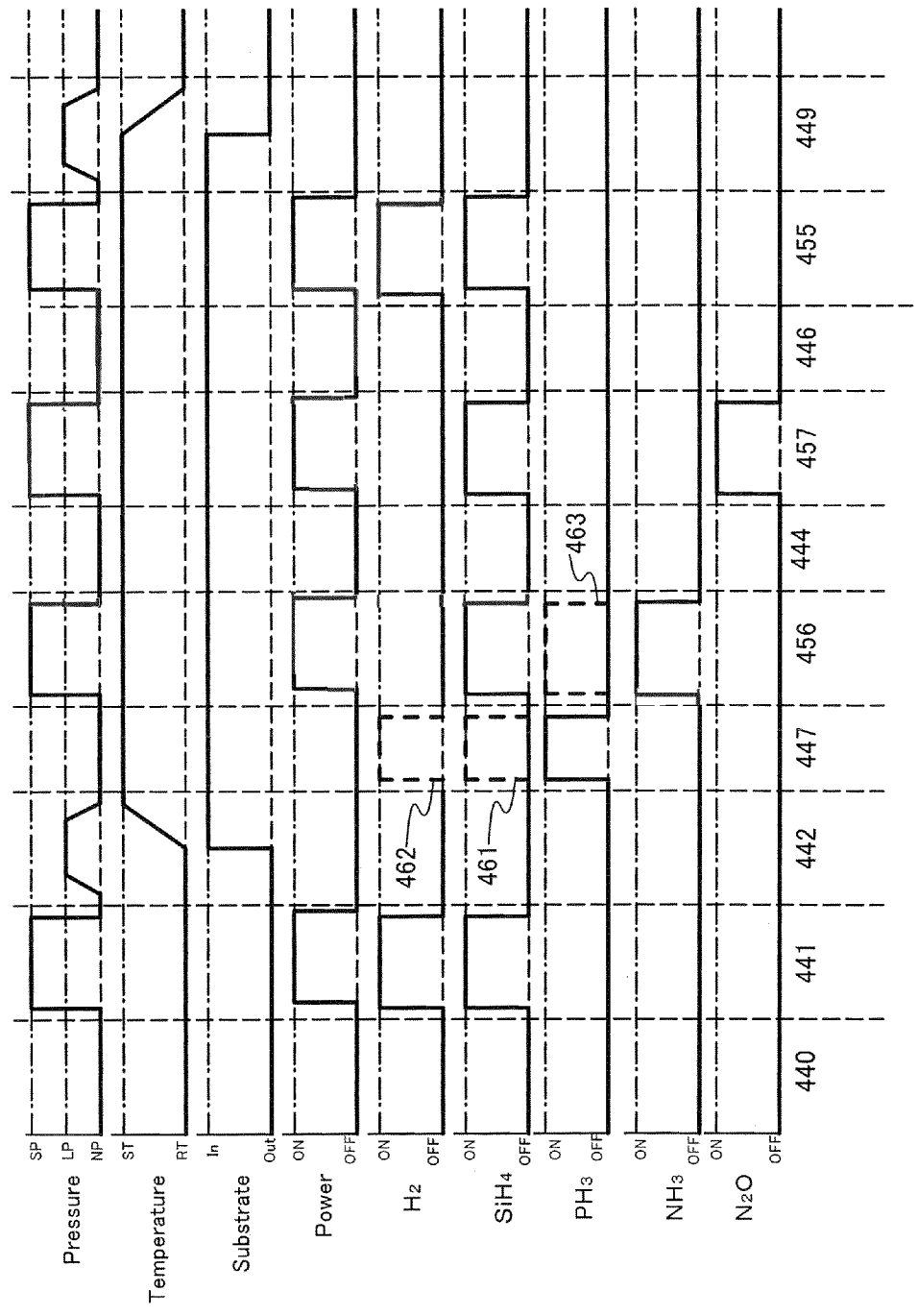
FIG. 18 is an example of a timing chart illustrating a process for forming gate insulating films and a microcrystalline semiconductor film.

FIG. 18 is a typical example of a timing chart for describing steps of forming the gate insulating films 59a and 59b each including the impurity element which serves as a donor and the microcrystalline semiconductor film 67 including the impurity element which serves as a donor as shown in FIG. 17A. FIG. 18 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a flush treatment 447, a film formation treatment (1) 456 for forming the gate insulating film 59a including the impurity element which serves as a donor, a vacuum evacuation treatment 444, a film formation treatment (2) 457 for forming the gate insulating film 59b including the impurity element which serves as a donor, a vacuum evacuation treatment 446, a film formation treatment (3) 455 for forming the microcrystalline semiconductor film 67 including the impurity element which serves as a donor, and substrate carrying-out 449.

The precoating treatment 441, the substrate carrying-in 442, and the substrate carrying-out 449 are the same as in FIG. 13, and the flush treatment 447, the film formation treatment (1) 456 for forming the gate insulating film 59a including the impurity element which serves as a donor, the vacuum evacuation treatment 444, the film formation treatment (2) 457 for forming the gate insulating film 59b including the impurity element which serves as a donor, the vacuum evacuation treatment 446, and the film formation treatment (3) 455 for forming the microcrystalline semiconductor film 67 including the impurity element which serves as a donor are carried out between the substrate carrying-in 442 and the substrate carrying-out 449.

In the flush treatment 447, gas including an impurity element which serves as a donor is introduced to a reaction chamber, and the impurity element which serves as a donor is adsorbed onto the substrate 50, the surface of the gate electrode 51, and furthermore, onto the inner wall of the reaction chamber. In this embodiment mode, 0.001% to 1% phosphine (diluted with hydrogen) is introduced to the reaction chamber. In addition to the gas including the impurity element which serves as a donor, hydrogen may be introduced as designated by a dashed line 462, or deposition gas including silicon or germanium may be introduced as designated by a dashed line 461, to the reaction chamber. By introducing the deposition gas including silicon or germanium to the reaction chamber, an impurity such as oxygen, nitrogen, or fluorine in the reaction chamber can be discharged from the reaction chamber, which can prevent a film to be formed from being contaminated.

In the film formation treatment (1) 456 for forming the gate insulating film 59a including the impurity element which serves as a donor, source gases, which are hydrogen, silane, and ammonia in this example, are introduced and mixed, and a silicon nitride film is formed by glow discharge plasma which is generated by application of high-frequency power. Nitrogen may be introduced to the reaction chamber in addition to the above source gases. At this time, the silicon nitride film is deposited while taking in the impurity element which serves as a donor and is adsorbed onto the substrate 50, the gate electrode 51, and furthermore, the surface of the inner wall of the reaction chamber, which is phosphorus in this example. Thus, a silicon nitride film including phosphorus can be formed. After the gate insulating film 59a including the impurity element which serves as a donor is formed, introduction of the above source gases is halted, and the power is turned off, and then, generation of plasma is halted.

In the vacuum evacuation treatment 444, vacuum evacuation is performed in the reaction chamber to a predetermined degree of vacuum.

In the film formation treatment (2) 457 for forming the gate insulating film 59b including the impurity element which serves as a donor, source gases, which are hydrogen, silane, and dinitrogen monoxide in this example, are introduced and mixed, and a silicon oxynitride film is formed by glow discharge plasma which is generated by application of high-frequency power. At this time, the silicon oxynitride film is deposited while taking in the impurity element which serves as a donor and is deposited over the surface of the gate insulating film 59a including the impurity element which serves as a donor, and the impurity element which serves as a donor and is adsorbed onto the surface of the inner wall of the reaction chamber, which is phosphorus in this example. Thus, a silicon oxynitride film including phosphorus can be formed as the gate insulating film 59*b* including the impurity element which serves as a donor. After the gate insulating film 59*b* including the impurity element which serves as a donor is formed, introduction of the above source gases is halted, and the power is turned off, and then, generation of plasma is halted.

In the vacuum evacuation treatment 446, vacuum evacuation is performed in the reaction chamber to a predetermined degree of vacuum.

In the film formation treatment (3) 455 for forming the microcrystalline semiconductor film 67 including the impurity element which serves as a donor, deposition gas including silicon or germanium, which is silane in this example, hydrogen, and/or rare gas are introduced and mixed in the reaction chamber, and a microcrystalline semiconductor film is formed by glow discharge plasma which is generated by application of high-frequency power. Silane is diluted with hydrogen and/or rare gas to be 10 to 2000 times thinner. Therefore, a large amount of hydrogen and/or rare gas is needed. The substrate heating temperature is from 100 to 300° C., preferably from 120 to 220° C. It is preferable that the film be formed at temperatures of from 120 to 220° C. so that a growing surface of the microcrystalline silicon film is inactivated with hydrogen to promote growth of microcrystalline silicon. At this time, the microcrystalline semiconductor film is deposited while taking in the impurity element which serves as a donor and is released into the inside of the reaction chamber, so that a microcrystalline semiconductor film including phosphorus is formed. Thus, an amorphous semiconductor is not formed in an early stage of deposition of the semiconductor film, and crystals grow in a direction of the normal to the gate insulating film 59*b* including the impurity element which serves as a donor, and a microcrystalline semiconductor film with high crystallinity in which column-like microcrystalline semiconductors are present can be formed. Further, since the microcrystalline semiconductor film includes the impurity element which serves as a donor and is deposited over the surface of the gate insulating film 59*b* including the impurity element which serves as a donor, a highly conductive microcrystalline semiconductor film including the impurity element which serves as a donor can be formed.

This mode has a feature that the gate insulating films 59*a* and 59*b* and the microcrystalline semiconductor film 67 each including the impurity element which serves as a donor are formed. It is preferable that a peak concentration of the impurity element which serves as a donor is from $6 \times 10^{15}$ to $3 \times 10^{18}$ atoms/cm$^3$ inclusive, more preferably from $3 \times 10^{16}$ to $3 \times 10^{17}$ atoms/cm$^3$ inclusive.

In the substrate carrying-out 449, the substrate is carried out of the reaction chamber and carried into a load lock chamber connected to the reaction chamber. The pressure in the reaction chamber at this time is the same as that in the load lock chamber.

Next, as shown in FIG. 17B, a buffer layer 54 and a semiconductor film 55 to which an impurity element imparting one conductivity type is added are formed over the microcrystalline semiconductor film 67 including the impurity element which serves as a donor. Then, through the steps shown in FIGS. 9B and 9C and FIGS. 10A to 10C, the thin film transistor as shown in FIG. 3A can be manufactured. In addition, through the steps shown in FIGS. 11A and 11B, an element substrate which can be used for a display device can be formed.

When a microcrystalline semiconductor film 53 which does not include the impurity element which serves as a donor at a higher concentration than the detection limit of SIMS is formed instead of the microcrystalline semiconductor film 67 including the impurity element which serves as a donor as shown in FIG. 19, the thin film transistor as shown in FIG. 4C can be manufactured. In order to form the microcrystalline semiconductor film 53, the following process is carried out. When the gate insulating film 59*b* including the impurity element which serves as a donor begins to be deposited, gas including the impurity element which serves as a donor, which is phosphine in this example, is introduced to the reaction chamber, and then, introduction of phosphine is halted, and a silicon oxynitride film is formed, so that almost all phosphorus in the reaction chamber is included in the silicon oxynitride film. Therefore, the microcrystalline semiconductor film 53, which is formed later, does not include the impurity element which serves as a donor at a higher concentration than the detection limit of SIMS. Alternatively, the microcrystalline semiconductor film 53, which does not include the impurity element which serves as a donor at a higher concentration than the detection limit of SIMS, can be formed in such a manner that after the gate insulating film 59*b* including the impurity element which serves as a donor is formed, the substrate is carried out of the reaction chamber, and the inside of the reaction chamber is cleaned, and then, the substrate is carried into the reaction chamber again and the microcrystalline semiconductor film 53 is formed. Further alternatively, the microcrystalline semiconductor film 53, which does not include the impurity element which serves as a donor at a higher concentration than the detection limit of SIMS, can be formed in such a manner that after the gate insulating film 59*b* including the impurity element which serves as a donor is formed, the substrate is taken out of the reaction chamber, and the microcrystalline semiconductor film 53 is formed in a different reaction chamber.

Next, a method for manufacturing the thin film transistor shown in FIG. 7A is described below.

Figure 20:
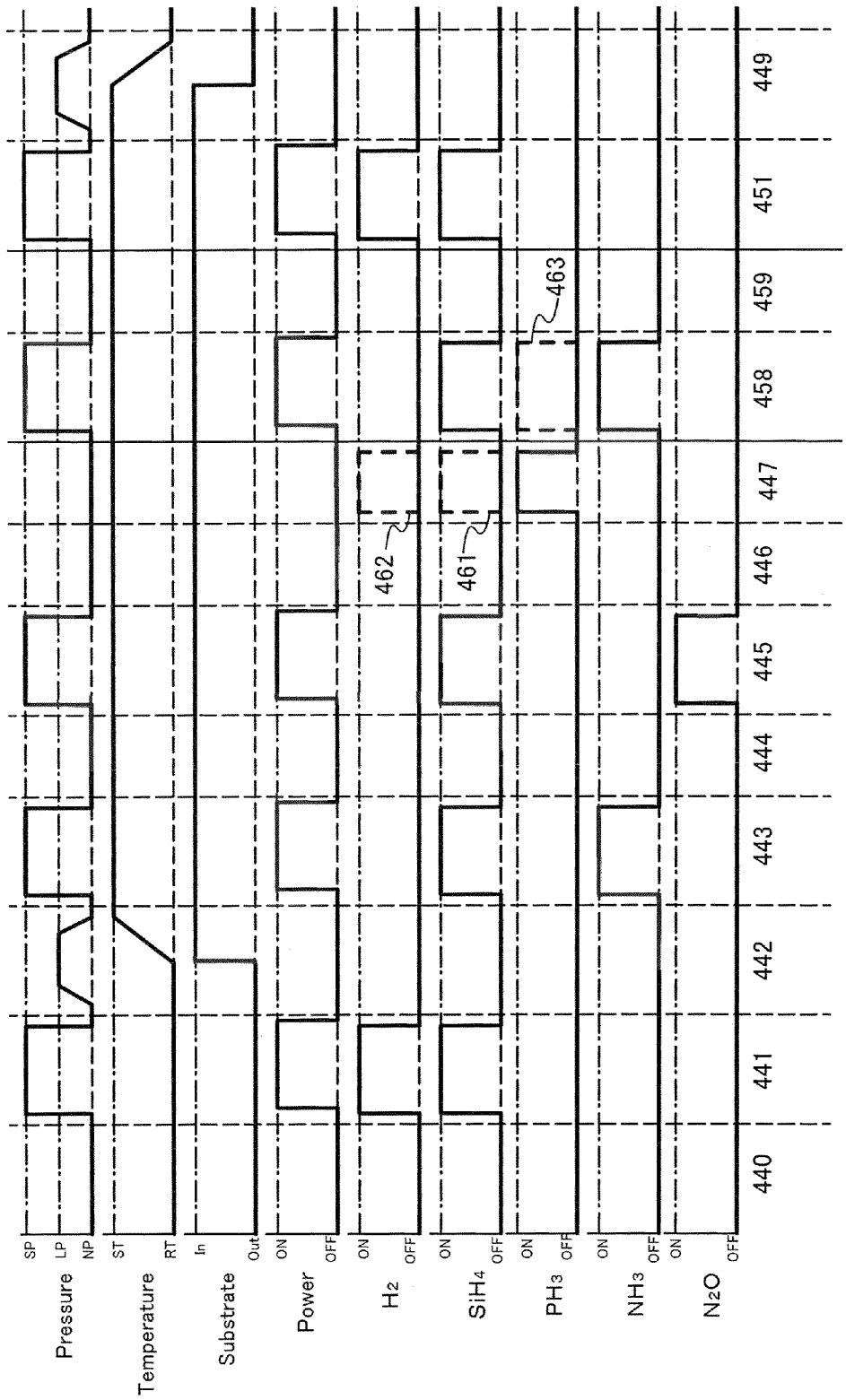
FIG. 20 is an example of a timing chart illustrating a process for forming gate insulating films and a microcrystalline semiconductor film.

As a typical example of a method for forming the gate insulating film 59*c* including the impurity element which serves as a donor, a process for forming a silicon nitride film including phosphorus is described in chronological order with reference to FIG. 20.

Figure 21:
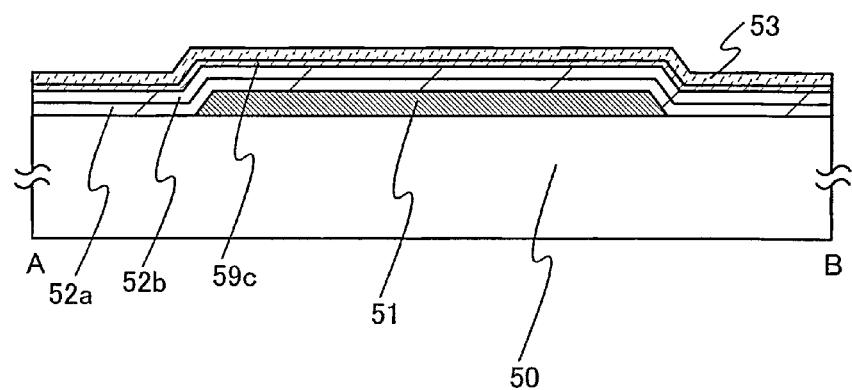
FIG. 21 is a cross-sectional view illustrating a method for manufacturing a display device of the present invention.

FIG. 20 is a typical example of a timing chart for describing steps of forming the gate insulating films 52*a* and 52*b*, the gate insulating film 59*c* including the impurity element which serves as a donor, and a microcrystalline semiconductor film 53 over a gate electrode 51 and a substrate 50 as shown in FIG. 21. FIG. 20 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a film formation treatment (1) 443 for forming the gate insulating film 52*a*, a vacuum evacuation treatment 444, a film formation treatment (2) 445 for forming the gate insulating film 52*b*, a vacuum evacuation treatment 446, a flush treatment 447, a film formation treatment (4) 458 for forming the gate insulating film 59*c* including the impurity element which serves as a donor, a vacuum evacuation treatment 459, a film formation treatment (3) 451 for forming the microcrystalline semiconductor film 53, and substrate carrying-out 449.

The precoating treatment 441, the substrate carrying-in 442, the film formation treatment (1) 443 for forming the gate insulating film 52*a*, the vacuum evacuation treatment 444, the film formation treatment (2) 445 for forming the gate insulating film 52*b*, the vacuum evacuation treatment 446, and the substrate carrying-out 449 are the same as in FIG. 8; the film formation treatment (3) 451 for forming the microcrystalline semiconductor film 53 is the same as in FIG. 13; and the flush treatment 447, the film formation treatment (4) 458 for forming the gate insulating film 59c including the impurity element which serves as a donor, and the vacuum evacuation treatment 459 are carried out between the vacuum evaporation treatment 446 and the film formation treatment (3) 451.

In the flush treatment 447, gas including an impurity element which serves as a donor is introduced to the reaction chamber, and the impurity element which serves as a donor is adsorbed onto the surface of the gate insulating film 52b, furthermore, onto the inner wall of the reaction chamber. In this embodiment mode, 0.001% to 1% phosphine (diluted with hydrogen) is introduced to the reaction chamber. In addition to the gas including the impurity element which serves as a donor, hydrogen may be introduced as designated by a dashed line 462, or deposition gas including silicon or germanium may be introduced as designated by a dashed line 461, to the reaction chamber.

In the film formation treatment (4) 458 for forming the gate insulating film 59c including the impurity element which serves as a donor, source gases of the gate insulating film, which are hydrogen, silane, and ammonia in this example, are introduced and mixed, and a silicon nitride film is formed by glow discharge plasma which is generated by application of high-frequency power. At this time, the silicon nitride film is deposited while taking in the impurity element which serves as a donor and is deposited over the surface of the gate insulating film 59b, and the impurity element which serves as a donor and is adsorbed onto the surface of the inner wall of the reaction chamber, which is phosphorus here. Thus, a silicon nitride film including phosphorus can be formed. After the gate insulating film 59c including the impurity element which serves as a donor is formed, introduction of the above source gases is halted, and the power is turned off, and then, generation of plasma is halted.

In the vacuum evacuation treatment 459, vacuum evacuation is performed in the reaction chamber to a predetermined degree of vacuum.

After that, the microcrystalline semiconductor film 53 is formed over the gate insulating film 59c including the impurity element which serves as donor.

In the film formation treatment (3) 451 for forming the microcrystalline semiconductor film 53, in order to form a microcrystalline semiconductor film which does not include the impurity element which serves as a donor at a higher concentration than the detection limit of SIMS, the amount of gas including the impurity element which serves as a donor, which is phosphine in this example, to be introduced to the reaction chamber is controlled in the flush treatment 447, so that the microcrystalline semiconductor film 53, which is formed later, does not include the impurity element which serves as a donor at a higher concentration than the detection limit of SIMS. Alternatively, after the gate insulating film 59c including the impurity element which serves as a donor is formed, the substrate is carried out of the reaction chamber, and the inside of the reaction chamber is cleaned, and then, the substrate is carried into the reaction chamber again, and the microcrystalline semiconductor film 53 is formed, whereby the microcrystalline semiconductor film 53, which does not include the impurity element which serves as a donor at a higher concentration than the detection limit of SIMS, can be formed. Further alternatively, after the gate insulating film 59c including the impurity element which serves as a donor is formed, the substrate is carried out of the reaction chamber, and the microcrystalline semiconductor film 53 is formed in a different reaction chamber, whereby the microcrystalline semiconductor film 53, which does not include the impurity element which serves as a donor at a higher concentration than the detection limit of SIMS, can be formed.

In a method for forming the gate insulating film 59c including the impurity element which serves as a donor, after the flush treatment 447, the gate insulating film 52b may be nitrided with high-density plasma, whereby a silicon nitride layer including the impurity element which serves as a donor can be formed on the surface of the gate insulating film 52b. The high-density plasma is generated by use of high-frequency microwaves, for example, microwaves with a frequency of 2.45 GHz. With high-density plasma, which has the characteristic of having a low electron temperature, a layer can be formed with less plasma damage and fewer defects compared to a layer formed by conventional plasma treatment because the kinetic energy of an active species is low. In addition, with use of high-density plasma, carrier mobility can be increased because the level of roughness on the surface of the gate insulating film 52b can be reduced.

Further, the gate insulating film 59c including the impurity element which serves as a donor can also be formed using gas including the impurity element which serves as a donor as designated by a dashed line 463 shown in FIG. 20 in addition to the source gas for forming the gate insulating film, without performing the flush treatment 447 shown in FIG. 20.

After that, by performing the same process as the process for manufacturing the thin film transistor in Embodiment Mode 1, the thin film transistor as shown in FIG. 7C can be manufactured.

In the process of this embodiment mode, glow discharge plasma is generated by applying high-frequency power with a frequency of from 1 to 20 MHz, typically 13.56 MHz; or high-frequency power with a frequency in the VHF band of 20 to 120 MHz approximately.

In the film formation treatment of the microcrystalline semiconductor film, helium may be added as rare gas to reaction gas, in addition to silane and hydrogen. Helium has an ionization energy of 24.5 eV, which is the highest among all the gases, and a metastable state thereof lies in a level of 20 eV approximately, which is a little lower than the above ionization energy; thus, to be ionized, helium requires as low as 4 eV, which is the difference between the ionization energy and the metastable energy, while keeping electric discharge. Therefore, helium starts to discharge electricity at the lowest voltage among all the gases. Because of the above property, helium can stably retain plasma. Further, uniform plasma can be formed with helium, and thus a plasma density can be uniform even when a microcrystalline silicon film is deposited over a large substrate.

In the thin film transistor manufactured in this embodiment mode, the gate insulating film and/or the microcrystalline semiconductor film includes the impurity element which serves as a donor. Thus, crystallinity of the microcrystalline semiconductor film at the interface with the gate insulating film is high and crystallinity of the microcrystalline semiconductor film can be improved. Accordingly, a thin film transistor including the microcrystalline semiconductor film has higher field effect mobility and higher on-current than a thin film transistor including an amorphous semiconductor film or a conventional microcrystalline semiconductor film. Thus, with the use of a thin film transistor in which a channel formation region is formed of the microcrystalline semiconductor film for switching a display element, the area of the channel formation region, that is, the area of the thin film transistor can be decreased. Accordingly, the area of the thin film transistor in each pixel is reduced, whereby the aperture ratio of the pixel can be increased. Accordingly, the display device can have high definition.

Since the channel formation region of the thin film transistor manufactured in this embodiment mode is formed using a microcrystalline semiconductor film, resistivity thereof is lower than that of a channel formation region formed using an amorphous semiconductor film. Therefore, a thin film transistor including the microcrystalline semiconductor film 53 has such current-voltage characteristics that a curve showing the current-voltage characteristics has a rising portion with a steep slope, and is excellent in response speed as a switching element; and thus can operate at high speed. With the use of the microcrystalline semiconductor film in a channel formation region of a thin film transistor, variation in a threshold voltage of a thin film transistor can be suppressed. Therefore, a display device with less variation of electric characteristics can be manufactured.

Further, in the thin film transistor manufactured in this embodiment mode, an amorphous semiconductor film with high resistivity is formed as the buffer layer between the microcrystalline semiconductor film which serves as a channel formation region and the semiconductor film to which the impurity element imparting one conductivity type is added and which functions as source and drain regions. Although off-current flows through the buffer layer, off-current can be suppressed because the buffer layer is a high-resistance region.

Next, as an example of a plasma CVD apparatus with which the above reaction chamber is provided, an example of a structure which is suitable for deposition of a gate insulating film and a microcrystalline semiconductor film is described.

Figure 22:
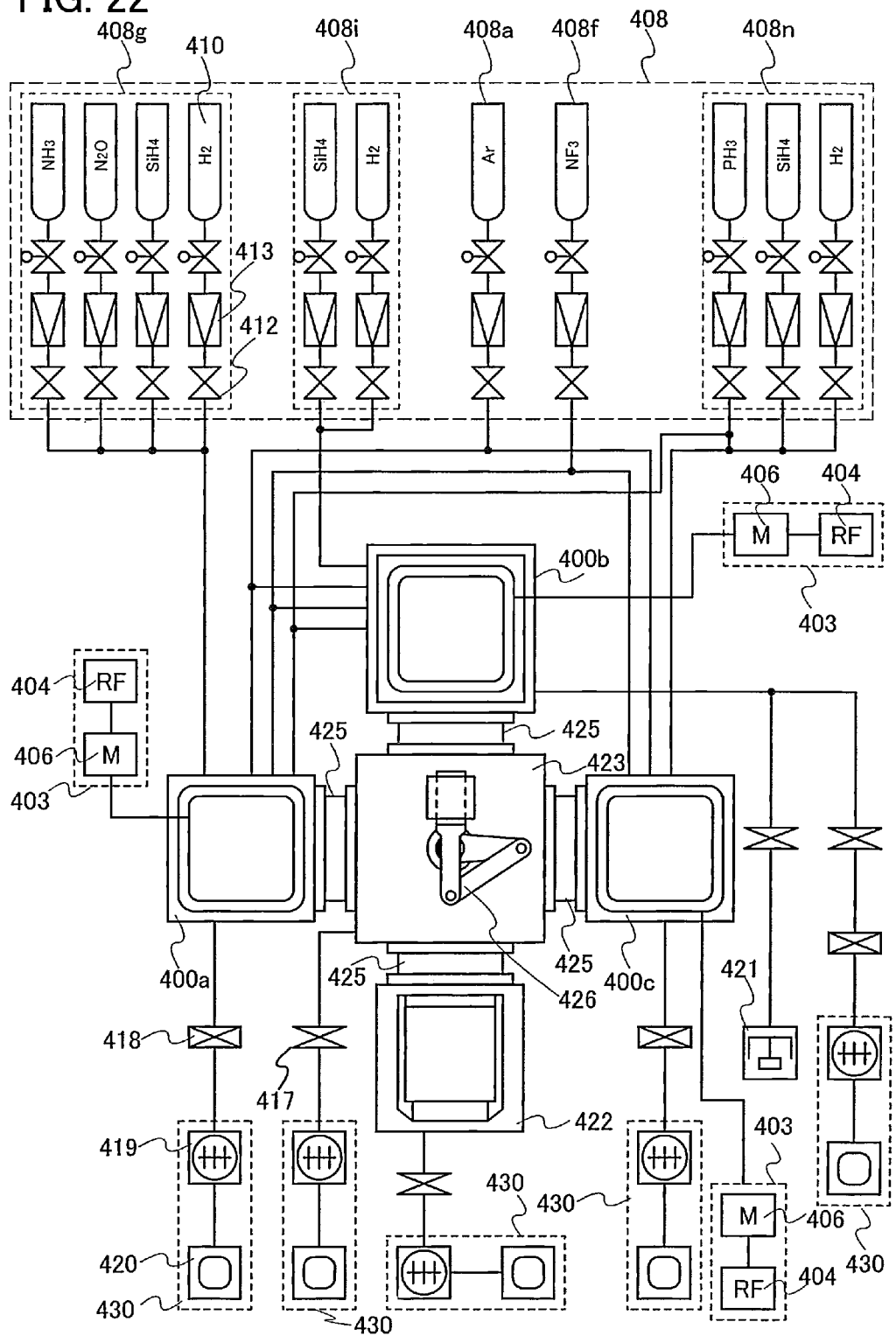
FIG. 22 is a drawing showing a structure of a plasma CVD apparatus applicable to the present invention.

FIG. 22 shows an example of a multi-chamber plasma CVD apparatus including a plurality of reaction chambers. The apparatus is provided with a common chamber 423, a load/unload chamber 422, a first reaction chamber 400a, a second reaction chamber 400b, and a third reaction chamber 400c. This apparatus is a single-wafer processing type in which a substrate set in a cassette in the load/unload chamber 422 is transferred to/from each reaction chamber by a transfer unit 426 provided for the common chamber 423. A gate valve 425 is provided between the common chamber 423 and each chamber such that treatments performed in different reaction chambers do not interfere each other.

Each reaction chamber is used for a different purpose, depending on the kind of a thin film to be formed. For example, an insulating film such as a gate insulating film is formed in the first reaction chamber 400a; a microcrystalline semiconductor film which forms a channel and a buffer layer are formed in the second reaction chamber 400b; and a semiconductor film to which an impurity element imparting one conductivity type is added and which forms a source and a drain is formed in the third reaction chamber 400c. It is needless to say that the number of the reaction chambers is not limited to three, and can be increased or decreased as needed. One film may be formed in one reaction chamber, or a plurality of films may be formed in one reaction chamber.

A turbo-molecular pump 419 and a dry pump 420 are connected to each reaction chamber as an exhaust unit. The exhaust unit is not limited to a combination of these vacuum pumps and can employ other vacuum pumps as long as they can evacuate the reaction chamber to a degree of vacuum of approximately 10 to $10^{-1}$ Pa. A butterfly valve 417 is provided between the exhaust unit 430 and each reaction chamber, which can interrupt vacuum evacuation, and a conductance valve 418 can control exhaust velocity to adjust the pressure in each reaction chamber.

The second reaction chamber 400b in which a microcrystalline semiconductor film is formed may be connected to a cryopump 421 which performs vacuum evacuation to an ultrahigh vacuum. By use of the cryopump 421, the reaction chamber can be evacuated to an ultrahigh vacuum of a pressure of lower than $10^{-5}$ Pa. In this embodiment mode, the inside of the reaction chamber is set to be an ultrahigh vacuum with a pressure of lower than $10^{-5}$ Pa, which is effective in reducing the oxygen concentration in the microcrystalline semiconductor film. Consequently, the oxygen concentration in the microcrystalline semiconductor film 53 can be set to be less than or equal to $1 \times 10^{16}$ atoms/cm$^3$. With the reduced oxygen concentration in the microcrystalline semiconductor film, defects in the film can be reduced, whereby crystallinity can be improved and thus carrier mobility can be improved.

A gas supply unit 408 includes a cylinder 410 filled with gas used for the process, such as rare gas or semiconductor source gas typified by silane, a stop valve 412, a mass flow controller 413, and the like. A gas supply unit 408g is connected to the first reaction chamber 400a and supplies gas for forming a gate insulating film. A gas supply unit 408i is connected to the second reaction chamber 400b and supplies gas for forming a microcrystalline semiconductor film and a buffer layer. A gas supply unit 408n is connected to the third reaction chamber 400c and supplies gas for forming an n-type semiconductor film, for example. In addition, phosphine, which is one of gases including an impurity element which serves as a donor, is supplied to the first reaction chamber 400a and the second reaction chamber 400b. A gas supply unit 408a supplies argon, and a gas supply unit 408f supplies etching gas used for cleaning the inside of the reaction chambers. Thus, the gas supply units 408a and 408f are provided in common for each reaction chamber.

A high-frequency power supply unit 403 for generating plasma is connected to each reaction chamber. The high-frequency power supply unit 403 includes a high-frequency power source 404 and a matching box 406.

Figure 23:
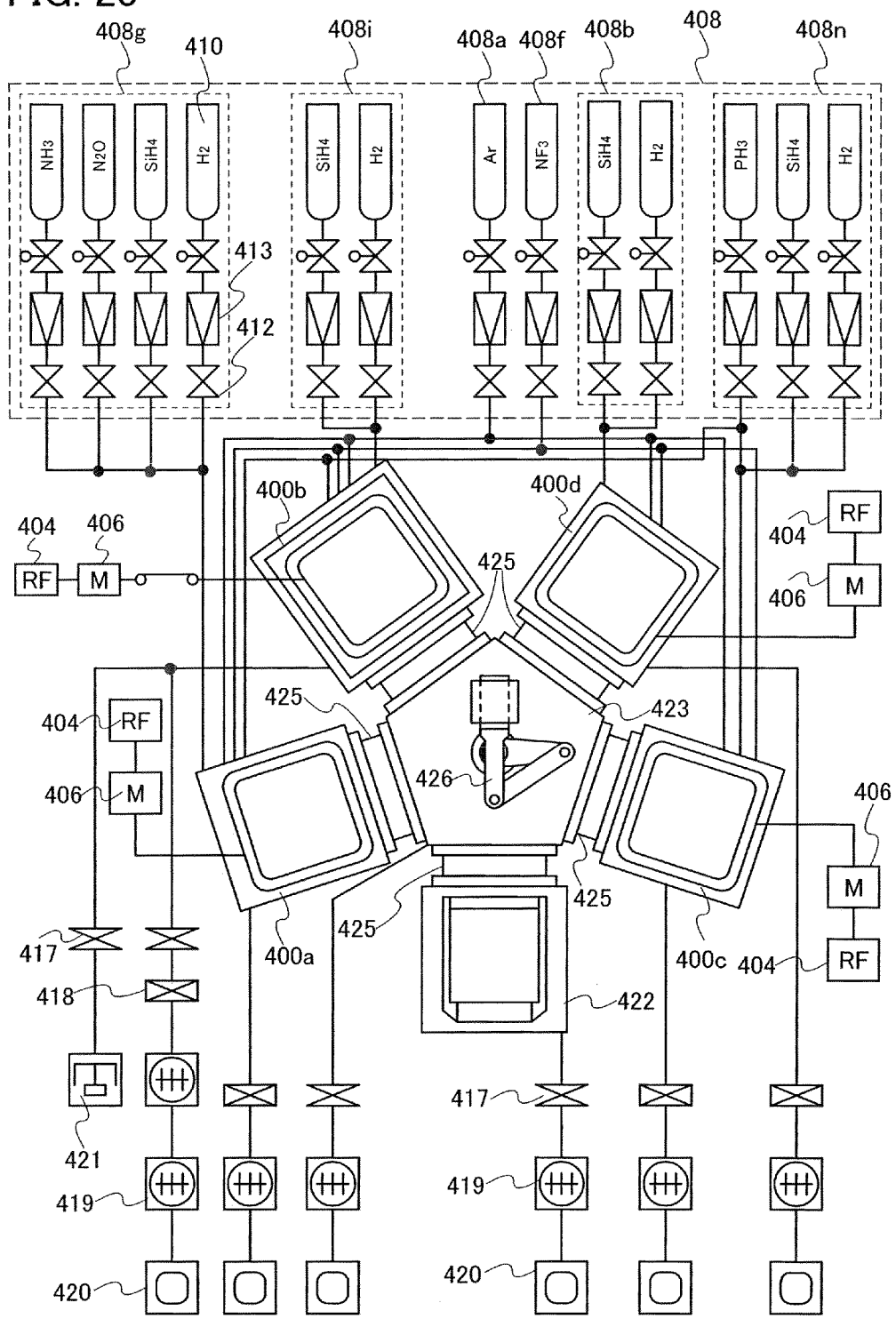
FIG. 23 is a drawing showing a structure of a plasma CVD apparatus applicable to the present invention.

FIG. 23 shows a structure in which a fourth reaction chamber 400d is added to the structure of the multi-chamber plasma CVD apparatus of FIG. 22. A gas supply unit 408b is connected to the fourth reaction chamber 400d. High-frequency power supply units and evacuation units have the same structure as those of FIG. 22. Each reaction chamber can be used for a different purpose, depending on the kind of a thin film to be formed. For example, an insulating film such as a gate insulating film can be formed in the first reaction chamber 400a; a semiconductor film and a microcrystalline semiconductor film for forming a channel formation region can be formed in the second reaction chamber 400b; a buffer layer that protects the microcrystalline semiconductor film for forming a channel formation region can be formed in the fourth reaction chamber 400d; and a semiconductor film to which an impurity element imparting one conductivity type is added and which forms a source and a drain can be formed in the third reaction chamber 400c. Since each thin film has an optimum temperature for being formed, each thin film is formed in a different reaction chamber, whereby film formation temperatures can be easily controlled. Further, the same kind of films can be formed repeatedly, so that an influence of residual impurities due to a film which has been formed can be eliminated.

A microcrystalline semiconductor film, a buffer layer, and a semiconductor film to which an impurity element imparting one conductivity type is added may be formed successively in one reaction chamber. Specifically, a substrate provided with a gate insulating film is carried into a reaction chamber, and a microcrystalline semiconductor film, a buffer layer, and a semiconductor film to which an impurity element imparting one conductivity type is added are formed therein successively. Then, after the substrate is carried out of the reaction chamber, the inside of the reaction chamber is cleaned with fluorine radicals. However, even when the inside of the reaction chamber is cleaned, an impurity element which serves as a donor remains in the reaction chamber in some cases. When a substrate provided with a gate insulating film is carried into such a reaction chamber and a microcrystalline semiconductor film is formed, the microcrystalline semiconductor film includes the impurity element which serves as a donor. Accordingly, a microcrystalline semiconductor film which has high crystallinity at the interface with a gate insulating film and includes an impurity element which serves as a donor can be formed.

Next, a method for manufacturing a thin film transistor which is different from that in the above mode is described with reference to FIGS. 24A and 24B, FIGS. 25A to 25D, FIGS. 26A to 26C, FIGS. 27A and 27B, FIGS. 28A and 28B, FIGS. 29A to 29C, and FIGS. 30A to 30C. Here, a process is shown through which the number of photomasks can be smaller than that used in the above modes and through which a thin film transistor can be manufactured. A manufacturing process of the thin film transistor shown in FIG. 1A is described here; however, the following mode can be applied to the manufacturing processes of the thin film transistors shown in FIG. 1D, FIGS. 2A and 2E, FIG. 3A, FIGS. 4A and 4C, and FIG. 5A.

Figure 24A:
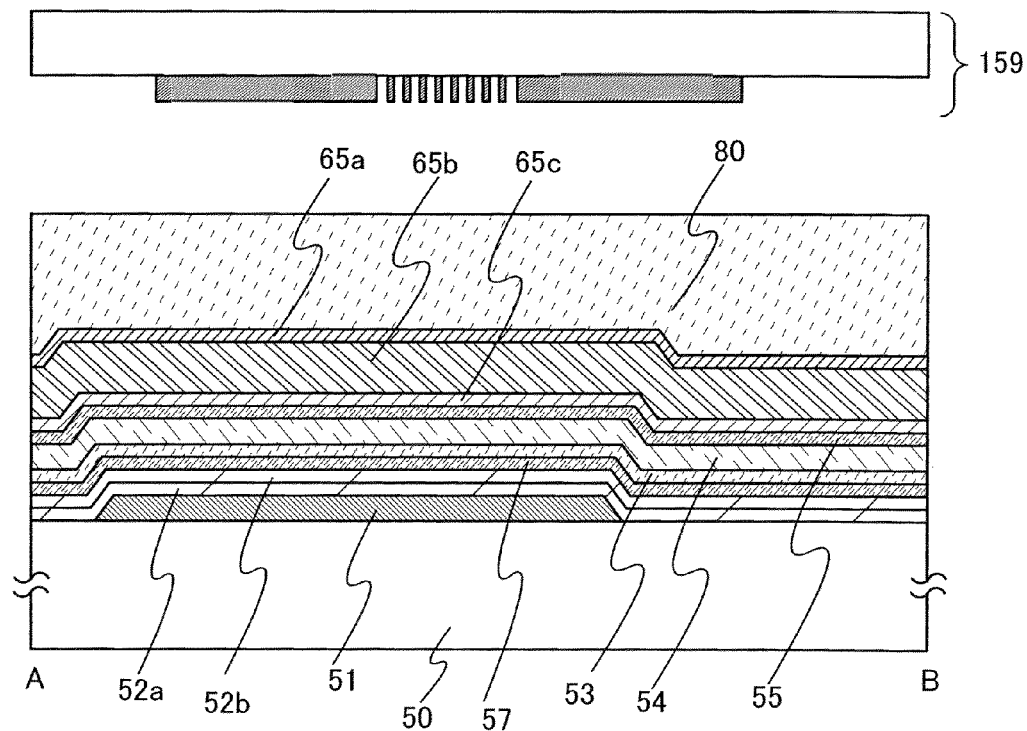
FIGS. 24A and 24B are cross-sectional views illustrating a method for manufacturing a display device of the present invention.

In a similar manner to FIG. 1A, a conductive film is formed over a substrate 50; a resist is applied on the conductive film; and a part of the conductive film is etched using a resist mask that is formed by a photolithography process using a first photomask, so that a gate electrode 51 is formed. Then, as shown in FIG. 24A, gate insulating films 52a and 52b are formed over the gate electrode 51. In a similar manner to FIGS. 9B and 9C, a microcrystalline semiconductor film 57 including an impurity element which serves as a donor is formed. Then, a microcrystalline semiconductor film 53, a buffer layer 54, a semiconductor film 55 to which an impurity element imparting one conductivity type is added, and conductive films 65a to 65c are formed in order over the microcrystalline semiconductor film 57 including the impurity element which serves as a donor. Then, a resist 80 is applied on the conductive film 65a.

The resist 80 can be a positive type or a negative type. In this case, a positive resist is used.

Next, the resist 80 is irradiated with light using a multi-tone photomask 159 as a second photomask, to expose the resist 80 to light.

Next, light exposure using the multi-tone photomask 159 is described with reference to FIGS. 25A to 25D.

A multi-tone photomask can achieve three levels of light exposure to obtain an exposed portion, a half-exposed portion, and an unexposed portion; one-time exposure and development process allows a resist mask with regions of plural thicknesses (typically, two kinds of thicknesses) to be formed. Thus, the use of a multi-tone photomask can reduce the number of photomasks.

Figure 25A:
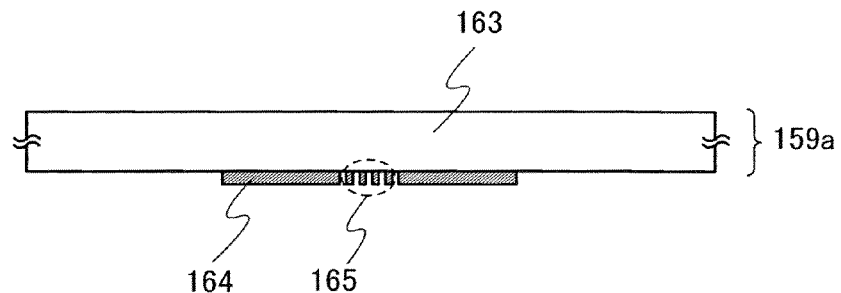
FIGS. 25A to 25D are drawings illustrating multi-tone photomasks applicable to the present invention.
Figure 25B:
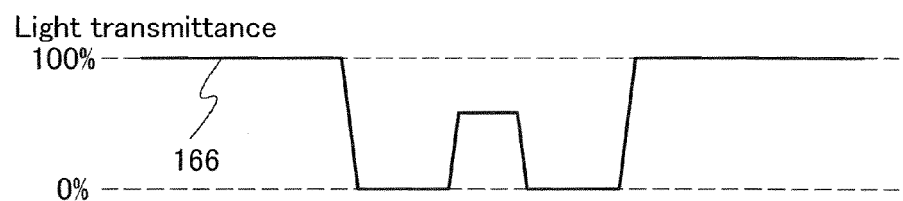
Figure 25C:
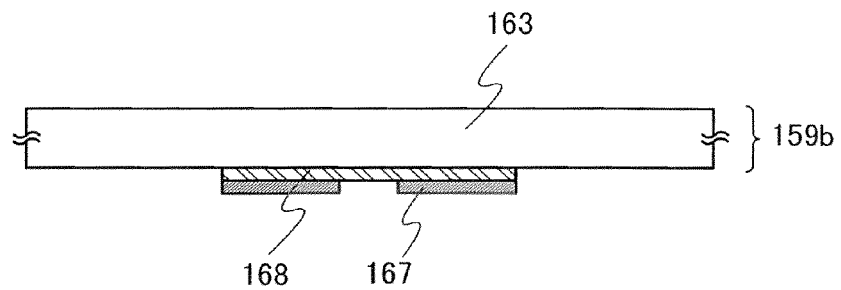

Typical examples of a multi-tone photomask include a gray-tone mask 159a shown in FIG. 25A and a half-tone mask 159b shown in FIG. 25C.

As shown in FIG. 25A, the gray-tone mask 159a includes a light-transmitting substrate 163 provided with a light-blocking portion 164 and a diffraction grating 165. The light transmittance of the light-blocking portion 164 is 0%. The diffraction grating 165 has a light-transmitting portion in a slit form, a dot form, a mesh form, or the like with intervals which are less than or equal to the resolution limit of light used for the exposure, whereby the light transmittance can be controlled. The diffraction grating 165 can be in a slit form, a dot form, or a mesh form with regular intervals; or in a slit form, a dot form, or a mesh form with irregular intervals.

For the light-transmitting substrate 163, a substrate having a light-transmitting property, such as a quartz substrate, can be used. The light-blocking portion 164 and the diffraction grating 165 can be formed using a light-blocking material such as chromium or chromium oxide, which absorbs light.

When the gray-tone mask 159a is irradiated with light for exposure, a light transmittance 166 of the light-blocking portion 164 is 0% and that of a region where neither the light-blocking portion 164 nor the diffraction grating 165 is provided is 100%, as shown in FIG. 25B. The light transmittance of the diffraction grating 165 can be controlled in a range of from 10 to 70%. The light transmittance of the diffraction grating 165 can be controlled with an interval or a pitch of slits, dots, or meshes of the diffraction grating 165.

As shown in FIG. 25C, the half-tone mask 159b includes a light-transmitting substrate 163 provided with a semi-light-transmitting portion 167 and a light-blocking portion 168. MoSiN, MoSi, MoSiO, MoSiON, CrSi, or the like can be used for the semi-light-transmitting portion 167. The light-blocking portion 168 can be formed using a light-blocking material such as chromium or chromium oxide, which absorbs light.

Figure 25D:
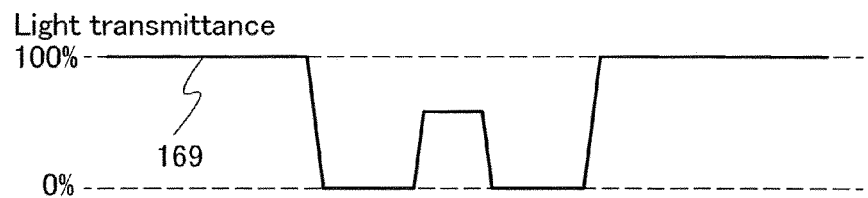

When the half-tone mask 159b is irradiated with light for exposure, a light transmittance 169 of the light blocking portion 168 is 0% and that of a region where neither the light-blocking portion 168 nor the semi-light-transmitting portion 167 is provided is 100%, as shown in FIG. 25D. The light transmittance of the semi-light-transmitting portion 167 can be controlled in a range of from 10 to 70%. The light transmittance of the semi-light-transmitting portion 167 can be controlled with the material of the semi-light-transmitting portion 167.

Figure 24B:
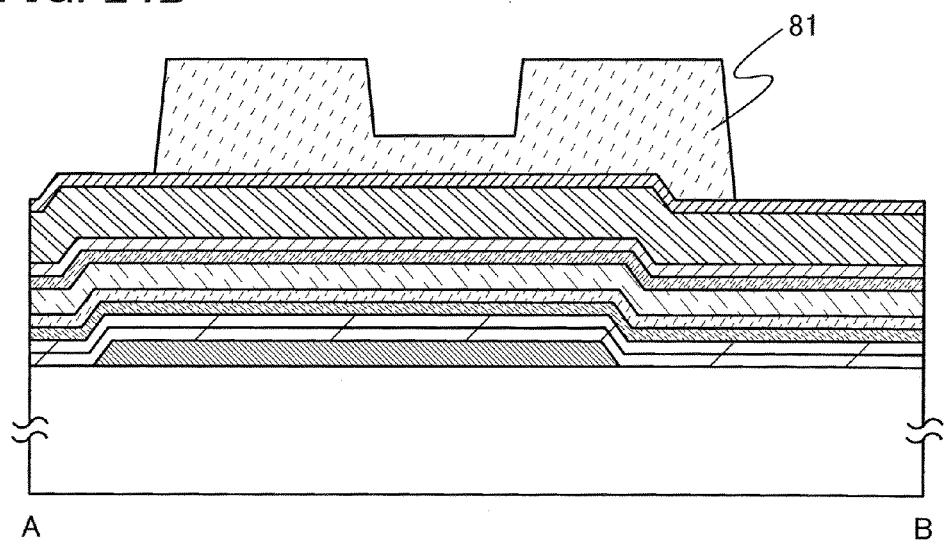

After the light exposure using the multi-tone photomask is performed, development is carried out, whereby a resist mask 81 having regions with different thicknesses can be formed, as shown in FIG. 24B.

Figure 26A:
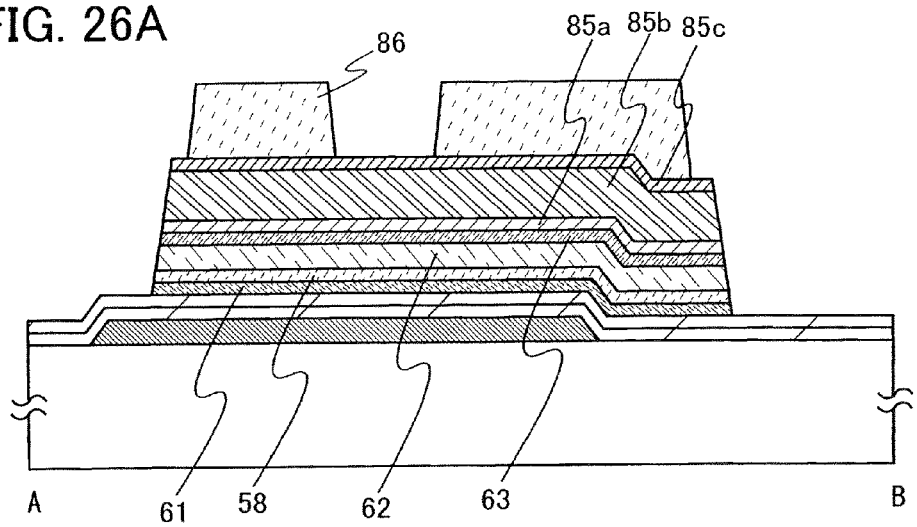
FIGS. 26A to 26C are cross-sectional views illustrating a method for manufacturing a display device of the present invention.

Next, with the resist mask 81, the microcrystalline semiconductor film 57 including the impurity element which serves as a donor, the microcrystalline semiconductor film 53, the buffer layer 54, the semiconductor film 55 to which the impurity element imparting one conductivity type is added, and the conductive films 65a to 65c are etched to be separated. As a result, a microcrystalline semiconductor film 61 including the impurity element which serves as a donor, a microcrystalline semiconductor film 58, a buffer layer 62, a semiconductor film 63 to which the impurity element imparting one conductivity type is added, and conductive films 85a to 85c can be formed as shown in FIG. 26A. FIG. 26A is a cross-sectional view taken along a line A-B in FIG. 30A (except for the resist mask 81).

Next, ashing is performed on the resist mask 81. As a result, the area and the thickness of the resist are reduced. At this time, the resist in a region with a small thickness (a region overlapping with part of the gate electrode 51) is removed to form a separated resist mask 86 as shown in FIG. 26A.

Figure 26B:
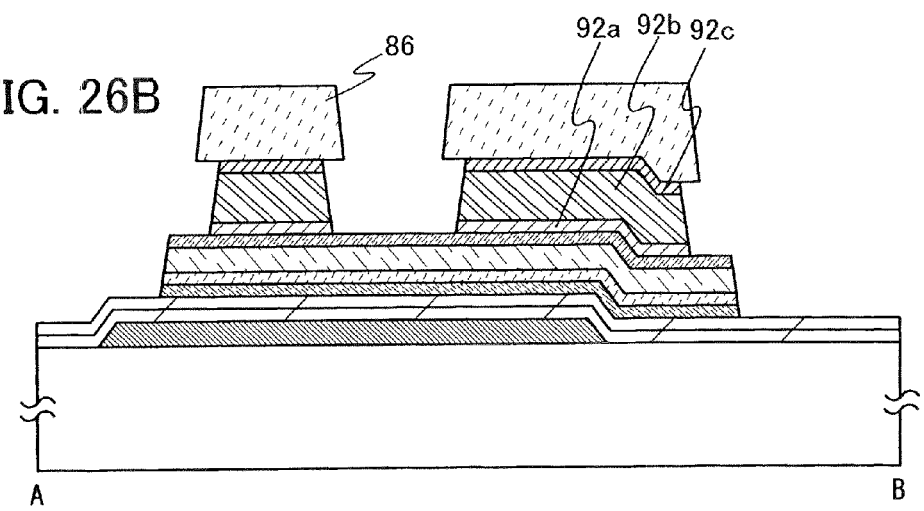

Next, the conductive films 85a to 85c are etched to be separated using the resist mask 86, whereby pairs of wirings 92a to 92c can be formed as shown in FIG. 26B. Here, by wet etching of the conductive films 85a to 85c with the use of the resist mask 86, the conductive films 85a to 85c are etched as selected. As a result, since the conductive films are isotropically etched, the wirings 92a to 92c with smaller areas than the resist mask 86 can be formed.

Next, the semiconductor film 63 to which the impurity element imparting one conductivity type is added is etched using the resist mask 86, so that a pair of source and drain regions 88 are formed. Note that, in this etching step, a part of the buffer layer 62 is also etched to form a pair of buffer layers 87. The source and drain regions and the pair of buffer layer can be formed in the same process. In addition, the end portions of the wirings 92a to 92c are not aligned with those of the source and drain regions 88, and the end portions of the source and drain regions 88 are formed outside those of the wirings 92a to 92c. After that, the resist mask 86 is removed.

Next, dry etching is performed under such a condition that the exposed microcrystalline semiconductor film 61 is not damaged and an etching rate with respect to the microcrystalline semiconductor film 61 is low. Through this dry etching step, an etching residue on the microcrystalline semiconductor film 61 between the source region and the drain region, a residue of the resist mask, and a contamination source in an apparatus used for removal of the resist mask can be removed, whereby the source region and the drain region can be insulated surely. As a result, leakage current of the thin film transistor can be reduced, so that a thin film transistor with small off-current and high withstand voltage can be manufactured. A chlorine gas can be used for an etching gas, for example.

Figure 26C:
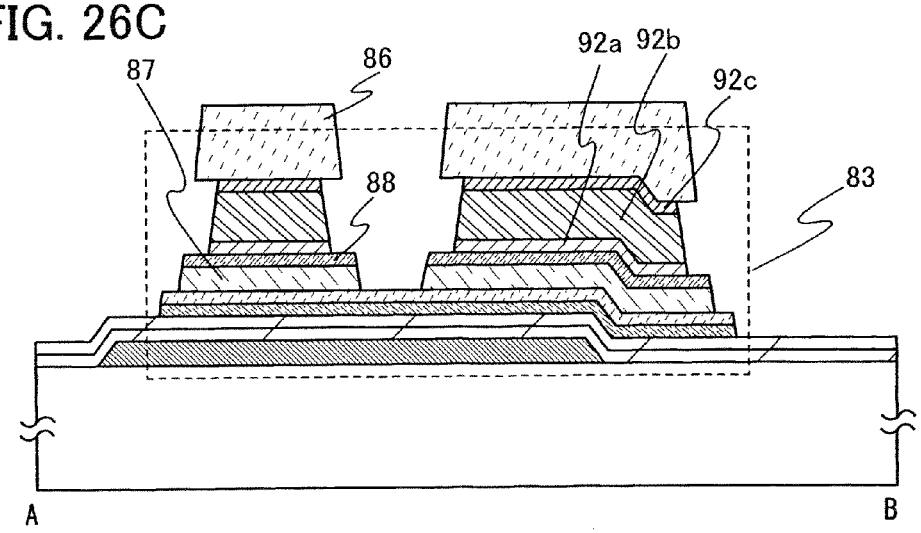

As shown in FIG. 26C, the end portions of the wirings 92a to 92c are not aligned with those of the source and drain regions 88, whereby the end portions of the wirings 92a to 92c can have a larger distance therebetween; thus, leakage current or short circuit between the wirings can be prevented. Accordingly, an inverted-staggered thin film transistor can be manufactured.

Through the above process, a channel-etched thin film transistor 83 can be formed. In addition, the thin film transistor can be formed using two photomasks.

Figure 27A:
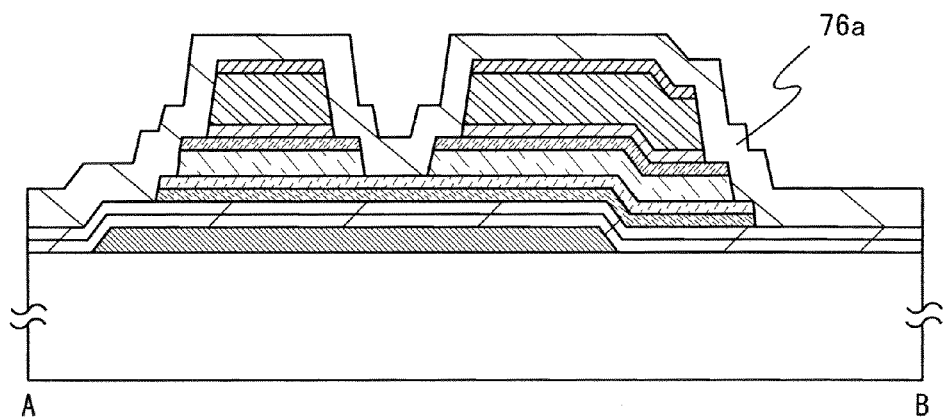
FIGS. 27A and 27B are cross-sectional views illustrating a method for manufacturing a display device of the present invention.

Next, as shown in FIG. 27A, a protective insulating film 76s is formed over the wirings 92a to 92c, the source and drain regions 88, the pair of buffer layers 87, the microcrystalline semiconductor film 61, the microcrystalline semiconductor film 58 including the impurity element which serves as a donor, and the gate insulating film 52b. The protective insulating film 76a can be formed in a similar manner to the gate insulating films 52a and 52b.

Figure 27B:
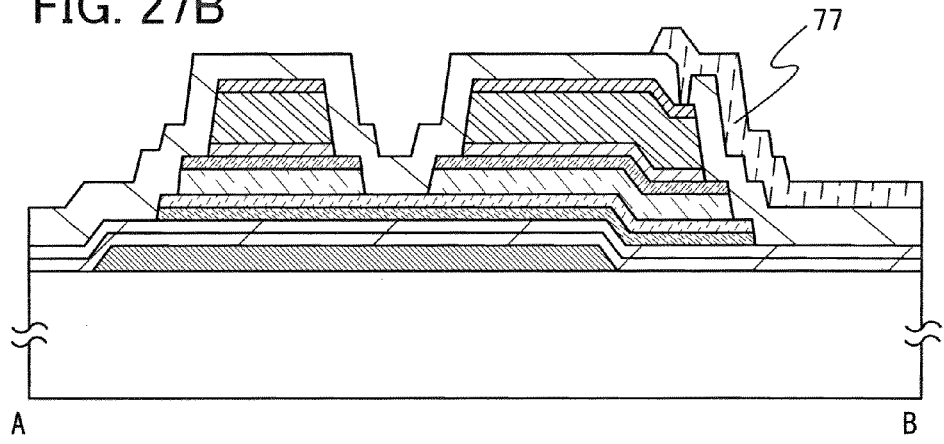

Next, a part of the protective insulating film 76a is etched using a resist mask formed using a third photomask, so that a contact hole is formed. Next, a pixel electrode 77 is formed in the contact hole, to be in contact with the wiring 92c. In this example, an ITO film is formed as the pixel electrode 77 by a sputtering method, and then, a resist is applied on the ITO film. Then, the resist is exposed to light and developed using a fourth photomask, thereby forming a resist mask. Then, the ITO film is etched using the resist mask to form the pixel electrode 77. FIG. 27B is a cross-sectional view taken along a line A-B in FIG. 30C.

Through the above process, a thin film transistor and an element substrate which has the thin film transistor and can be used for a display device can be formed.

Figure 30A:
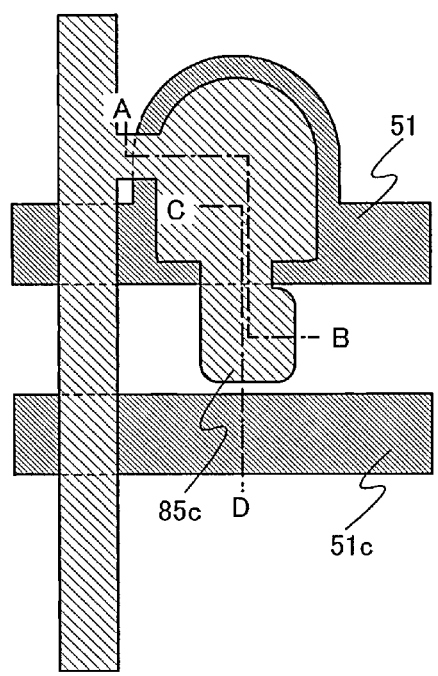
FIGS. 30A to 30C are top views illustrating a method for manufacturing a display device of the present invention.
Figure 30B:
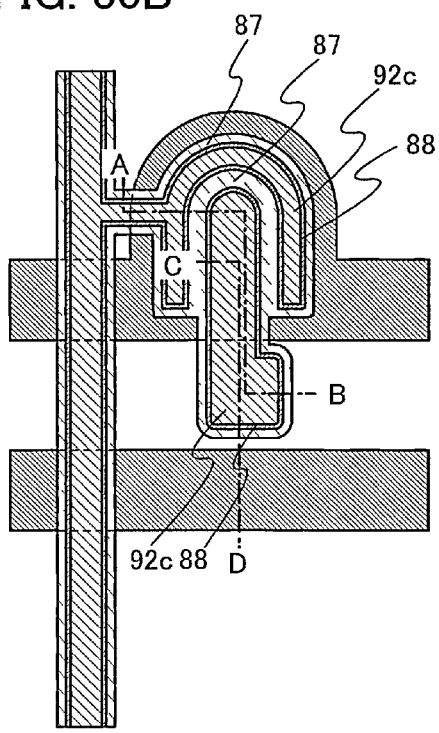
Figure 30C:
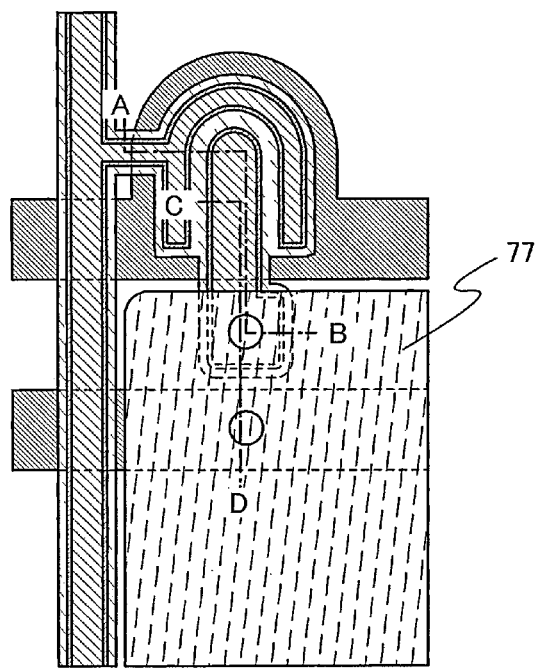

Next, a process in which a contact hole and a capacitor element can be formed with one photomask is described below. Cross-sectional views taken along lines C-D in FIGS. 30A to 30C are used here.

Figure 28A:
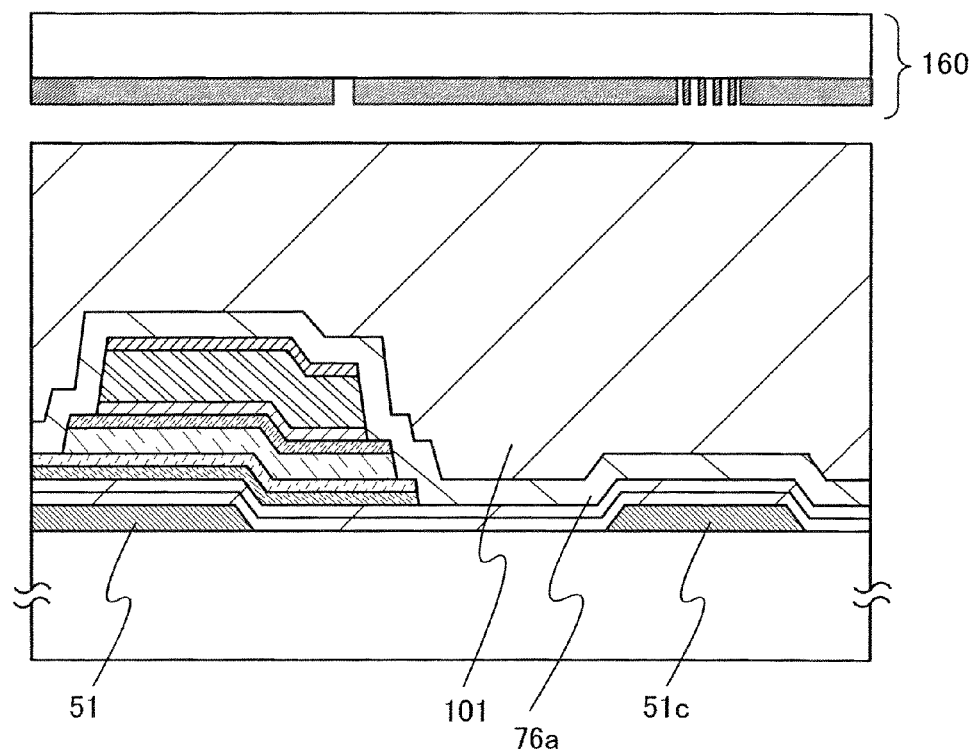
FIGS. 28A and 28B are cross-sectional views illustrating a method for manufacturing a display device of the present invention.
Figure 28B:
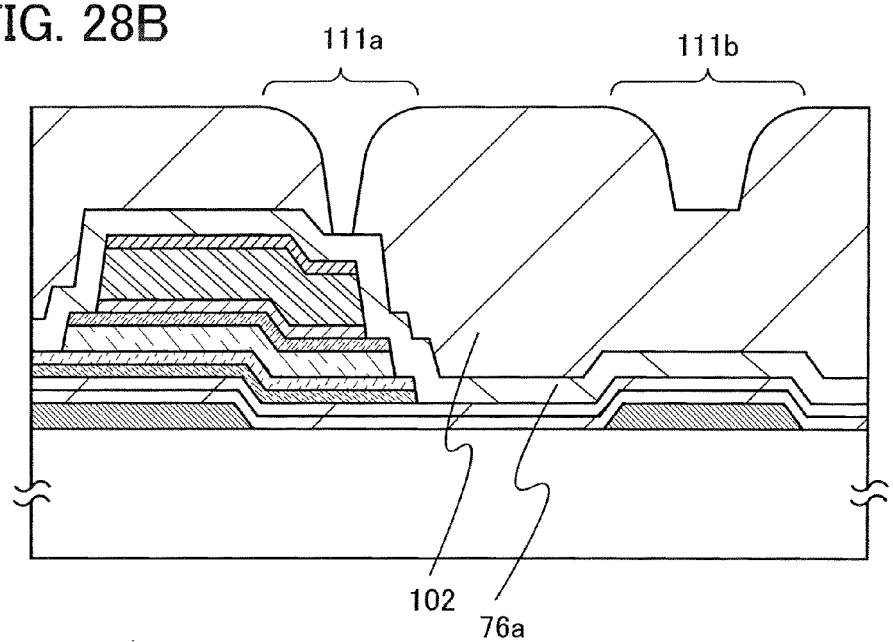

After the step shown in FIG. 27A, an insulating film 101 is formed over the protective insulating film 76a as shown in FIG. 28A. The insulating film 101 is formed using a photosensitive organic resin here. Then, the insulating film 101 is exposed to light using a multi-tone photomask 160 and developed, whereby an insulating film 102 having a recessed portion 111a that exposes the protective insulating film 76a covering the wirings of the thin film transistor and a recessed portion 111b over a capacitor wiring 51c is formed as shown in FIG. 28B. Here, by use of the multi-tone photomask 160, the insulating film 101 can be exposed to light by 100% over the wirings of the thin film transistor, and the insulating film 101 can be exposed to light by from 10 to 70% over the capacitor wiring 51c.

Figure 29A:
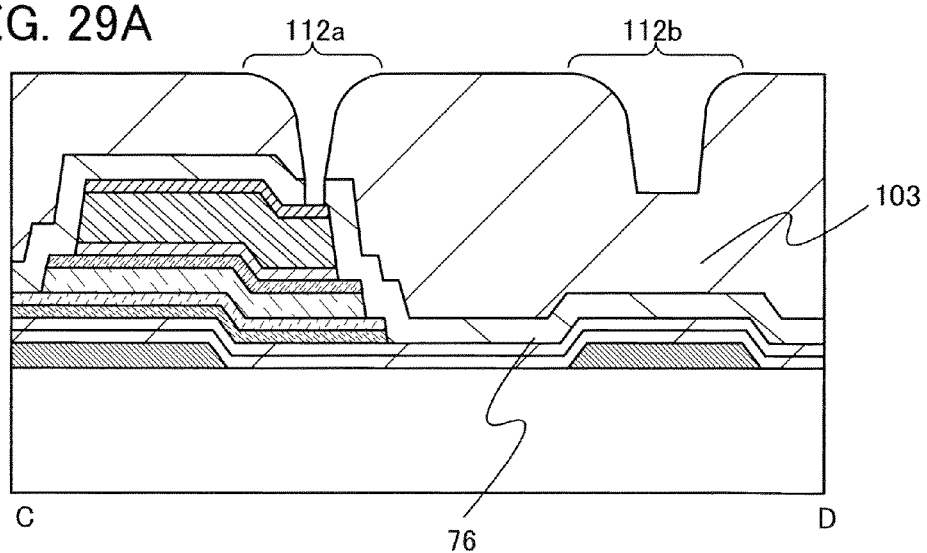
FIGS. 29A to 29C are cross-sectional views illustrating a method for manufacturing a display device of the present invention.
Figure 29B:
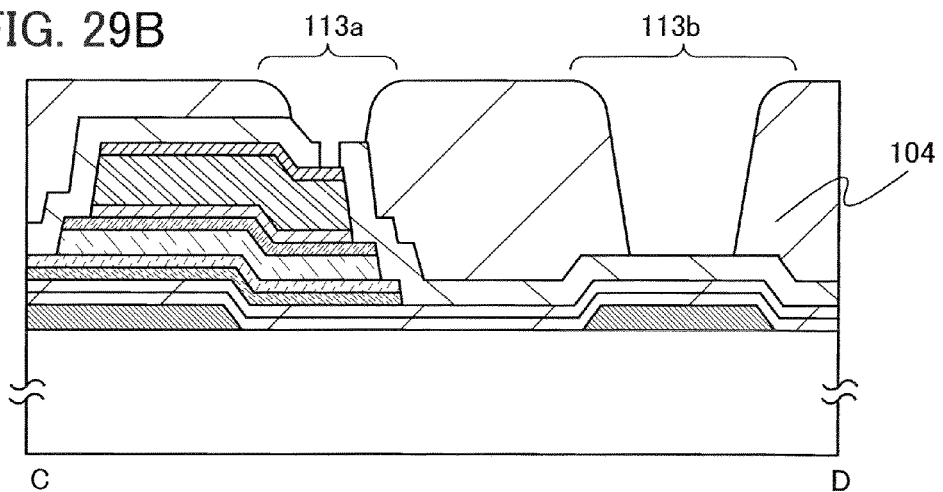
Figure 29C:
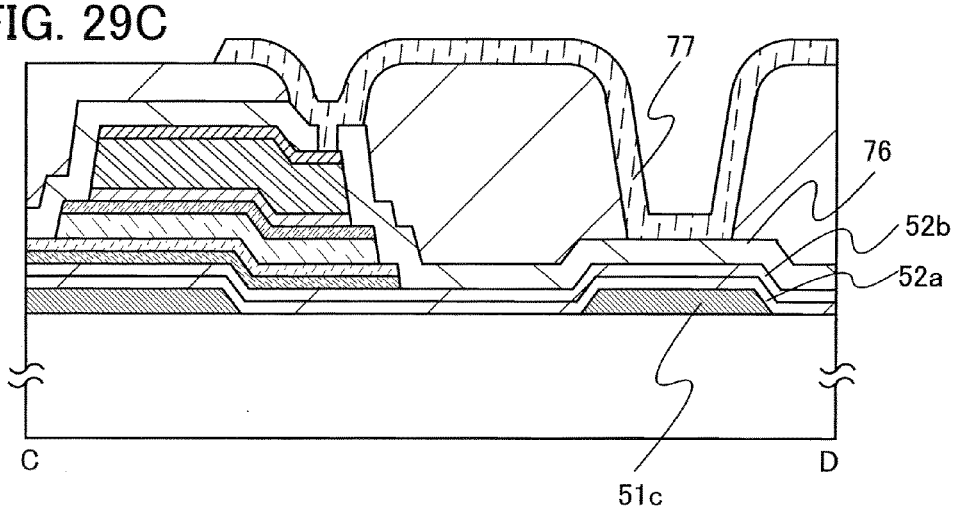

Next, the protective insulating film 76a and the insulating film 102 having the recessed portions are entirely etched (etch back), and a part of the protective insulating film 76a is etched, whereby an insulating film 103 having a contact hole 112a that exposes the wiring 92c and a recessed portion 112b over the capacitor wiring 51c is formed as shown in FIG. 29A.

Next, ashing is performed on the insulating film 103 and the areas of the contact hole 112a and the recessed portion 112b are widened, so that a contact hole 113a and a recessed portion 113b are formed. Since the protective insulating film 76a is not formed of a photosensitive organic resin but formed of an inorganic insulating film, it is not processed by ashing. Therefore, the contact hole 113a, which has a top shape of double circles when seen from above, is formed over the wirings.

After that, a pixel electrode 77 is formed, and a capacitor element including the capacitor wiring 51c, the gate insulating films 52a and 52b, the protective insulating film 76a, and the pixel electrode 77 can be formed.

Through the above process, the contact hole connecting the pixel electrode and the wiring, and the capacitor element can be formed with the use of only one multi-tone photomask.

Figure 31:
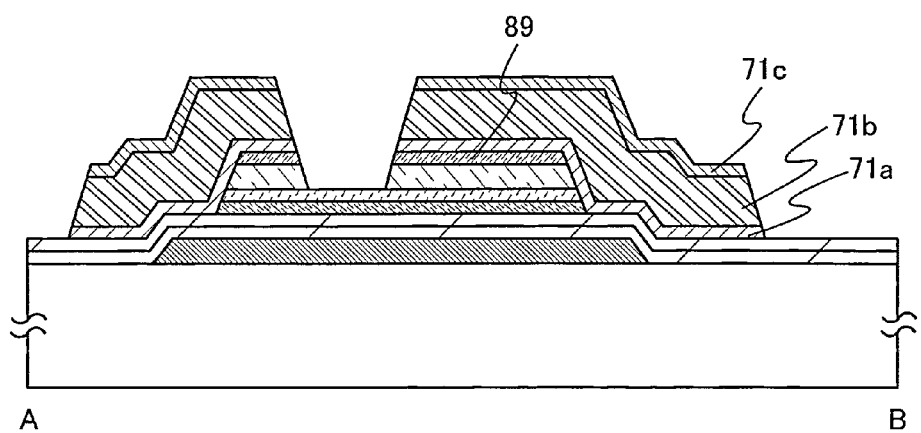
FIG. 31 is a cross-sectional view illustrating a method for manufacturing a display device of the present invention.

Further, in FIG. 10B or FIG. 26B, after forming the wirings 71a to 71c or 92a to 92c, the resist mask 66 or 86 may be removed, and the semiconductor film 63 to which the impurity element imparting one conductivity type is added may be etched using the wirings 71a to 71c or 92a to 92c as masks. As a result, a thin film transistor in which end portions of the wirings 71a to 71c or 92a to 95c are aligned with those of the source and drain regions 72 or 88 can be formed. Here, after removing the resist mask 66 shown in FIG. 10B, the semiconductor film 63 to which the impurity element imparting one conductivity type is added is etched using the wirings 71a to 71c as masks, so that a thin film transistor in which end portions of source and drain regions 89 are aligned with those of the wirings 71a to 71c can be formed as shown in FIG. 31.

Although this embodiment mode describes a channel-etched thin film transistor, a microcrystalline semiconductor film can also be used for a channel formation region of a channel protective thin film transistor.

In accordance with this embodiment mode, an inverted-staggered thin film transistor with high electric characteristics and an element substrate provided with the inverted-staggered thin film transistor can be manufactured.

This embodiment mode describes an inverted-staggered thin film transistor as a thin film transistor, but the present invention is not limited thereto. A method for forming an insulating film and a microcrystalline semiconductor film each including an impurity element which serves as a donor can be applied to a staggered thin film transistor, a top gate thin film transistor, and the like. Specifically, an insulating film functioning as a base film and/or a microcrystalline semiconductor film is made to include an impurity element which serves as a donor, and a gate insulating film and a gate electrode are formed over the microcrystalline semiconductor film, whereby a thin film transistor having a microcrystalline semiconductor film with high crystallinity at the interface with the insulating film can be manufactured. Accordingly, a thin film transistor with excellent electric characteristics can be formed.

Embodiment Mode 4

In this embodiment mode, a liquid crystal display device including the thin film transistor described in Embodiment Mode 1 is described below as one mode of a display device. Here, a vertical alignment (VA) mode liquid crystal display device is described with reference to FIGS. 32 to 34. The VA mode liquid crystal display device employs a method of controlling alignment of liquid crystal molecules of a liquid crystal panel. In the VA mode liquid crystal display device, liquid crystal molecules are aligned in a vertical direction with respect to a panel surface when a voltage is not applied. In this embodiment mode, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 32:
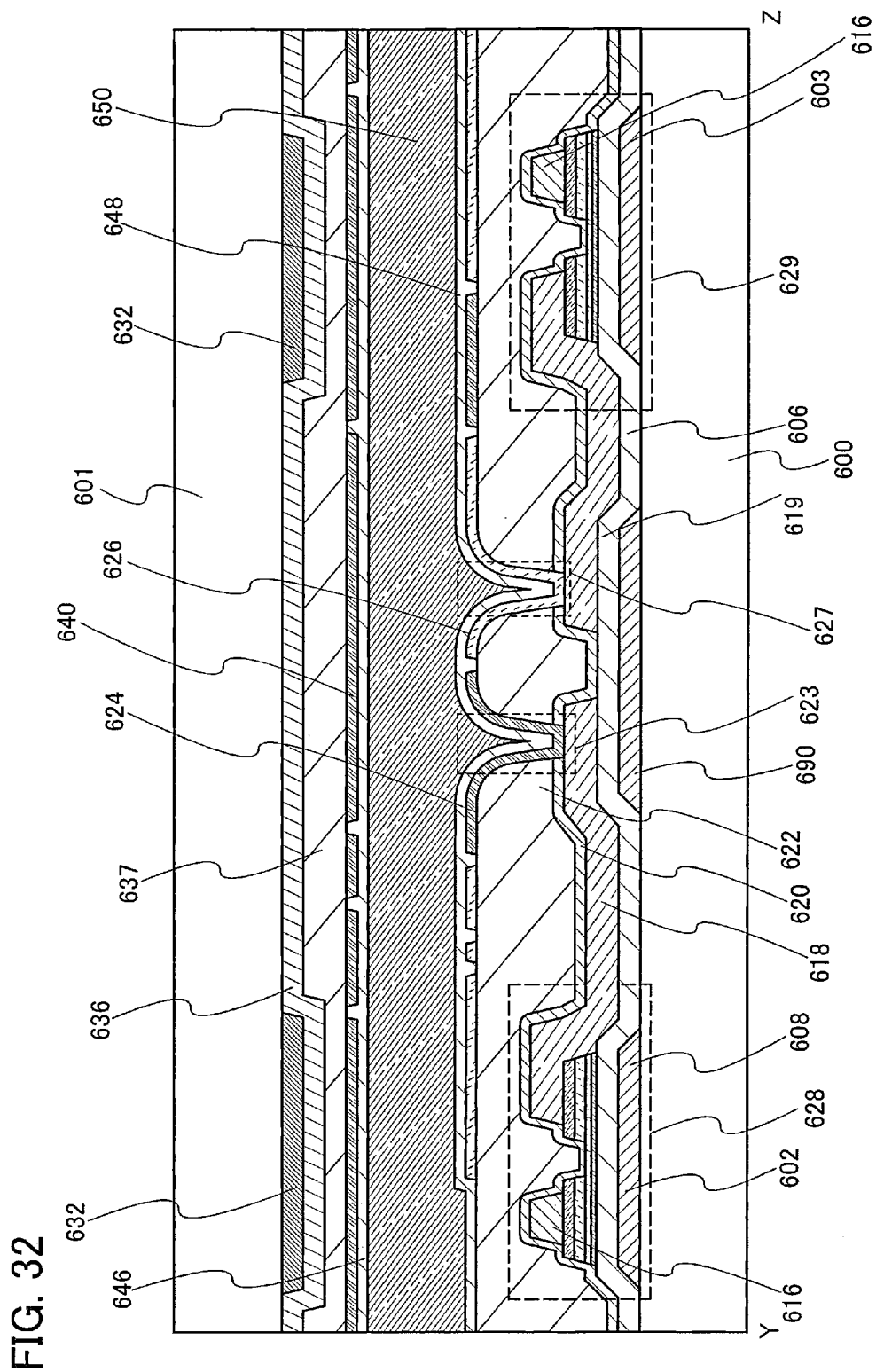
FIG. 32 is a cross-sectional view illustrating a display device of the present invention.
Figure 33:
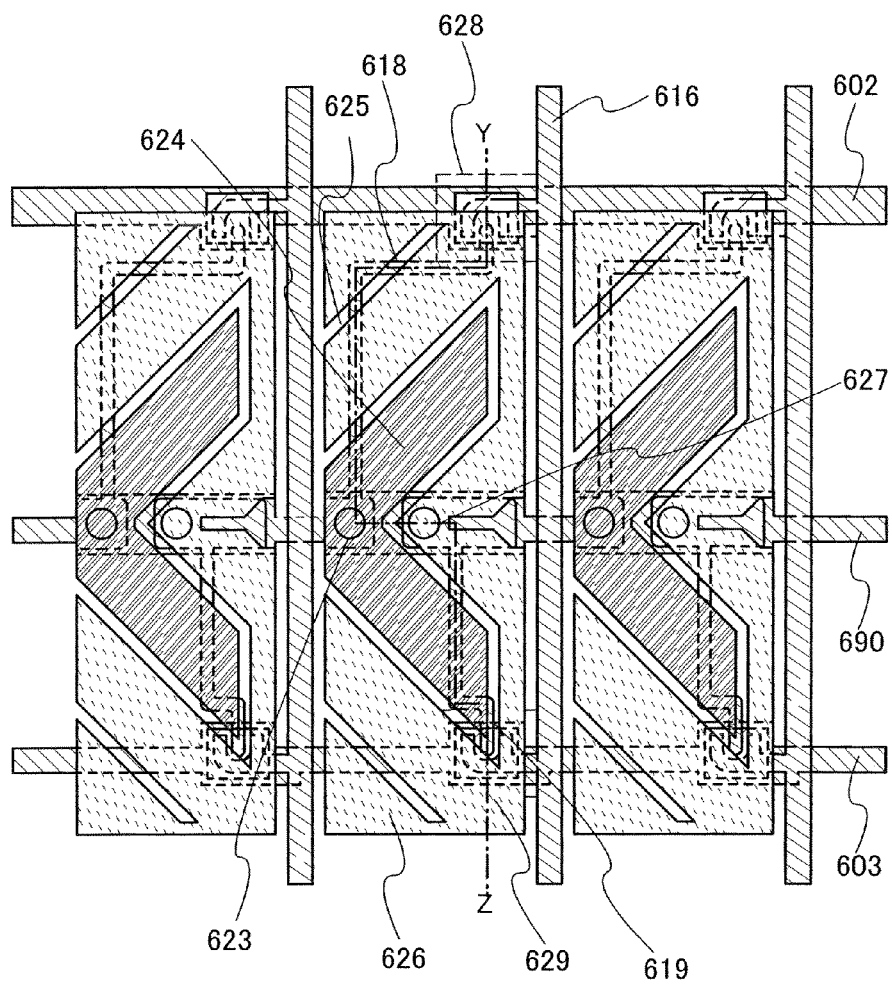
FIG. 33 is a top view illustrating a display device of the present invention.

FIGS. 32 and 33 show a pixel structure of a VA mode liquid crystal panel. FIG. 33 is a plan view of a substrate 600. FIG. 32 shows a cross-sectional structure taken along a line Y-Z in FIG. 33. The following description is made with reference to both the drawings.

In this pixel structure, a plurality of pixel electrodes 624 and 626 is included in one pixel, and thin film transistors 628 and 629 are connected to the pixel electrodes 624 and 626, respectively, through a planarization film 622. The thin film transistors 628 and 629 are driven by different gate signals. That is, a pixel of multi-domain design has a structure in which a signal applied to each of the pixel electrodes 624 and 626 is independently controlled.

The pixel electrode 624 is connected to the thin film transistor 628 through a wiring 618 in a contact hole 623. In a contact hole 627, the pixel electrode 626 is connected to the thin film transistor 629 through a wiring 619. A gate wiring 602 of the thin film transistor 628 and a gate wiring 603 of the thin film transistor 629 are separated so that different gate signals can be given thereto. In contrast, a wiring 616 functioning as a data line is used in common for the thin film transistors 628 and 629. The thin film transistors 628 and 629 can be manufactured by the methods described in Embodiment Mode 3.

The pixel electrodes 624 and 626 have different shapes and are separated by a slit 625. The pixel electrode 626 surrounds the pixel electrode 624, which has a V-shape. The thin film transistors 628 and 629 make the timing of applying voltages to the pixel electrodes 624 and 626 different from each other, thereby controlling alignment of liquid crystals. By supplying different gate signals to the gate wirings 602 and 603, operation timing of the TFTs 628 and 629 can be different. Further, an alignment film 648 is formed over the pixel electrodes 624 and 626.

Figure 34:
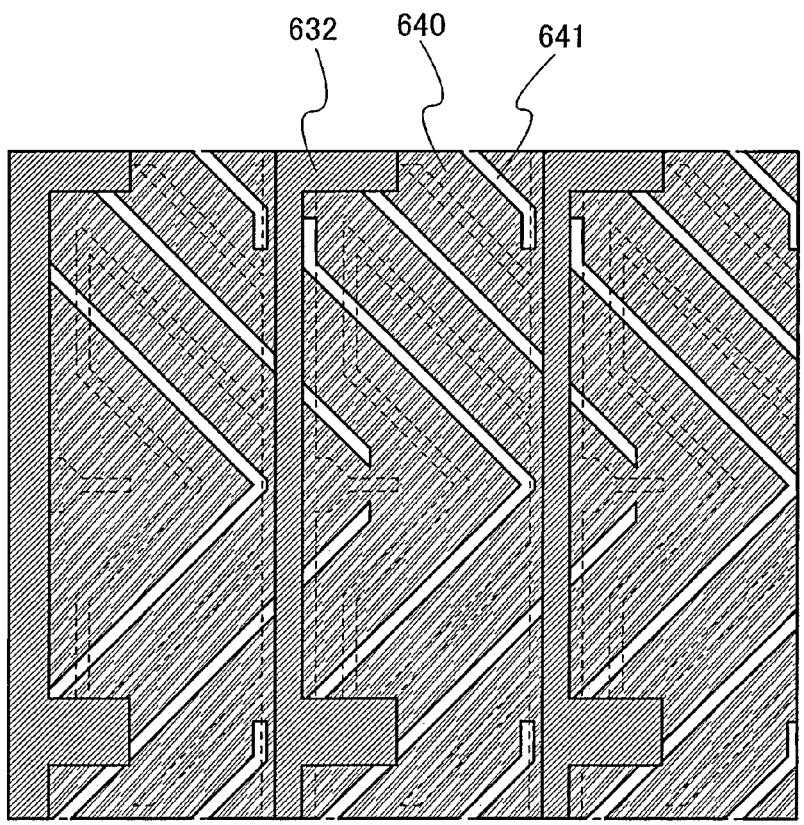
FIG. 34 is a top view illustrating a display device of the present invention.

A counter substrate 601 is provided with a light-blocking film 632, a coloring film 636, and a counter electrode 640. In addition, a planarizing film 637 is formed between the coloring film 636 and the counter electrode 640, thereby preventing alignment disorder of liquid crystals. Further, an alignment film 646 is formed on the counter electrode 640. FIG. 34 shows a structure of a counter substrate side. The counter electrode 640 is shared by plural pixels, and a slit 641 is formed in the counter electrode 640. The slit 641 and the slit 625 on the pixel electrodes 624 and 626 side are disposed so as not to overlap with each other, thereby effectively generating an oblique electric field to control the alignment of the liquid crystals. Accordingly, the direction in which the liquid crystals are aligned can be different depending on the location, and thus a viewing angle is increased.

In this specification, a substrate, a coloring film, a light-blocking film, and a planarization film form a color filter. Either the light-blocking film or the planarization film, or neither of them is not necessarily formed over the substrate.

The coloring film has a function of preferentially transmitting light of a predetermined wavelength range among light of the wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined to be used for a color filter. However, the combination of the coloring films is not limited to the above.

The pixel electrode 624, a liquid crystal layer 650, and the counter electrode 640 overlap with each other to form a first liquid crystal element. Further, the pixel electrode 626, the liquid crystal layer 650, and the counter electrode 640 overlap with each other to form a second liquid crystal element. Furthermore, the multi-domain structure is made in which the first liquid crystal element and the second liquid crystal element are provided for one pixel.

Although a vertical alignment (VA) mode liquid crystal display device is described here, the element substrate formed in accordance with Embodiment Mode 1 can also be applied to an FFS mode liquid crystal display device, an IPS mode liquid crystal display device, a TN mode liquid crystal display device, and the like.

The liquid crystal display device can be manufactured through the above process. Since an inverted-staggered thin film transistor with small off-current and high electric characteristics is used for the liquid crystal display device of this embodiment mode, the liquid crystal display device has high contrast and high visibility.

Embodiment Mode 5

Figure 35A:
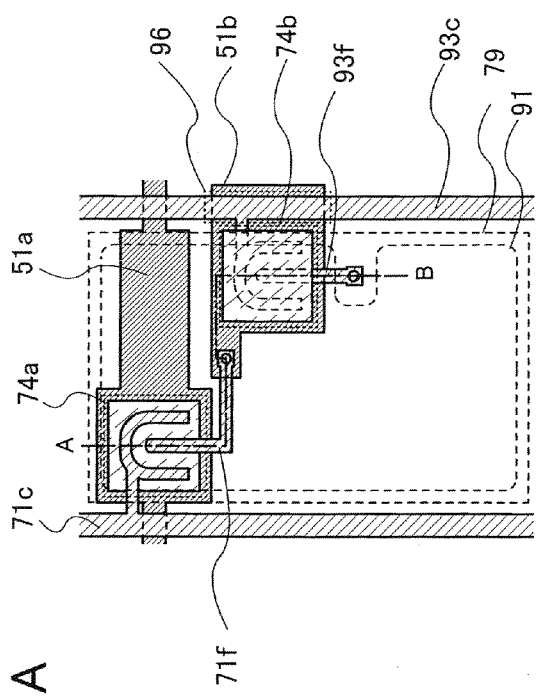
FIGS. 35A and 35B are a top view and a cross-sectional view, respectively, illustrating a display device of the present invention.
Figure 35B:
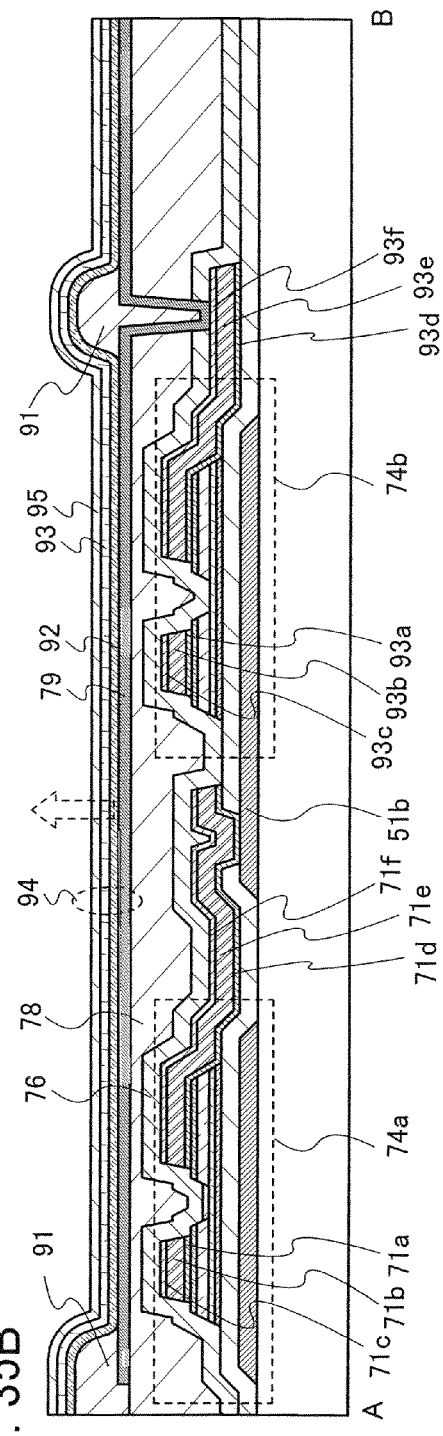

In this embodiment mode, a light-emitting display device including the thin film transistor described in Embodiment Mode 1 is described below as one mode of a display device; a structure of a pixel included in the light-emitting display device is described here. FIG. 35A shows one mode of a top view of a pixel. FIG. 35B shows one mode of a cross-sectional structure of the pixel taken along a line A-B in FIG. 35A.

Here, a display device including a light-emitting element utilizing electroluminescence is shown as a light-emitting device. Light-emitting elements utilizing electroluminescence are classified into two types according to whether a light-emitting material is an organic compound or an inorganic compound. In general, the former is referred to as an organic EL element, and the latter as an inorganic EL element. In this embodiment mode, the process for manufacturing the thin film transistor in accordance with Embodiment Mode 1 can be used.

In an organic EL element, voltage is applied to the light-emitting element, so that electrons are injected from an electrode into a layer including a light-emitting organic compound, and holes are injected from the other electrode into the layer including the light-emitting organic compound, and there flows electric current. These carriers (electrons and holes) are recombined, so that the light-emitting organic compound is placed in an excited state. The light-emitting organic compound emits light in returning to a ground state from the excited state. Because of such mechanism, such a light-emitting element is called a "light-emitting element of a current excitation type."

Inorganic EL elements are classified into dispersive inorganic EL elements and thin film inorganic EL elements. A dispersive inorganic EL element includes a light-emitting layer in which particles of a light-emitting material are dispersed in a binder, and light emission mechanism thereof is donor-acceptor recombination light emission, in which a donor level and an acceptor level are utilized. In a thin film inorganic EL element, a light-emitting layer is sandwiched between dielectric layers, and the dielectric layers are sandwiched between electrodes. Light emission mechanism of the thin film inorganic EL element is local light emission, in which inner-shell electron transition of a metal ion is utilized. Here, an organic EL element is described as a light-emitting element. In addition, although the description is made using channel-etched thin film transistors as a switching thin film transistor that controls input of a signal to a first electrode and a driving thin film transistor which controls driving of a light-emitting element, a channel protective thin film transistor can also be used as appropriate.

In FIGS. 35A and 35B, a first thin film transistor 74a is a switching thin film transistor for controlling input of a signal to a first electrode, and a second thin film transistor 74b is a driving thin film transistor for controlling current or voltage supply to a light-emitting element 94.

A gate electrode of the first thin film transistor 74a is connected to a scanning line 51a. One of a source and a drain is connected to wirings 71a to 71c which functions as a signal line. The other of the source and the drain is electrically connected to a gate electrode 51b of the second thin film transistor 74b. One of a source and a drain of the second thin film transistor 74b is connected to power supply lines 93a to 93c, and the other of the source and the drain is electrically connected to a first electrode 79 of a display device. A gate electrode, a gate insulating film, and the power supply line 93a of the second thin film transistor 74b form a capacitor element 96, and the other of the source and the drain of the first thin film transistor 74a is electrically connected to the capacitor element 96.

The capacitor element 96 corresponds to a capacitor element for holding a voltage between the gate and the source or between the gate and the drain (hereinafter referred to as a gate voltage) of the second thin film transistor 74b when the first thin film transistor 74a is in an off-state, and is not necessarily provided.

In this embodiment mode, the first thin film transistor 74a and the second thin film transistor 74b can be each formed using the thin film transistor described in Embodiment Mode 1. In addition, although each of the first thin film transistor 74a and the second thin film transistor 74b is an n-channel thin film transistor in this example, the first thin film transistor 74a and the second thin film transistor 74b may also be formed using an n-channel thin film transistor and a p-channel thin film transistor, respectively. Furthermore, both the first thin film transistor 74a and the second thin film transistor 74b may be formed using p-channel thin film transistors.

A protective insulating film 76 is formed over the first thin film transistor 74a and the second thin film transistor 74b. A planarization film 78 is formed over the protective insulating film 76. The first electrode 79 is formed to be connected to a wiring 93f in a contact hole formed in the planarization film 78 and the protective insulating film 76. The planarization film 78 is preferably formed using an organic resin such as acrylic, polyimide, or polyamide, or a siloxane polymer. Since the first electrode 79 has a recessed portion in the contact hole, a partition wall 91 having an opening is provided to cover the recessed portion of the first electrode 79. In the opening of the partition wall 91, an EL layer 92 is formed so as to be in contact with the first electrode 79, and a second electrode 93 is formed so as to cover the EL layer 92. Further, a protective insulating film 95 is formed so as to cover the second electrode 93 and the partition wall 91.

A light-emitting element 94 having a top emission structure is shown as a light-emitting element. The light-emitting element 94 with a top emission structure can emit light even over the first thin film transistor 74a or the second thin film transistor 74b; thus, a light emission area can be increased. However, if the layers located under the EL layer 92 are uneven, the thickness is nonuniform due to unevenness, and the second electrode 93 and the first electrode 79 are short-circuited, so that a display defect is caused. Therefore, it is preferable to provide the planarization film 78.

The light-emitting element 94 corresponds to a region where the first electrode 79 and the second electrode 93 sandwich the EL layer 92. In the case of the pixel shown in FIG. 35A, light from the light-emitting element 94 is emitted to the second electrode 93 side as shown by an outline arrow.

As the first electrode 79 functioning as a cathode, a known conductive film can be used as long as it has a low work function and reflects light. For example, Ca, Al, CaF, MgAg, AlLi, or the like is preferably used. The EL layer 92 may be formed using a single layer or by stacking a plurality of layers. When the EL layer 92 is formed using a plurality of layers, an electron-injection layer, an electron-transporting layer, a light-emitting layer, a hole-transporting layer, and a hole-injecting layer are stacked in this order over the first electrode 79. It is not necessary to form all of these layers. The second electrode 93 functioning as an anode is formed using a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added.

A light-emitting element having a top emission structure, in which light is emitted from a side opposite to a substrate, is described here; however, a light-emitting element having a bottom emission structure, in which light is emitted from the substrate side, or a light-emitting element having a dual emission structure, in which light is emitted from both the substrate side and the side opposite to the substrate, can also be employed as appropriate.

Although an organic EL element is described here as a light-emitting element, an inorganic EL element can also be provided as a light-emitting element.

This embodiment mode describes an example in which a thin film transistor for controlling the driving of a light-emitting element (the driving thin film transistor) is electrically connected to the light-emitting element; however, a thin film transistor for controlling current may be connected between the driving thin film transistor and the light-emitting element.

Through the above process, a light-emitting display device can be manufactured. The light-emitting display device of this embodiment mode can have high contrast and high visibility because an inverted-staggered thin film transistor with small off-current and excellent electric characteristics is used.

Embodiment Mode 6

This embodiment mode describes a structure of a display panel which is one mode of a display device of the present invention.

Figure 36A:
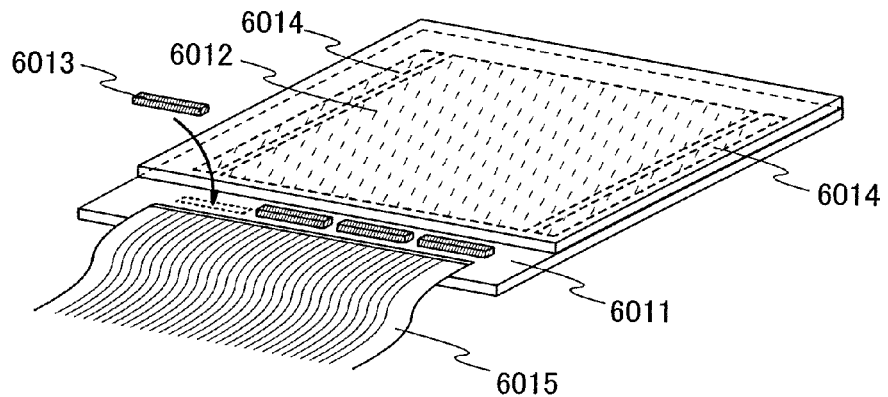
FIGS. 36A to 36C are perspective views illustrating display panels of the present invention.

FIG. 36A illustrates a mode of a display panel in which a pixel portion 6012 formed over a substrate 6011 is connected to a signal line driver circuit 6013 that is formed separately. The pixel portion 6012 and a scanning line driver circuit 6014 are formed using thin film transistors in which a microcrystalline semiconductor film is used for channel formation regions. By forming the signal line driver circuit with a thin film transistor by which higher field effect mobility can be obtained than the thin film transistor in which a microcrystalline semiconductor film is used for the channel formation region, operation of the signal line driver circuit, which demands a higher driving frequency than the scanning line driver circuit, can be stabilized. The signal line driver circuit 6013 may be formed using a thin film transistor in which a single-crystalline semiconductor is used for a channel formation region, a thin film transistor in which a polycrystalline semiconductor is used for a channel formation region, or a thin film transistor in which an SOI is used for a channel formation region. The pixel portion 6012, the signal line driver circuit 6013, and the scanning line driver circuit 6014 are each supplied with potential of a power source, a variety of signals, and the like through an FPC 6015. Further, a protection circuit may be provided between the signal line driver circuit 6013 and the FPC 6015 or between the signal line driver circuit 6013 and the pixel portion 6012. The protection circuit includes one or more elements selected from a thin film transistor, a diode, a resistor element a capacitor element, and the like. For example, a diode obtained by connecting the thin film transistor described in Embodiment Mode 1 or 2 can also be used as a diode.

Both the signal line driver circuit and the scanning line driver circuit may be formed over the same substrate as the pixel portion.

Figure 36B:
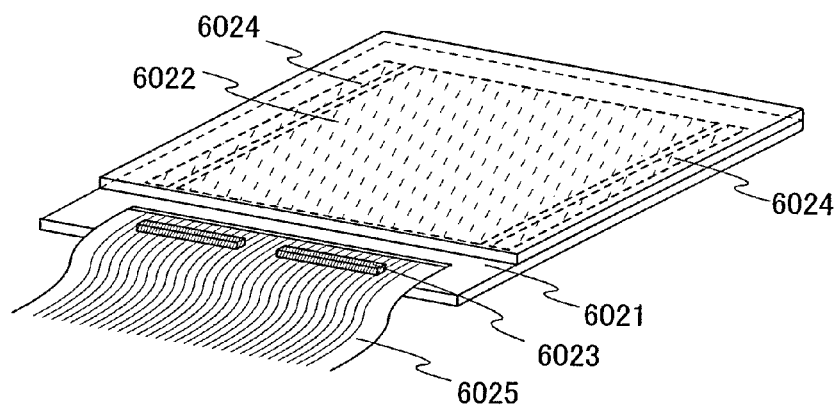

Further, when a driver circuit is formed separately, a substrate provided with the driver circuit is not necessarily attached to a substrate provided with a pixel portion, and may be attached to, for example, an FPC. FIG. 36B shows a mode of a display panel in which a signal line driver circuit 6023 is formed separately and is connected to a pixel portion 6022 and a scanning line driver circuit 6024 that are formed over a substrate 6021. The pixel portion 6022 and the scanning line driver circuit 6024 are each formed using a thin film transistor in which a microcrystalline semiconductor film is used for a channel formation region. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025. Further, a protection circuit may be provided between the signal line driver circuit 6023 and the FPC 6025 or between the signal line driver circuit 6023 and the pixel portion 6022.

Figure 36C:
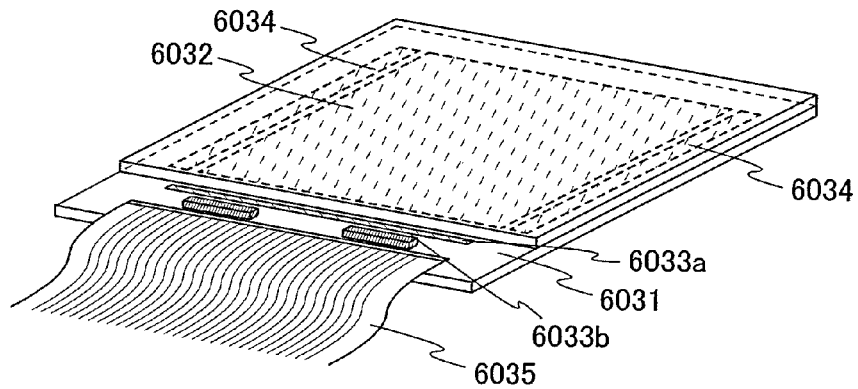

Furthermore, only a part of the signal line driver circuit or only a part of the scanning line driver circuit may be formed over the same substrate as the pixel portion with use of a thin film transistor in which a microcrystalline semiconductor film is used for a channel formation region, and the rest may be formed separately and electrically connected to the pixel portion. FIG. 36C shows a mode of a display panel in which an analog switch 6033a included in the signal driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are each formed using a thin film transistor in which a microcrystalline semiconductor film is used for a channel formation region. The shift register 6033b included in the signal line driver circuit is connected to the pixel portion 6032 through an FPC 6035. The pixel portion 6032, the signal line driver circuit, and the scanning line driver circuit 6034 are each supplied with a potential of a power source, a variety of signals, and the like through the FPC 6035. Further, a protection circuit may be provided between the signal line driver circuit 6033 and the FPC 6035 or between the signal line driver circuit 6033 and the pixel portion 6032.

As shown in FIGS. 36A to 36C, in the display device of this embodiment mode, an entire driver circuit or a part thereof can be formed over the same substrate as a pixel portion, using a thin film transistor in which a microcrystalline semiconductor films is used for a channel formation region.

Note that there is no particular limitation on a connection method of the substrate formed separately, and a known method such as a COG method, a wire bonding method, or a TAB method can be used. Further, a connection position is not limited to the position illustrated in FIGS. 36A to 36C as long as electrical connection is possible. Furthermore, a controller, a CPU, a memory, and/or the like may be formed separately and connected.

The signal line driver circuit used in the present invention includes a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Embodiment Mode 7

Display devices or the like that are obtained according to the present invention can be used for active matrix display panels. That is to say, the present invention can be carried out in all electronic devices in which these display panels are incorporated into display portions.

Examples of such electronic devices include cameras such as video cameras and digital cameras, displays that can be mounted on a person's head (goggle-type displays), car navigation systems, projectors, car stereos, personal computers, portable information terminals (e.g., mobile computers, mobile phones, and electronic books). Examples of these devices are illustrated in FIGS. 37A to 37D.

Figure 37A:
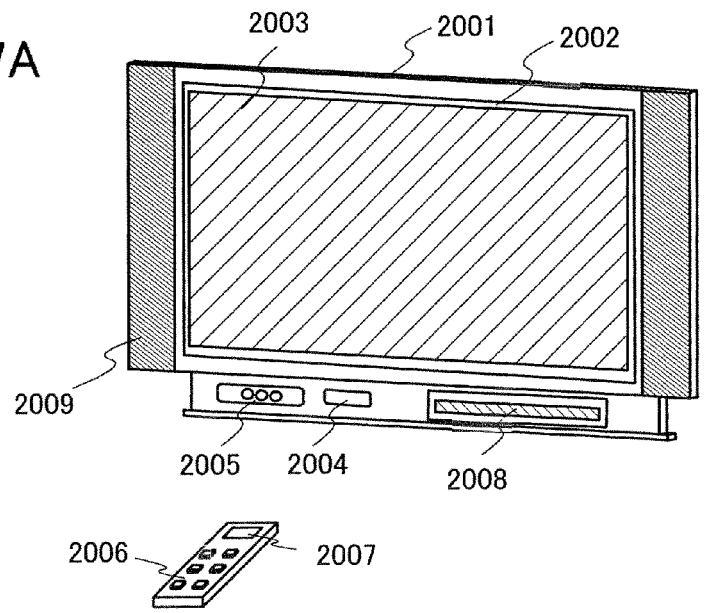
FIGS. 37A to 37D are perspective views illustrating electronic devices having display devices of the present invention.

FIG. 37A illustrates a television device. A television device can be completed by incorporating a display panel into a chassis as illustrated in FIG. 37A. A main screen 2003 is formed with a display panel. In addition, a speaker unit 2009, operation switches, and the like are provided as accessory equipment. In this manner, a television device can be completed.

As illustrated in FIG. 37A, a display panel 2002 including display elements is incorporated into a chassis 2001. In addition to reception of general television broadcast by a receiver 2005, communication of information in one direction (from a transmitter to a receiver) or in two directions (between a transmitter and a receiver or between receivers) can be performed by connection to a wired or wireless communication network through a modem 2004. The television device can be operated using switches that are incorporated in the chassis or with a remote control device 2006 that is provided separately, and a display portion 2007 that displays output information may be provided for the remote control device.

Further, in the television device, a sub-screen 2008 may be formed using a second display panel and may be used to display channel number, volume, and the like, in addition to the main screen 2003. In this structure, the main screen 2003 may be formed with a liquid crystal display panel, and the sub-screen 2008 may be formed with a light-emitting display panel. Furthermore, the main screen 2003 may be formed with a light-emitting display panel, and the sub-screen 2008 may be formed with a light-emitting display panel, and the sub-screen 2008 may be configured to be capable of flashing on and off.

Figure 38:
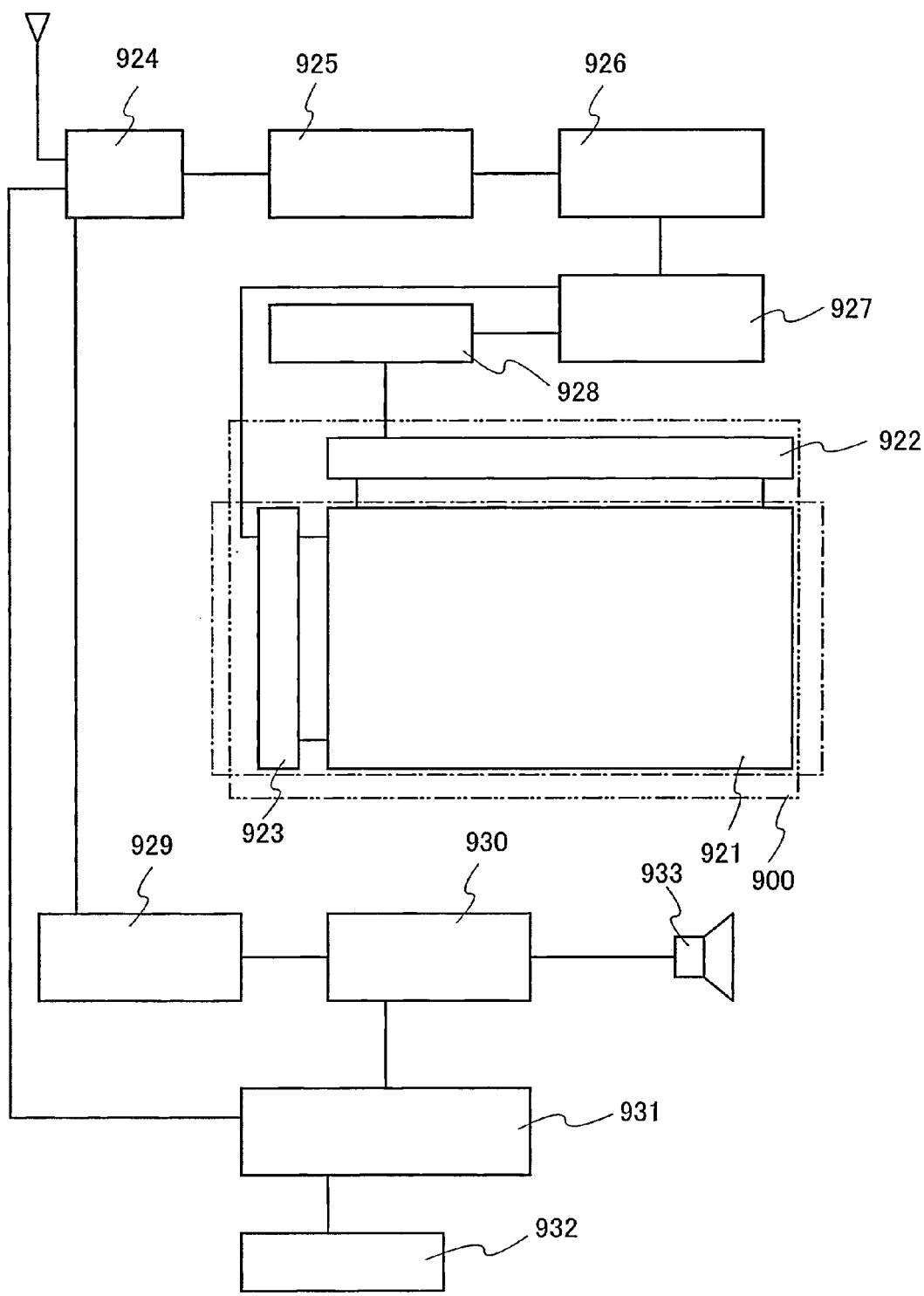
FIG. 38 is a diagram illustrating an electronic device having a display device of the present invention.

FIG. 38 is a block diagram showing a main structure of the television device. A pixel portion 901 is formed in a display panel 900. A signal line driver circuit 922 and a scanning line driver circuit 923 may be mounted on the display panel 900 by a COG method.

As other external circuits, a video signal amplifier circuit 925 that amplifies a video signal among signals received by a tuner 924, a video signal process circuit 926 that converts the signals output from the video signal amplifier circuit 925 into color signals corresponding to their respective colors of red, green, and blue, a control circuit 927 that converts the video signal so that the video signal can match input specification of the driver IC, and the like are provided on an input side of the video signal. The control circuit 927 outputs signals to both a scanning line side and a signal line side. In a case of digital driving, a signal divide circuit 928 may be provided on the signal line side and an input digital signal may be divided into in pieces and supplied.

Among signals received by the tuner 924, an audio signal is sent to an audio signal amplifier circuit 929 and is supplied to a speaker 933 through an audio signal process circuit 930. A control circuit 931 receives control information of a receiving station (reception frequency) or sound volume from an input portion 932 and transmits signals to the tuner 924 and the audio signal process circuit 930.

Needless to say, the present invention is not limited to a use for television devices, and can be applied to a variety of applications such as monitors of personal computers, or display media that have a large area, such as information display boards in railway stations, airports, and the like, or street-side advertisement display boards.

The display device described in any of the preceding embodiment modes is applied to the main screen 2003 and the sub-screen 2008, so that mass productivity of the television device can be improved.

Figure 37B:
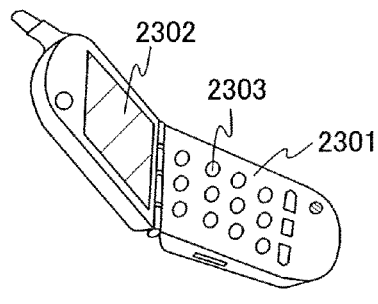

FIG. 37B illustrates one mode of a mobile phone 2301. The mobile phone 2301 includes a display portion 2302, an operation portion 2303, and the like. The display device described in any of the preceding embodiment modes is applied to the display portion 2302, so that mass productivity of the mobile phone can be improved.

Figure 37C:
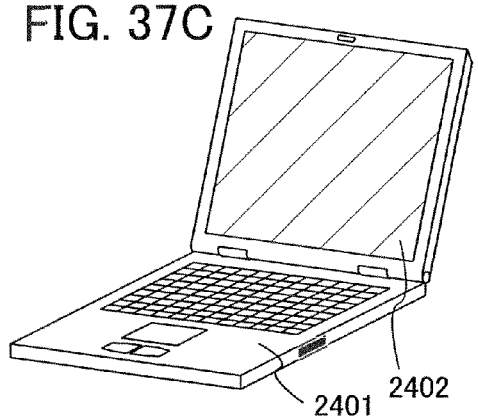

A portable computer illustrated in FIG. 37C includes a main body 2401, a display portion 2402, and the like. The display device described in any of the preceding embodiment modes is applied to the display portion 2402, so that mass productivity of the computer can be improved.

Figure 37D:
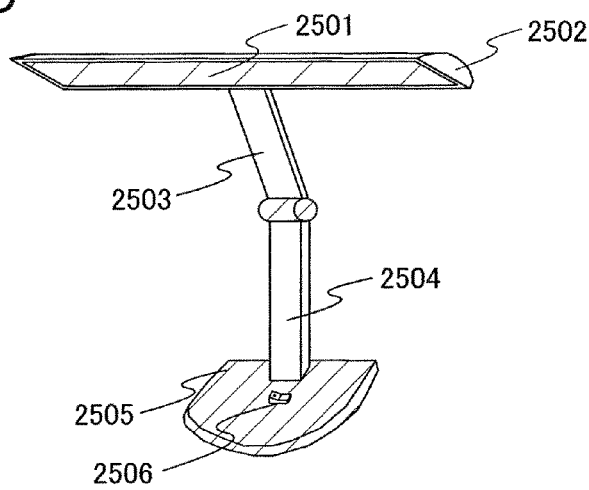

FIG. 37D illustrates a desk lamp including a lighting portion 2501, a lampshade 2502, an adjustable arm 2503, a support 2504, a base 2505, and a power supply 2506. The desk lamp is manufactured with the use of a light-emitting device of the present invention for the lighting portion 2501. The lighting equipment includes a ceiling light, a wall light, and the like in its category. Use of the light-emitting device shown in any of the preceding embodiment modes can improve mass productivity and thus can provide inexpensive desk lamps.

Embodiment 1

Figure 39:
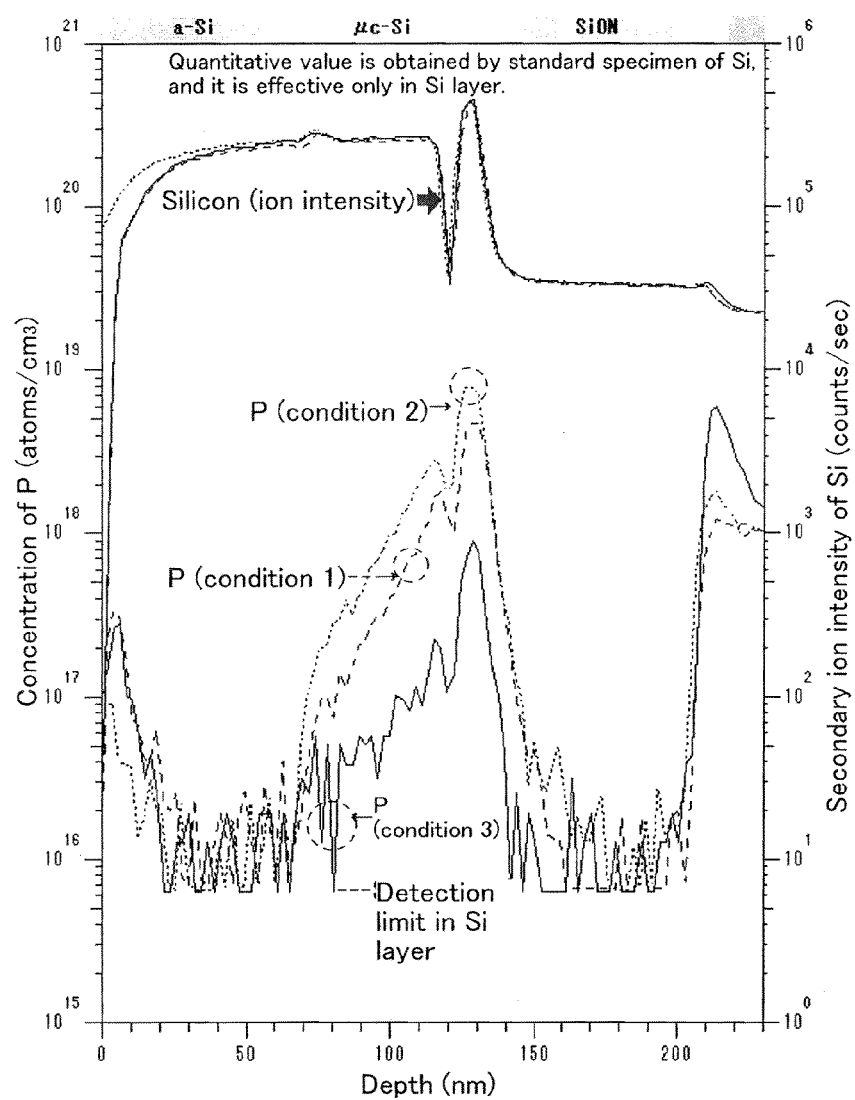
FIG. 39 is a graph illustrating a result of measuring phosphorus concentrations in microcrystalline silicon films of the present invention with SIMS.

A gate insulating film was formed over a glass substrate; flushing treatment was performed using phosphine, which is a gas including an impurity element which serves as a donor; then, a microcrystalline silicon film was formed. FIG. 39 shows a result of measuring peak concentrations of phosphorus by SIMS.

As the gate insulating film, a silicon oxynitride film with a thickness of 100 nm was formed over a glass substrate with a thickness of 0.7 mm by a plasma CVD method under the following condition: the RF power source frequency was 13.56 MHz; the power of the RF power source was 50 W; the film formation temperature was 280° C.; the flow rates of silane gas and dinitrogen monoxide were 30 sccm and 1200 sccm, respectively; and the pressure was 40 Pa.

Subsequently, gas including phosphine was introduced to a reaction chamber to perform flushing treatment. The conditions at this time were as follows:

flow rate of 0.1% $PH_3$(diluted with Ar): 500 sccm    (Condition 1)

flow rate of $SiH_4$: 100 sccm; flow rate of 0.5% $PH_3$
(diluted with $H_2$):170 sccm    (Condition 2)

flow rate of $SiH_4$: 100 sccm; flow rate of $H_2$: 153
sccm; flow rate of 0.5% $PH_3/H_2$: 17 sccm    (Condition 3)

Next, a microcrystalline silicon film with a thickness of 50 nm was formed over the gate insulating film by a plasma CVD method under the following condition: the RF power source frequency was 13.56 MHz; the power of the RF power source was 50 W; the film formation temperature was 280° C.; the flow rates of silane gas and hydrogen were 10 sccm and 1500 sccm, respectively; and the pressure was 280 Pa.

The substrate was carried out of the reaction chamber and the inside of the reaction chamber was cleaned with fluorine radicals. Then, the substrate was carried in the reaction chamber again.

Next, an amorphous silicon film was formed as a buffer layer over the microcrystalline silicon film. The amorphous silicon film was formed with a thickness of 100 nm over the microcrystalline silicon film by a plasma CVD method under the following condition: the RF power source frequency was 13.56 MHz; the power of the RF power source was 60 W; the film formation temperature was 280° C.; the flow rates of silane gas and hydrogen were 280 sccm and 300 sccm, respectively; and the pressure was 170 Pa. At this time, on each of the substrates which had undergone the flushing treatment under the conditions 1 to 3, secondary ion mass spectroscopy (SIMS) was performed in a direction of the depth from a surface of the substrate. FIG. 39 shows the measurement results.

In FIG. 39, a vertical axis represents a concentration (atoms/cm$^3$) of phosphorus and a horizontal axis represents a depth (nm) to which a sample was etched. Further, the film at depths of up to approximately 70 nm was the amorphous silicon film, which was the buffer layer; the film at depths of approximately 70 to 120 nm was the microcrystalline silicon film; and the film at depths of approximately 120 to 220 nm was the silicon oxynitride film, which was the gate insulating film.

Concentrations of phosphorus in the microcrystalline silicon films in FIG. 39 are presented below. The concentration of phosphorus at the interface between the microcrystalline silicon film and the silicon oxynitride film is excluded because the ionic strength of silicon is not in a normal condition at the peak of phosphorus concentration at the interface between the microcrystalline silicon film and the silicon oxynitride film.

| $5\times10^{16}$ to $2\times10^{18}$ atoms/cm$^3$ | Sample under Condition 1: |
| $6\times10^{16}$ to $3\times10^{18}$ atoms/cm$^3$ | Sample under Condition 2: |
| $3\times10^{16}$ to $2\times10^{17}$ atoms/cm$^3$ | Sample under Condition 3: |

As is seen from the above, by forming a microcrystalline silicon film after phosphine flushing treatment, the microcrystalline silicon film including phosphorus can be formed.

Embodiment 2

Figure 40:
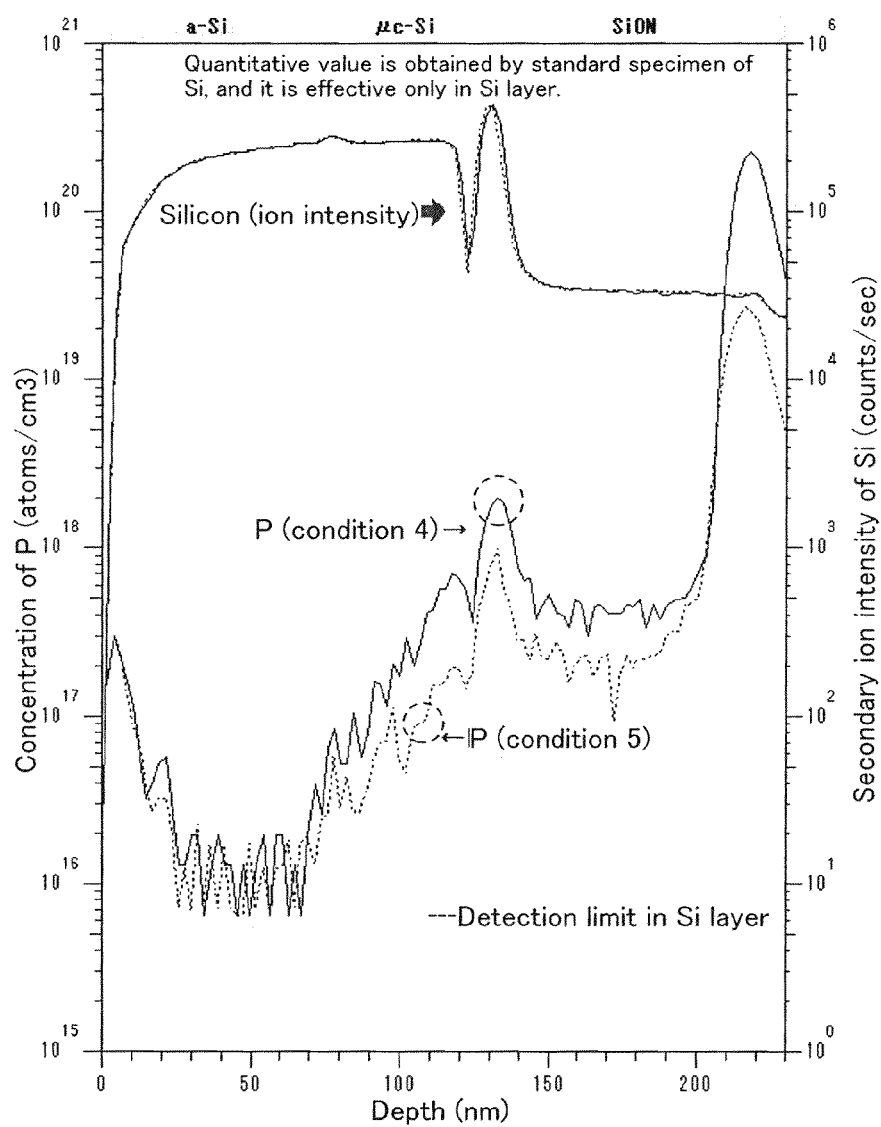
FIG. 40 is a graph illustrating a result of measuring phosphorus concentrations in microcrystalline silicon films of the present invention with SIMS.

A gate insulating film including phosphorus, which is an impurity element which serves as a donor, was formed over a glass substrate, and then a microcrystalline silicon film was formed. FIG. 40 shows a result of measuring peak concentrations of phosphorus by SIMS. Here, a silicon oxynitride film was formed as a first gate insulating film so as to include phosphorus, and a silicon oxynitride film was formed as a second gate insulating film.

As the first gate insulating film, a silicon oxynitride film including phosphorus with a thickness of 10 nm was formed over a glass substrate with a thickness of 0.7 mm by a plasma CVD method under the following condition: the RF power source frequency was 13.56 MHz; the power of the RF power source was 50 W; the film formation temperature was 280° C.; and the pressure was 40 Pa. The conditions of the flow rates of source gases were as follows:

flow rate of SiH$_4$: 30 sccm; flow rate of N$_2$O: 1200 sccm; flow rate of 0.5% PH$_3$(diluted with H$_2$): 60 sccm  (Condition 4)

flow rate of SiH$_4$: 30 sccm; flow rate of N$_2$O: 1200 sccm; flow rate of 0.5% PH$_3$(diluted with H$_2$): 6 sccm  (Condition 5)

Subsequently, the second gate insulating film was formed over the first gate insulating film. As the second gate insulating film, a silicon oxynitride film with a thickness of 100 nm was formed over the glass substrate by a plasma CVD method under the following condition: the RF power source frequency was 13.56 MHz; the power of the RF power source was 50 W; the film formation temperature was 280° C.; the flow rates of silane gas and dinitrogen monoxide were 30 sccm and 1200 sccm, respectively; and the pressure was 40 Pa.

Next, as a microcrystalline silicon film, a microcrystalline silicon film with a thickness of 50 nm was formed over the gate insulating film by a plasma CVD method under the following condition: the RF power source frequency was 13.56 MHz; the power of the RF power source was 50 W; the film formation temperature was 280° C.; the flow rates of silane gas and hydrogen were 10 sccm and 1500 sccm, respectively; and the pressure was 280 Pa.

The substrate was carried out of the reaction chamber and the inside of the reaction chamber was cleaned with fluorine radicals. Then, the substrate was carried in the reaction chamber again.

Next, an amorphous silicon film was formed as a buffer layer over the microcrystalline silicon film. The amorphous silicon film was formed with a thickness of 100 nm over the microcrystalline silicon film by a plasma CVD method under the following condition: the RF power source frequency was 13.56 MHz; the power of the RF power source was 60 W; the film formation temperature was 280° C.; the flow rates of silane gas and hydrogen were 280 sccm and 300 sccm, respectively; and the pressure was 170 Pa. At this time, on each of the substrates over which the first gate insulating film had been formed under the conditions 4 and 5, secondary ion mass spectroscopy (SIMS) was performed in a direction of the depth from a surface of the substrate. FIG. 40 shows the measurement results.

In FIG. 40, a vertical axis represents a concentration (atoms/cm$^3$) of phosphorus and a horizontal axis represents a depth (nm) to which a sample was etched. Further, the film at depths of up to approximately 70 nm was the amorphous silicon film, which was the buffer layer; the film at depths of approximately 70 to 120 nm was the microcrystalline silicon film; and the film at depths of approximately 120 to 220 nm was the silicon oxynitride film, which was the gate insulating film.

Concentrations of phosphorus in the microcrystalline silicon films in FIG. 40 are presented below. The concentration of phosphorus at the interface between the microcrystalline silicon film and the silicon oxynitride film is excluded because the ionic strength of silicon is not in a normal condition at the peak of phosphorus concentration at the interface between the microcrystalline silicon film and the silicon oxynitride film.

| $3\times10^{16}$ to $7\times10^{17}$ atoms/cm$^3$ | Sample under Condition 4: |
| $3\times10^{16}$ to $2\times10^{17}$ atoms/cm$^3$ | Sample under Condition 5: |

Although the concentration of phosphorus in the silicon oxynitride film cannot be measured accurately in FIG. 40 because it was quantified with the use of a silicon standard sample, the peak form makes it possible to estimate whether phosphorus was included or not. There is a large peak of the phosphorus concentration also at depths of 200 to 230 nm, which demonstrates that the gate insulating film, which was not in contact with the microcrystalline silicon film, included phosphorus.

As is seen from the above, by forming a microcrystalline silicon film after forming a gate insulating film including phosphorus, the microcrystalline silicon film and the gate insulating film can include phosphorus. In other words, the gate insulating film and the microcrystalline silicon film that include phosphorus can be formed.

Embodiment 3

Figure 41:
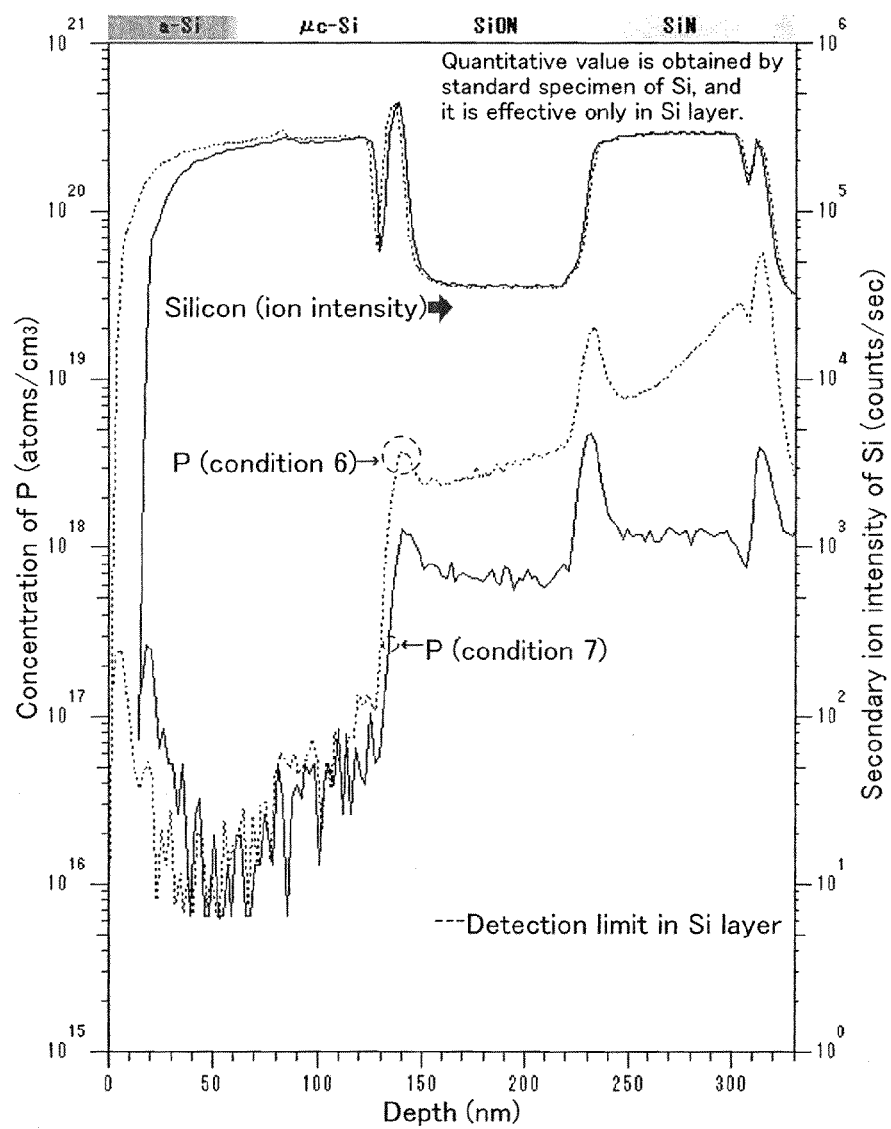
FIG. 41 is a graph illustrating a result of phosphorus concentrations in microcrystalline silicon films of the present invention with SIMS.

After precoating the inside of a reaction chamber of a plasma CVD apparatus with a protective film, a glass substrate was carried in the reaction chamber, and a first gate insulating film, a second gate insulating film, a microcrystalline silicon film, and an amorphous silicon film for functioning as a buffer layer were formed. FIG. 41 shows a result of measuring peak concentrations of phosphorus by SIMS. Here, a silicon nitride film was formed as the first gate insulating film, and a silicon oxynitride film was formed as the second gate insulating film.

The inside of the reaction chamber was precoated with the protective film. The condition at this time was as follows:
(Condition 6)

An amorphous silicon film including phosphorus with a thickness of 50 nm was formed as the protective film on an inner wall of a reaction chamber under the following condition: the RF power source frequency was 13.56 MHz; the power of the RF power source was 370 W; and the pressure was 170 Pa. Further, the conditions of the flow rates of source gases were as follows:

flow rate of SiH$_4$: 100 sccm; flow rate of 0.5% PH$_3$ (diluted with H$_2$): 170 sccm  (Condition 6)

(Condition 7)

A silicon nitride film, a silicon oxynitride film, and an amorphous silicon film were stacked as the protective film. At this time, the silicon nitride film was formed with a thickness of 110 nm on an inner wall of a reaction chamber under the following condition: the RF power source frequency was 13.56 MHz; the power of the RF power source was 370 W; the flow rates of silane, hydrogen, nitrogen, and ammonia were 10 sccm, 500 sccm, 550 sccm, and 140 sccm, respectively; and the pressure was 100 Pa. Further, the silicon oxynitride film was formed with a thickness of 110 nm over the silicon nitride film by a plasma CVD method under the following condition: the RF power source frequency was 13.56 MHz; the power of the RF power source was 50 W; the film formation temperature was 280° C.; the flow rates of silane gas and dinitrogen monoxide were 30 sccm and 1200 sccm, respectively; and the pressure was 40 Pa. Furthermore, the amorphous silicon film was formed with a thickness of 200 nm over the silicon oxynitride film by a plasma CVD method under the following condition: the RF power source frequency was 13.56 MHz; the power of the RF power source was 120 W; the film formation temperature was 280° C.; the flow rate of silane gas was 300 sccm; and the pressure was 170 Pa.

Subsequently, a substrate (a glass substrate with a thickness of 0.7 mm) was carried in the reaction chamber, and then as the first gate insulating film, a silicon nitride film with a thickness of 100 nm was formed over the glass substrate by a plasma CVD method under the following condition: the RF power source frequency was 13.56 MHz; the power of the RF power source was 370 W; the film formation temperature was 280° C.; the flow rates of silane, hydrogen, nitrogen, and ammonia were 10 sccm, 500 sccm, 550 sccm, and 140 sccm, respectively; and the pressure was 100 Pa.

Then, the second gate insulating film was formed over the first gate insulating film. As the second gate insulating film, a silicon oxynitride film with a thickness of 100 nm was formed over the first gate insulating film by a plasma CVD method under the following condition: the RF power source frequency was 13.56 MHz; the power of the RF power source was 50 W; the film formation temperature was 280° C.; the flow rates of silane gas and dinitrogen monoxide were 30 sccm and 1200 sccm, respectively; and the pressure was 40 Pa.

Next, a microcrystalline silicon film with a thickness of 50 nm was formed over the gate insulating film by a plasma CVD method under the following condition: the RF power source frequency was 13.56 MHz; the power of the RF power source was 50 W; the film formation temperature was 280° C.; the flow rates of silane gas and hydrogen were 10 sccm and 1500 sccm, respectively; and the pressure was 280 Pa.

The substrate was carried out of the reaction chamber and the inside of the reaction chamber was cleaned with fluorine radicals. Then, the substrate was carried in the reaction chamber again.

Next, an amorphous silicon film was formed as a buffer layer over the microcrystalline silicon film. The amorphous silicon film was formed with a thickness of 100 nm over the microcrystalline silicon film by a plasma CVD method under the following condition: the RF power source frequency was 13.56 MHz; the power of the RF power source was 60 W; the film formation temperature was 280° C.; the flow rates of silane gas and hydrogen were 280 sccm and 300 sccm, respectively; and the pressure was 170 Pa. At this time, on each of the substrates over which the films were formed in the reaction chamber which had undergone precoating under the conditions 6 and 7, secondary ion mass spectroscopy (SIMS) was performed in a direction of the depth from a surface of the substrate. FIG. 41 shows the measurement results.

In FIG. 41, a vertical axis represents a concentration (atoms/cm$^3$) of phosphorus and a horizontal axis represents a depth (nm) to which a sample was etched. Further, the film at depths of up to approximately 70 nm was the amorphous silicon film, which was the buffer layer; the film at depths of approximately 70 to 120 nm was the microcrystalline silicon film; and the film at depths of approximately 120 to 220 nm was the silicon oxynitride film, which was the gate insulating film.

Concentrations of phosphorus in the microcrystalline silicon films in FIG. 41 are presented below. The concentration of phosphorus at the interface between the microcrystalline silicon film and the silicon oxynitride film is excluded because the ionic strength of silicon is not in a normal condition at the peak of phosphorus concentration at the interface between the microcrystalline silicon film and the silicon oxynitride film.

| | |
|---|---|
| $5 \times 10^{16}$ to $1 \times 10^{17}$ atoms/cm$^3$ | Sample under Condition 6: |
| $3 \times 10^{16}$ to $5 \times 10^{16}$ atoms/cm$^3$ | Sample under Condition 7: |

As is seen from the above, by forming a gate insulating film and a microcrystalline silicon film after precoating an inside of a reaction chamber of a plasma CVD apparatus with an amorphous silicon film including phosphorus as a protective film, the microcrystalline silicon film can include phosphorus.

Embodiment 4

In this embodiment, the lifetime of carriers which are included in a microcrystalline silicon film formed over an insulating film was measured. An influence of the insulating film on the microcrystalline silicon film is described below.

Figure 42A:
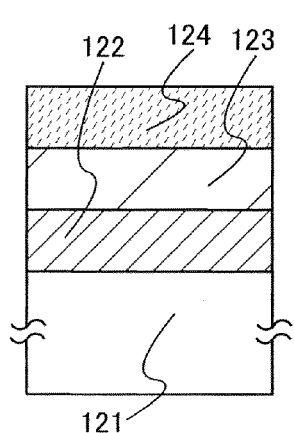
FIGS. 42A to 42E are drawings illustrating structures of Samples 1 to 5, respectively.

FIG. 42A shows a cross-sectional structure of Sample 1. A silicon nitride film 122 with a thickness of 110 nm was formed over a glass substrate 121; a silicon oxynitride film 123 with a thickness of 110 nm was formed thereover; and a microcrystalline silicon film 124 with a thickness of 95 nm was formed thereover.

Figure 42B:
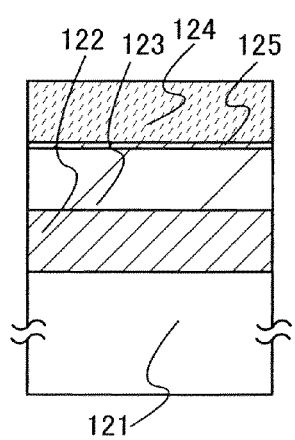

FIG. 42B shows a cross-sectional structure of Sample 2. A silicon nitride film 122 with a thickness of 110 nm was formed over a glass substrate 121; a silicon oxynitride film 123 with a thickness of 110 nm was formed thereover; a silicon nitride film 125 with a thickness of 1 nm was formed thereover; and a microcrystalline silicon film 124 with a thickness of 95 nm was formed thereover.

Figure 42C:
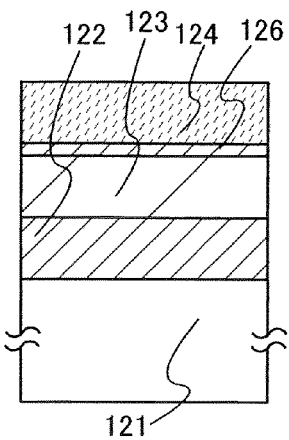

FIG. 42C shows a cross-sectional structure of Sample 3. A silicon nitride film 122 with a thickness of 110 nm was formed over a glass substrate 121; a silicon oxynitride film 123 with a thickness of 110 nm was formed thereover; a silicon nitride film 126 with a thickness of 3 nm was formed thereover; and a microcrystalline silicon film 124 with a thickness of 95 nm was formed thereover.

Figure 42D:
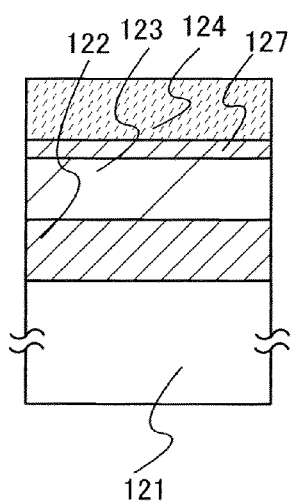

FIG. 42D shows a cross-sectional structure of Sample 4. A silicon nitride film 122 with a thickness of 110 nm was formed over a glass substrate 121; a silicon oxynitride film 123 with a thickness of 110 nm was formed thereover; a silicon nitride film 127 with a thickness of 5 nm was formed thereover; and a microcrystalline silicon film 124 with a thickness of 95 nm was formed thereover.

Figure 42E:
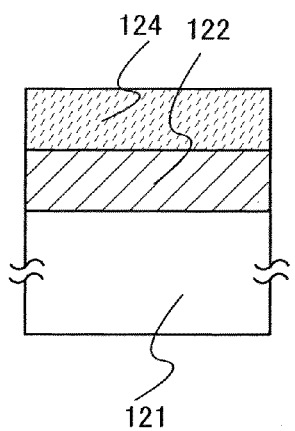

FIG. 42E shows a cross-sectional structure of Sample 5. A silicon nitride film 122 with a thickness of 110 nm was formed over a glass substrate 121, and a microcrystalline silicon film 124 with a thickness of 95 nm was formed thereover.

The silicon nitride film 122 was formed under a similar condition to that of the silicon nitride film which was formed as the first gate insulating film in Embodiment 3. Further, the silicon oxynitride film 123 was formed under a similar condition to that of the silicon oxynitride film which was formed as the second gate insulating film in Embodiment 3. Furthermore, the microcrystalline silicon film 124 was formed under a similar condition to that of the microcrystalline silicon film in Embodiment 3. Still furthermore, the silicon nitride films 125 to 127 were formed under a similar condition to that of the silicon nitride film 122.

In Samples 1 to 5, the lifetime of carriers included in the microcrystalline silicon film was measured by a microwave photoconductivity decay method (a μ-PCD method). In the μ-PCD method, the microcrystalline silicon film was irradiated with pulsed laser beams to measure the lifetime of carriers from when an excessive amount of carriers are generated in the microcrystalline silicon film and until when the carriers are recombined and disappear. Generation of the carriers increases the conductivity of the microcrystalline silicon film, and thus the reflectance of microwaves with which the microcrystalline silicon film is irradiated changes in accordance with the excessive carrier density. The time of decrease in the reflectance of the microwaves is measured, whereby the lifetime of carriers can be measured.

Figure 43:
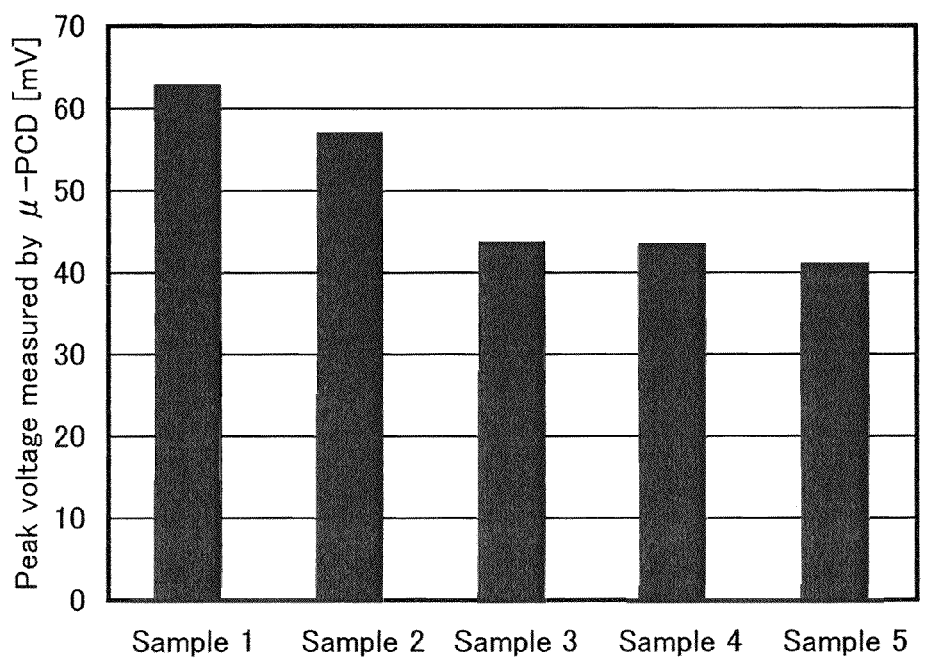
FIG. 43 is a graph illustrating a result of measuring lifetime of carriers in microcrystalline silicon films by a μ-PCD method.

In this embodiment, with the use of a crystallinity evaluation equipment for a thin polysilicon film in which microwaves are used (produced by KOBELCO RESEARCH INSTITUTE, INC.), Samples 1 to 5 were irradiated with microwaves with a frequency of 13.56 MHz and with third harmonics of a YLG laser with a wavelength of 349 nm, and the phase contrast of the microwaves, which changes according to generation of carriers, was measured with a voltmeter for measuring a phase contrast of microwaves. FIG. 43 shows the measurement result. The peak of the measured values is steep and thus the time of disappearance caused by carrier recombination cannot be measured. However, as the peak value is higher, the lifetime of carriers is relatively longer and the crystallinity is better. Thus, the lifetime of carriers in the above samples was compared with each other with the use of the peak values.

FIG. 43 demonstrates that in Sample 1, i.e., in a sample in which a base film for the microcrystalline silicon film is a silicon oxynitride film, the peak value is higher and the lifetime is longer than a sample in which a base film is a silicon nitride film; further, the lifetime of carriers is long also in the case where a highly thin silicon nitride film is formed over the silicon oxynitride film. This demonstrates that: the number of carrier recombination centers is small; the number of defects is small; and the crystallinity is high when a silicon oxynitride film is formed as the base film for the microcrystalline silicon film or when a highly thin silicon nitride film is formed over the silicon oxynitride film as the base film for the microcrystalline silicon film. Therefore, a thin film transistor utilizing such a stacked-layer structure can have a higher on-current and a lower off-current, and thus can have excellent current-voltage characteristics.

Embodiment 5

This embodiment presents calculation results of a donor concentration of a microcrystalline semiconductor film including an impurity element which functions as the donor in a thin film transistor, and of electric characteristics of the thin film transistor.

Here, a microcrystalline semiconductor film to which an impurity element is not added is referred to as μc-Si (i); a microcrystalline semiconductor film to which an impurity element (e.g., phosphorus) which serves as a donor is added is referred to as μc-Si (n−); a buffer layer to which an impurity element is not added is referred to as a-Si (i); an amorphous semiconductor film to which an impurity element (e.g., phosphorus) imparting one conductivity type is added is referred to as a-Si (n−); and an amorphous semiconductor film to which a large amount of impurity element (e.g., phosphorus) imparting one conductivity type is added so that the amorphous semiconductor film can have conductivity is referred to as a-Si (n+).

When an impurity element is added to a microcrystalline semiconductor film or an amorphous semiconductor film, the impurity concentration is defined as the number of atoms of the added impurity element per unit volume. Further, if the added impurity element is a fifth group element or a third group element, the impurity concentration is multiplied by the activation rate, which is defined as the donor concentration or the acceptor concentration. The activation rate of a microcrystalline semiconductor film is from 40 to 60%, typically 50%; the activation rate of an amorphous semiconductor film is from 1 to 5%, typically 3%. Therefore, the peak concentration of the impurity element which serves as a donor is two times as high as the donor concentration which was calculated in this embodiment.

A device model which was used for the simulation is described below.

A device simulator "ATLAS" developed by Silvaco Data Systems Inc. was used for the device simulation. Table 1 shows model parameter of a-Si and μc-Si, which were used for the device simulation. In the device simulation, modeling of a-Si and μc-Si was achieved mainly by defining the state density. Specifically, the model parameter of a-Si was determined by defining such parameter as shown in Table 1 as appropriate, and the DC characteristics of an inverted-staggered a-Si TFT was calculated with the use of a device simulator. Further, the model parameter of μc-Si was defined so that the maximum filed effect mobility which was determined by the DC characteristics of the inverted-staggered μc-Si TFT which was calculated with a device simulator may be approximately 10 times as high as the maximum filed effect mobility which was determined by the DC characteristics of the inverted-staggered a-Si TFT which was calculated with a device simulator.

TABLE 1

| | | a-Si | μc-Si |
|---|---|---|---|
| Energy gap | Eg [eV] | 1.9 | 1.4 |
| Density of states (DOS) of acceptor in edge of conduction band | nta [/eV] | 7.4E+21 | 7.4E+20 |
| DOS of donor in valence band | ntd [/eV] | 7.4E+21 | 7.4E+20 |
| Attenuation coefficient of DOS of acceptor in edge of conduction band | wta | 0.04 | 0.04 |
| Attenuation coefficent of DOS of donor in valence band | wtd | 0.04 | 0.04 |
| Total DOS of acceptor level in Gaussian distribution | nga [/eV] | 3E+16 | 7E+15 |
| Total DOS of donor level in Gaussian distribution | ngd [/eV] | 5E+18 | 5E+17 |
| Peak energy of acceptor level in Gaussian distribution | ega [eV] | 0.5 | 0.5 |
| Peak energy of donor level in Gaussian distribution | egd [eV] | 0.9 | 0.9 |
| Attenumation coefficient of total DOS of acceptor level in Gaussian distribution | wga | 0.4 | 0.4 |
| Attenumation coefficient of total DOS of donor level in Gaussian distribution | wgd | 0.3 | 0.3 |

Figure 44:
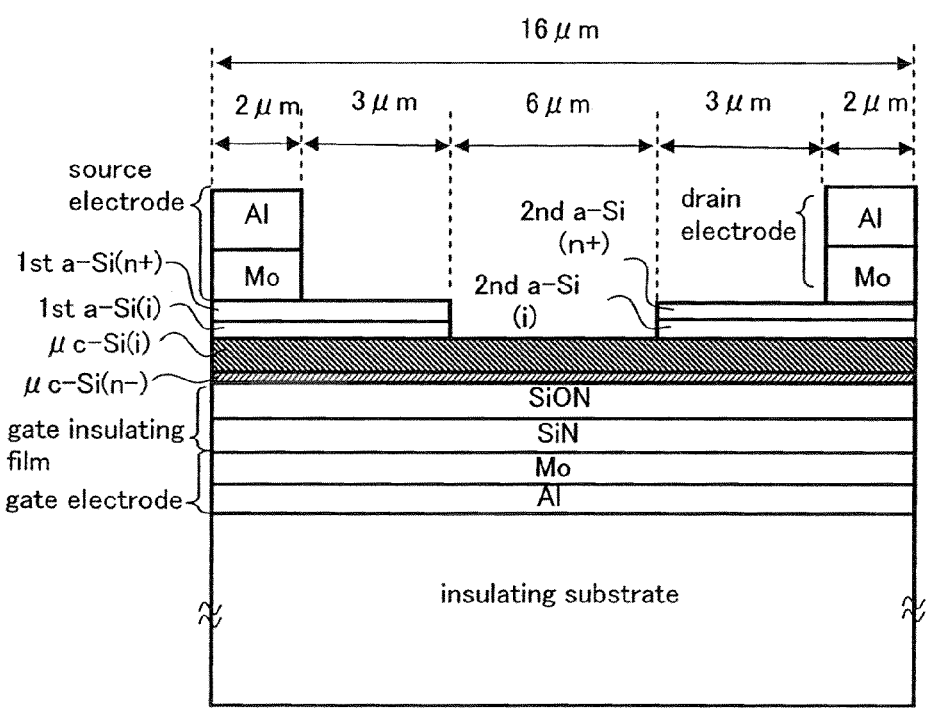
FIG. 44 is a cross-sectional view illustrating a model used for simulation.

Next, FIG. 44 shows a structure of a device which was used for the simulation.

An insulating substrate is used, which is assumed to be a glass substrate (with a thickness of 0.5 µm) including silicon oxide (with a dielectric constant of 4.1) as its main component. Although an insulating substrate with a thickness of 0.5 mm, 0.7 mm, or the like is often used in an actual manufacturing process, the thickness of the insulating substrate is defined so as to be sufficiently large so that an electric field at a lower surface of the insulating substrate does not have influence on the TFT characteristics, in consideration of calculation efficiency.

A gate electrode with a stacked-layer structure of aluminum (Al) and molybdenum (Mo) (with a total thickness of 150 nm) is formed over the insulating substrate. The work function of molybdenum (Mo) is assumed to be 4.6 eV. In the device structure shown in FIG. 44, the TFT characteristics do not depend on the material of a lower layer (aluminum (Al) in this case) of the gate electrode. For the above reason, calculation was performed on the assumption that the gate electrode is formed of only molybdenum (Mo) (with a thickness of 150 nm) for sake of simplification of the calculation.

A gate insulating film with a stacked-layer structure of a silicon nitride film (with a dielectric constant of 7.0 and a thickness of 110 nm) and a silicon oxynitride film (with a dielectric constant of 4.1 and a thickness of 110 nm) is formed over the gate electrode.

A µc-Si (n−) (with a thickness varied to be 10 nm, 20 nm, and 50 nm; and a donor concentration varied to be $1 \times 10^{15}$ to $5 \times 10^{17}$ atoms/cm$^3$) and a µc-Si (i) (with a thickness varied to be 90 nm, 80 nm, and 50 nm) are stacked over the gate insulating film. Over the µc-Si (i), further, a first a-Si (i) (with a thickness of 50 nm) is formed on the left and a second a-Si (i) (with a thickness of 50 nm) is formed on the right.

A first a-Si (n+) (with a thickness of 50 nm) and a second a-Si (n+) (with a thickness of 50 nm) are formed over the first a-Si (i) and the second a-Si (i), respectively. In FIG. 44, the distance between the first a-Si (n+) and the second a-Si (n+) is the channel length L of the TFT. In this case, it is assumed that the channel length L=6 [µm], and that the donor concentration in the first a-Si (n+) and the second a-Si (n+) is $1 \times 10^{19}$ atoms/cm$^3$ and thus the first a-Si (n+) and the second a-Si (n+) have high conductivity.

A source electrode and a drain electrode that have a stacked-layer structure (with a thickness of 300 nm) of molybdenum (Mo) and aluminum (Al) are formed over the first a-Si (n+) and the second a-Si (n+), respectively. It is assumed that ohmic contact is formed between the molybdenum and each of the first a-Si (n+) and the second a-Si (n+). In the device structure shown in FIG. 44, the TFT characteristics do not depend on the material of an upper layer (aluminum (Al) in this case) of the source electrode and the drain electrode. For the above reason, calculation was performed on the assumption that the source and drain electrodes are formed of only molybdenum (Mo) (with a thickness of 300 nm) for sake of simplification of the calculation.

Results of the device simulation are presented below. FIG. 45A, FIG. 46A, FIG. 47A, FIG. 48A, FIG. 49A, FIG. 50A, and FIG. 51A each show a simulation result where Vd=1 V. FIG. 45B, FIG. 46B, FIG. 47B, FIG. 48B, FIG. 49B, FIG. 50B, and FIG. 51B each show a simulation result where Vd=14 V.

Figure 45A:
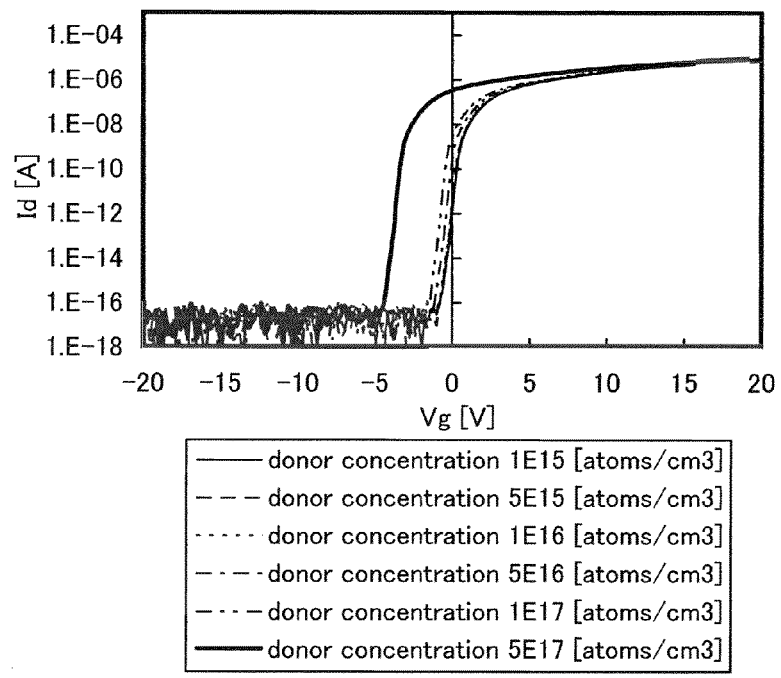
FIGS. 45A and 45B are graphs showing DC characteristics which are calculated by simulation.
Figure 45B:
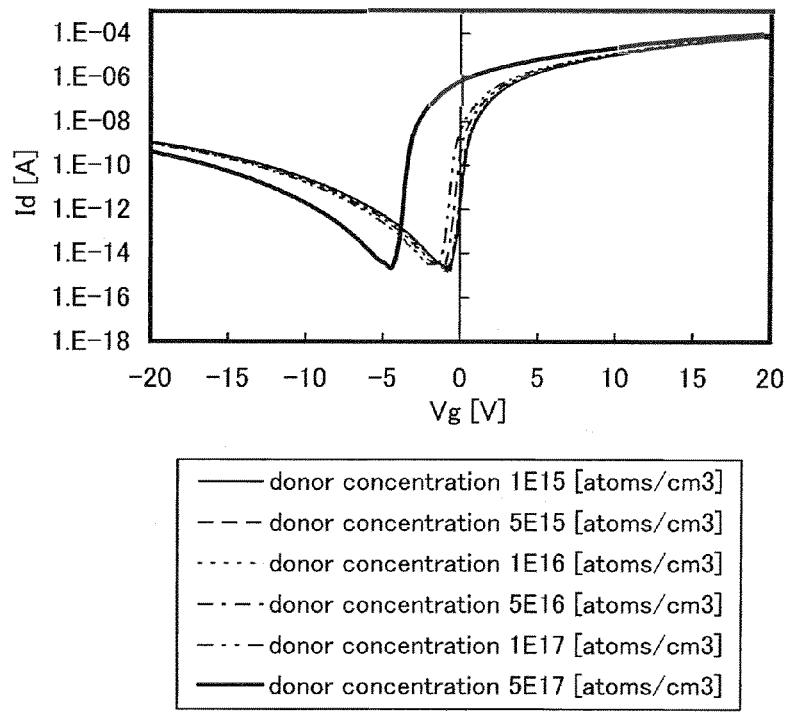
Figure 46A:
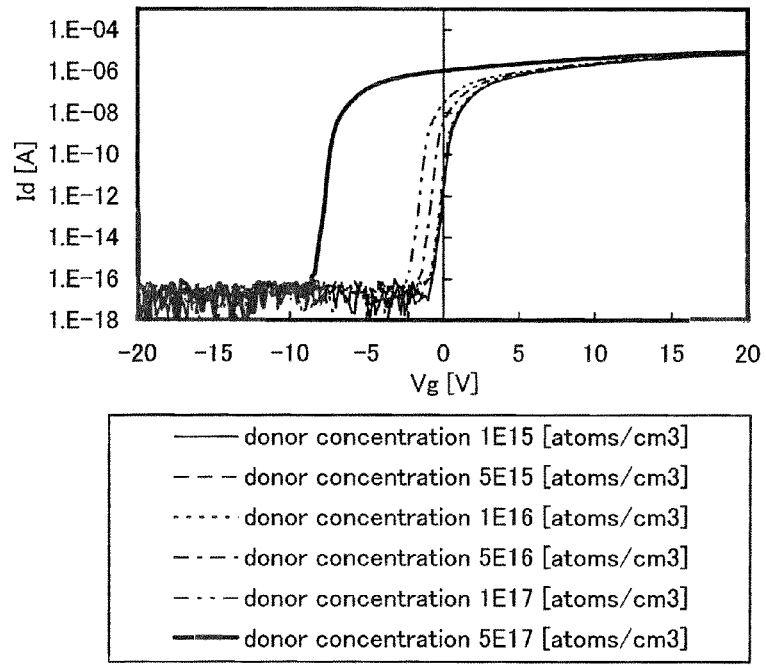
FIGS. 46A and 46B are graphs showing DC characteristics which are calculated by simulation.
Figure 46B:
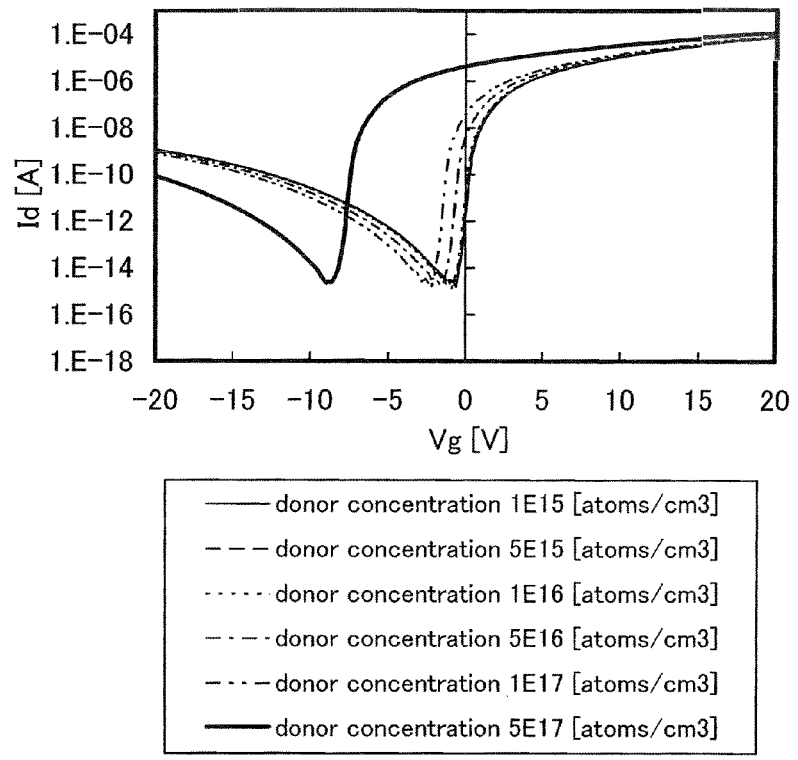
Figure 47A:
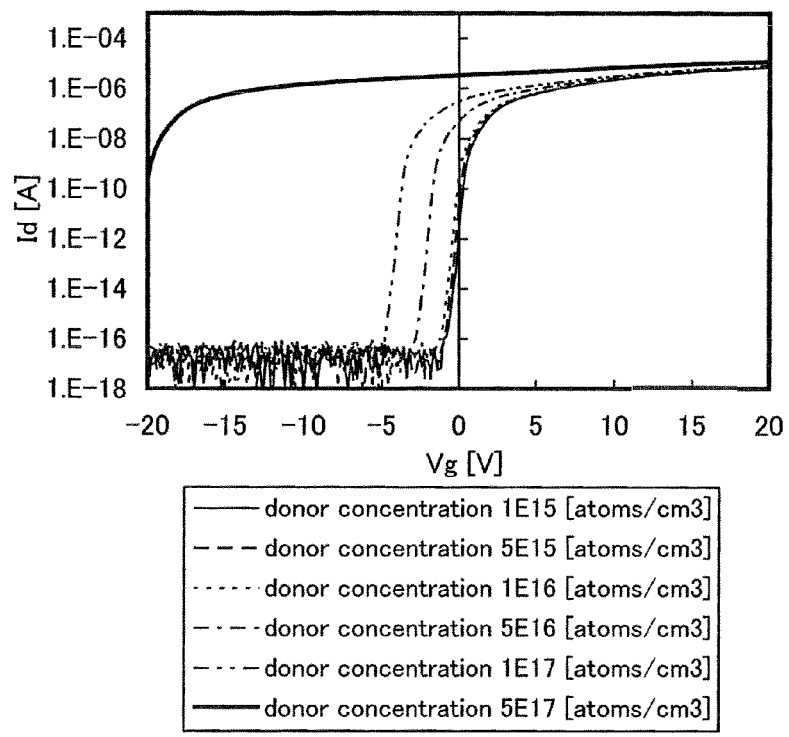
FIGS. 47A and 47B are graphs showing DC characteristics which are calculated by simulation.
Figure 47B:
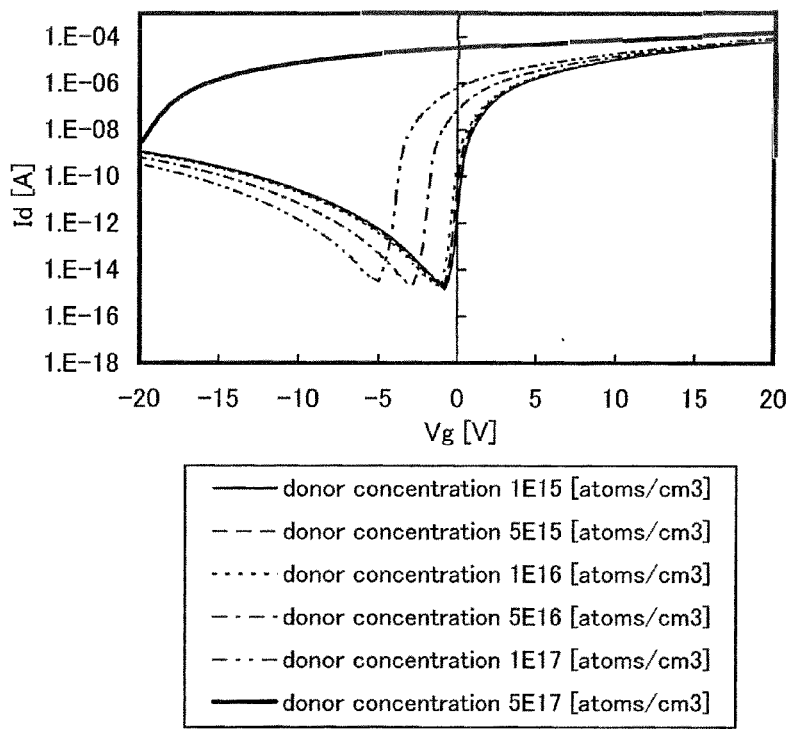

FIGS. 45A and 45B, FIGS. 46A and 46B, FIGS. 47A and 47B, FIGS. 48A and 48B, FIGS. 49A and 49B, FIGS. 50A and 50B, and FIGS. 51A and 51B show the results of the DC characteristics (Vg-Id characteristics; Vd=1 V, 14 V) when the device simulation was performed as the thickness of the µc-Si (n−) and the µc-Si (i), and the donor concentration in the µc-Si (n−) are changed. In FIGS. 45A and 45B, the thickness of the µc-Si (n−) was set to be 10 nm and that of the a-Si (i) was set to be 90 nm. Further, in FIGS. 46A and 46B, the thickness of the µc-Si (n−) was set to be 20 nm and that of the a-Si (i) was set to be 80 nm. Furthermore, in FIGS. 47A and 47B, the thickness of the µc-Si (n−) was set to be 50 nm and that of the a-Si (i) was set to be 50 nm. FIGS. 48A and 48B, FIGS. 49A and 49B, FIGS. 50A and 50B, and FIGS. 51A and 51B show results of on-current, threshold voltage, subthreshold swing, and maximum filed effect mobility, respectively.

Vg-Id characteristics are presented below based on the result of the device simulation.

A shift in the threshold voltage which is caused by adding an impurity element to a semiconductor layer corresponds to a minus shift in the Id curve in the direction of the Vg axis which is caused by increasing the donor concentration in the Vg-Id characteristics. FIGS. 45A and 45B, FIGS. 46A and 46B, and FIGS. 47A and 47B, which show the above calculation results, apparently show such a tendency. Furthermore, a larger thickness of the semiconductor layer to which the impurity element is added leads to a further minus shift of the Id curve in the direction of the Vg axis, which is caused by the fact that the total number of donors increases and the number of donor levels increases, whereby the Fermi energy comes to be closer to the conduction band energy Ec; i.e., by the fact that an inversion layer can be formed at lower gate potential.

On-current is presented below based on the result of the device simulation.

Figure 48A:
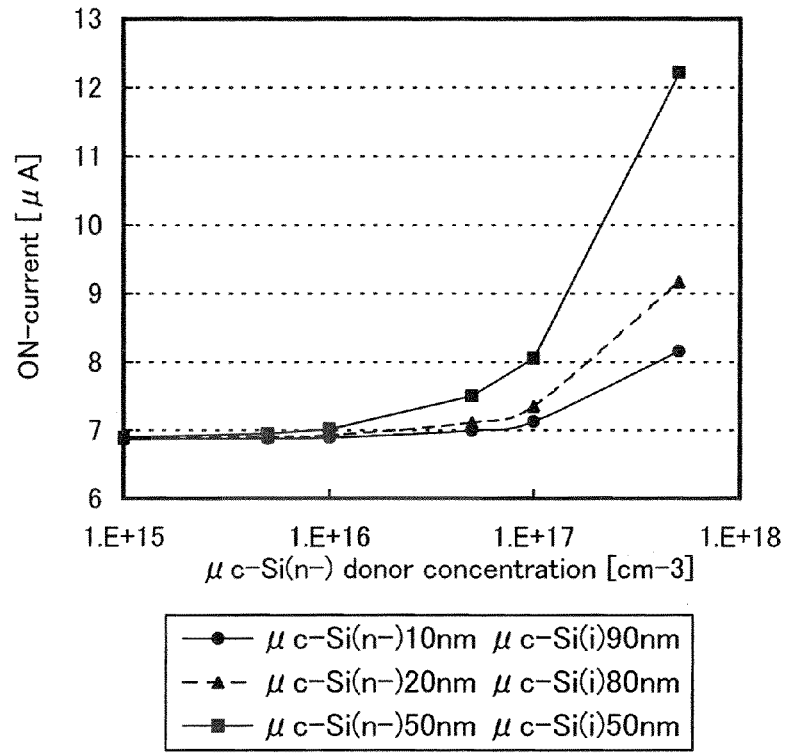
FIGS. 48A and 48B are graphs showing on-currents which are calculated by simulation.
Figure 48B:
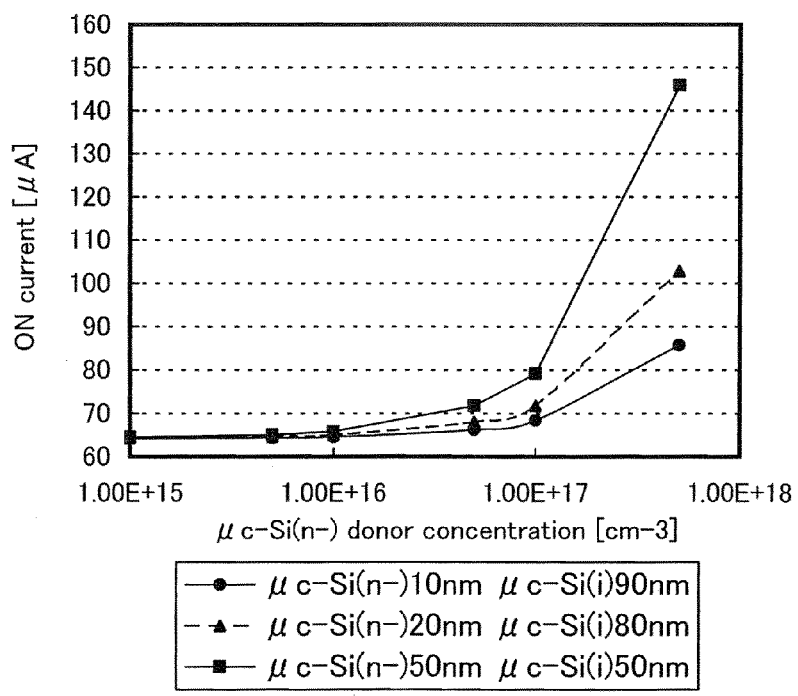

As is apparent from FIGS. 45A and 45B, FIGS. 46A and 46B, and FIGS. 47A and 47B, the drain current Id is a monotone increasing function with respect to the gate voltage Vd in an on state. The reason is that the number of conduction electrons in the semiconductor layer which are induced at an interface between the semiconductor layer and the gate insulating film increases as the gate voltage Vg increases. Therefore, when an increase in the donor concentration shifts the Id curve toward the minus side in the direction of the Vg axis, the on-current (the drain current when the gate voltage Vg is 20 V) increases. Although the drain current is reduced by an impurity diffusion, an increase in the number of the conduction electrons contributes more to the drain current, and as a result, the drain current increases. Further, a larger thickness of the semiconductor layer to which the impurity element is added leads to an increase in a portion of the semiconductor layer which contributes to the conductivity. Thus, the on-current increases. FIGS. 48A and 48B, which show the above calculation results, apparently show such a tendency.

When the donor concentration is $1 \times 10^{15}$ atoms/cm$^3$, it can be considered that the microcrystalline semiconductor film substantially does not include a donor, i.e., an impurity element which serves as a donor. FIGS. 48A and 48B demonstrate that the donor in the microcrystalline semiconductor film increases the on-current.

Threshold voltages are presented below based on the result of the device simulation.

Figure 49A:
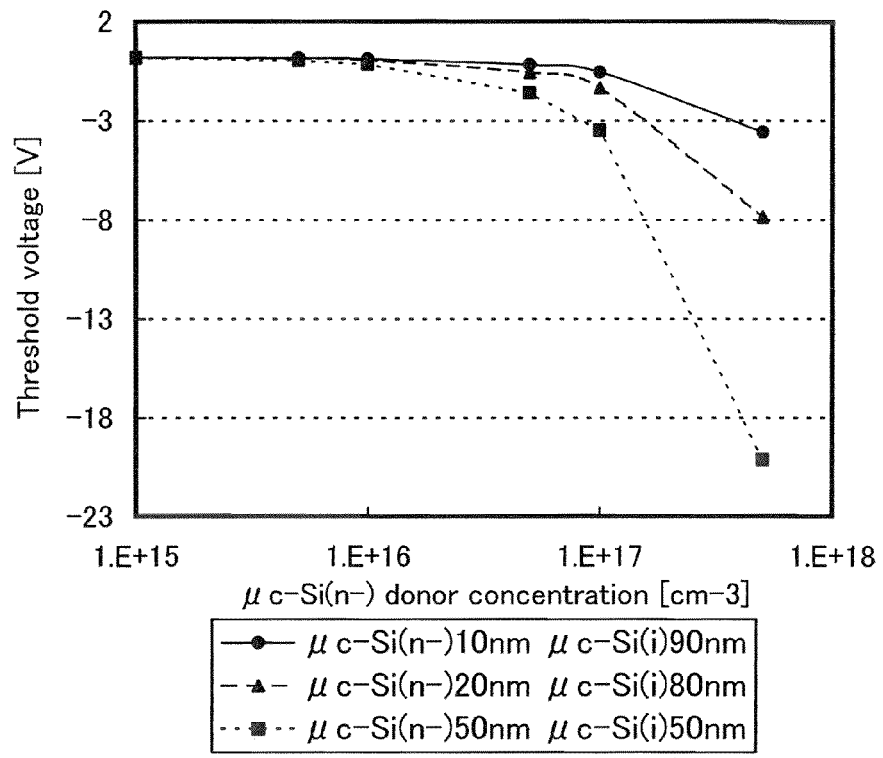
FIGS. 49A and 49B are graphs showing threshold values which are calculated by simulation.
Figure 49B:
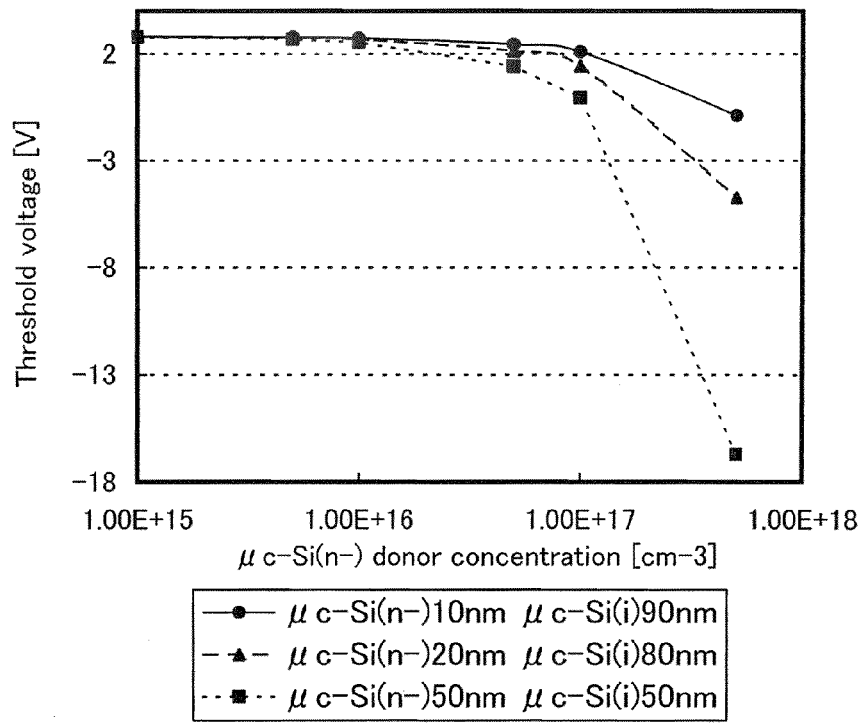

An increase in the donor concentration shifts the threshold voltage toward the minus side. FIGS. 49A and 49B, which show the above calculation results, apparently show such a tendency. Further, a larger thickness of the semiconductor layer to which the impurity element is added leads to a further shift of the threshold voltage toward the minus side, which is caused by the fact that the total number of donors increases and the number of donor levels increases, whereby the Fermi energy comes to be closer to the conduction band energy Ec; i.e., by the fact that an inversion layer can be formed at lower gate potential.

Subthreshold swings are presented below based on the result of the device simulation.

Figure 50A:
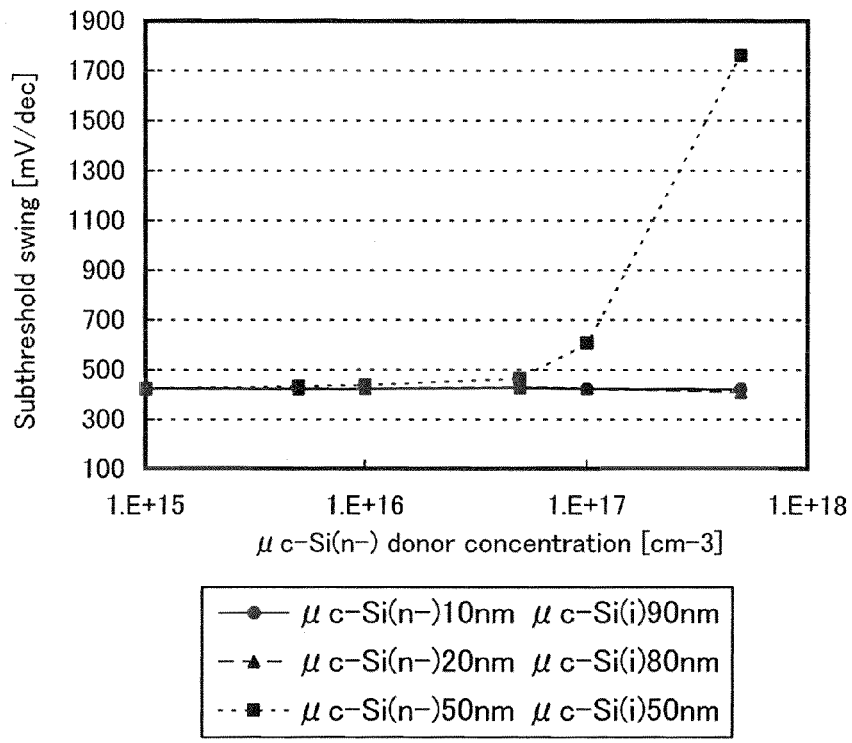
FIGS. 50A and 50B are graphs showing subthreshold swings which are calculated by simulation.
Figure 50B:
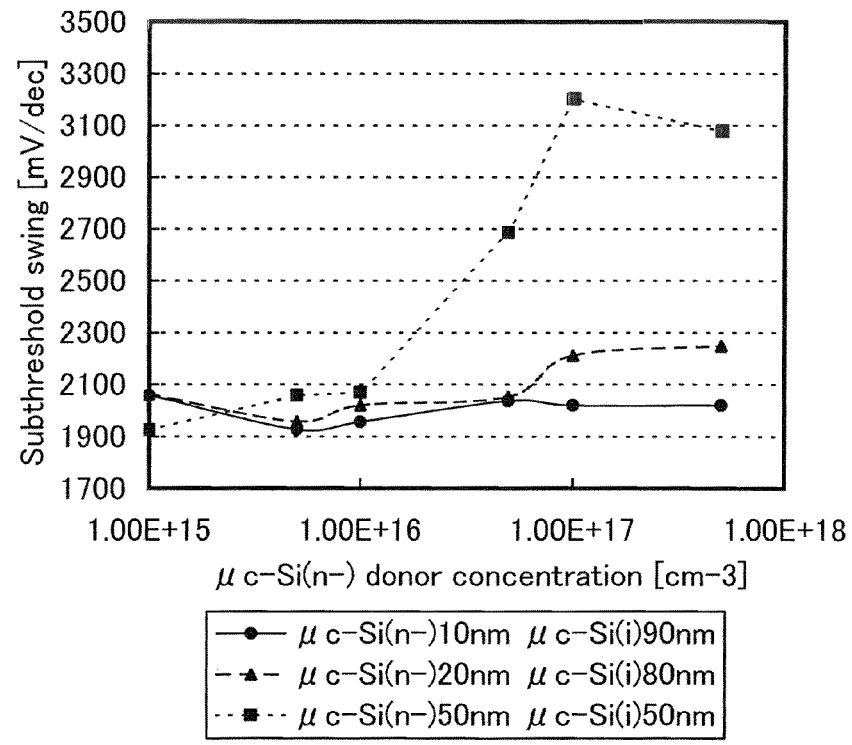

Adding the impurity element to the semiconductor layer increases the subthreshold swing due to the impurity diffusion. FIGS. 50A and 50B, which show the above calculation results, apparently show such a tendency. Further, the subthreshold swing also increases by increasing the thickness of the semiconductor layer to which the impurity element is added. A probable cause of this is that the total number of impurity element increases and the number of donor levels increases, whereby the conduction electrons are more likely to be diffused.

Maximum filed effect mobility is presented below based on the result of the device simulation.

Figure 52A:
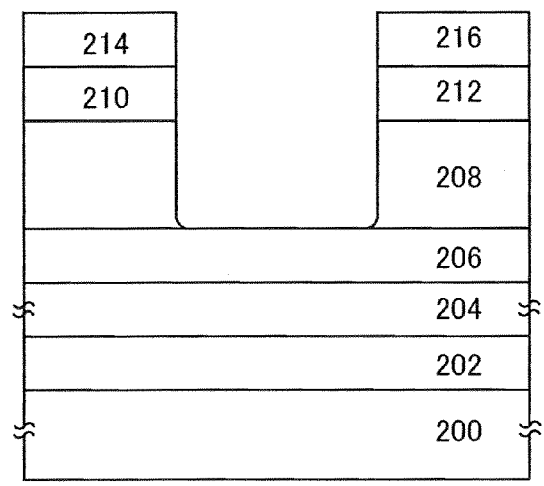
FIGS. 52A and 52B are drawings showing an element structure of a thin film transistor and 52C is an equivalent circuit diagram thereof.

To examine the maximum filed effect mobility, it is necessary to consider the field effect mobility in more detail. Thus, such a device structure as shown in FIG. 52A is given: a TFT including an insulating substrate 200, a gate electrode 202, a gate insulating film 204, a first semiconductor layer 206, second semiconductor layers 208, a source region 210, a drain region 212, a source electrode 214, and a drain electrode 216.

Figure 52B:
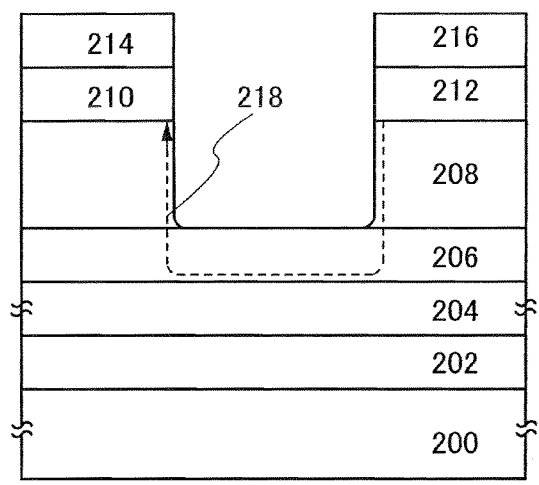

In FIG. 52B, a broken line 218 shows a path through which a drain current flows between the drain electrode 216 and the source electrode 214 when the TFT is turned on, in other words, adequate positive potential is applied to the gate electrode 202; the source electrode 214 is grounded to have ground potential; and positive potential is applied to the drain electrode 216.

Figure 52C:
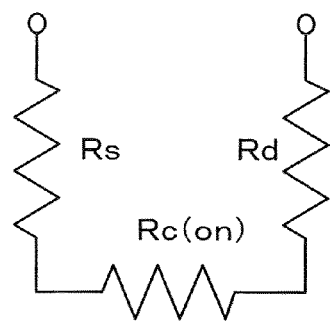

The drain current flows through the drain electrode 216, the drain region 212, the second semiconductor layer 208, a region in the first semiconductor layer 206 which is near to an interface with the gate insulating film 204, the second semiconductor layer 208, the source region 210, and the source electrode 214. FIG. 52C shows an equivalent circuit diagram at this time. Here, a resistance Rs mainly shows a resistance value of the second semiconductor layer 208 in forward connection; a resistance Rd mainly shows a resistance value of a portion of the second semiconductor layer 208 which is depleted; and a resistance Rc(on) mainly shows a resistance value of a portion of the first semiconductor layer 206 which is inverted. Here, the portion of the first semiconductor layer 206 which is inverted means a portion of the first semiconductor layer 206 in a state where conduction electrons are induced at the interface between the first semiconductor layer 206 and the gate insulating film 204 by applying potential to the gate electrode 202. It can be considered that the resistance Rs is much smaller than the resistance Rd or the resistance Rc(on).

In an actual device structure, typically, the resistance Rd is formed in the second semiconductor layer 208 with a thickness of approximately 200 nm. Typically, further, the resistance Rc(on) is formed in the first semiconductor layer 206 with a length of approximately 6 μm. Therefore, when the resistance value per unit length of the portion of the second semiconductor layer 208 which is depleted is approximately 30 times or more as high as that of the portion of the first semiconductor layer 206 which is inverted, it is probable that the resistance Rd will have the greatest influence on the drain current. Furthermore, when the resistance value per unit length of the portion of the second semiconductor layer 208 which is depleted is approximately 30 times or less as high as that of the portion of the first semiconductor layer 206 which is inverted, it is probable that the resistance Rc(on) will have the greatest influence on the drain current.

It is probable that the resistance Rc(on) decreases from a value which is much higher than the resistance Rd to a value which is as high as or almost as high as the resistance Rd, and further to a value which is much lower than the resistance Rd as the gate voltage increases. Further, it is probable that the drain current increases suddenly as the resistance Rc(on) decreases from a value much higher than the resistance Rd to a value which is as high as or almost as high as the resistance Rd. On the other hand, when the resistance Rc(on) comes to have a value which is much lower than the resistance Rd, a decrease in the resistance Rc(on) has less influence on the drain current. Further, it is probable that the resistance Rd decreases as the drain voltage increases.

Figure 53:
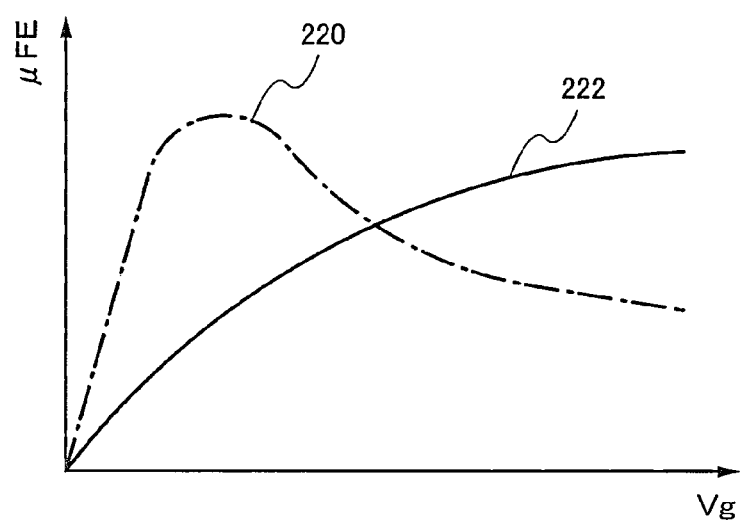
FIG. 53 is a graph illustrating maximum field effect mobilities of a thin film transistor.

The field effect mobility can be considered as the rate of increase in the drain current Id with respect to an increase in the gate voltage Vg. That is to say, when the drain voltage is low (the resistance Rd is high), the field effect mobility has a maximum value as the gate voltage increases. Further, when the drain voltage is high (the resistance Rd is low), the field effect mobility increases monotonously as the gate voltage increases. FIG. 53 shows such a situation. To examine the maximum filed effect mobility, the field effect mobility when the drain voltage is low is designated by a broken line 220. When the drain voltage is low, the maximum filed effect mobility has a maximum value in FIG. 53. Further, a solid line 222 shows the field effect mobility when the drain voltage is high. When the drain voltage is high, the maximum filed effect mobility has a maximum value when Vg has a maximum value in FIG. 53.

Figure 51A:
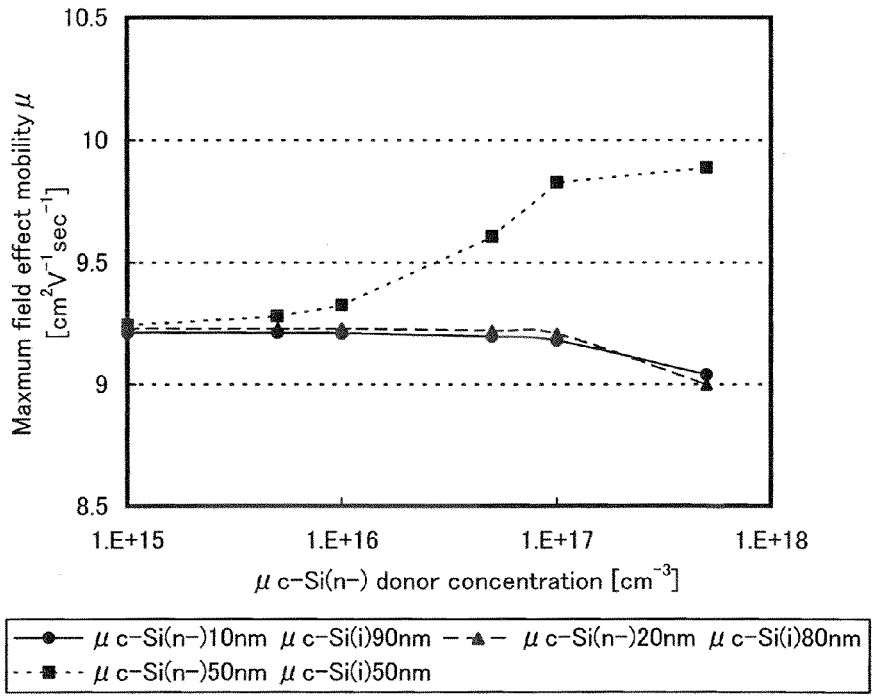
FIGS. 51A and 51B are graphs showing maximum field effect mobilities which are calculated by simulation.
Figure 51B:
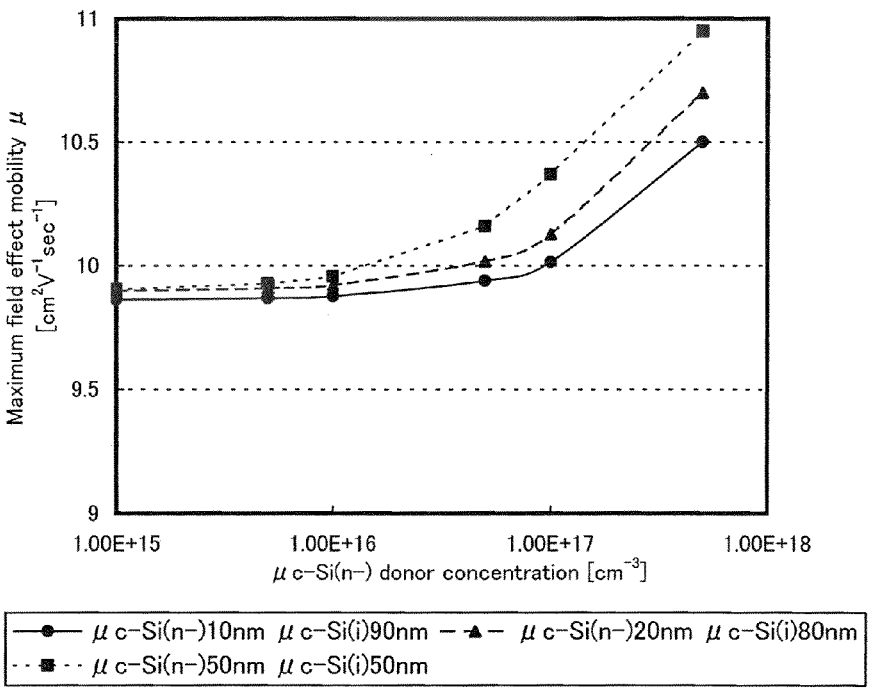

In addition to the above examination, in consideration of the minus shift of Id curve in the direction of the Vg axis which is caused by increasing the donor concentration, description is made on FIGS. 51A and 51B, which show the calculation results of the above.

In FIG. 51B, when the drain voltage is high (Vd=14 V), the maximum filed effect mobility improves as the donor concentration increases. A cause of the above phenomenon can be explained easily when the minus shift of the threshold voltage which is caused by adding an impurity element is taken into consideration of the above case where the drain voltage is high in FIG. 53.

On the other hand, when the drain voltage is low (Vd=1 V), there arise some patterns of tendency, as shown in FIG. 51A. When the semiconductor layer to which the impurity element is added has a small thickness, for example, in the results of μc-Si (n−) with thicknesses of 10 nm and 20 nm in FIG. 51A, the maximum filed effect mobility decreases as the donor concentration increases. A cause of the above phenomenon can be explained easily when a decrease in the field effect mobility which is caused by diffusion of the impurity element is taken into consideration of the above case where the drain voltage is low.

When the semiconductor layer to which the impurity element is added has a large thickness, for example, in the result of μc-Si (n−) with a thickness of 50 nm in FIG. 51A, the maximum filed effect mobility increases as the donor concentration increases. By increasing the thickness of the semiconductor layer to which the impurity element is added, a region of the semiconductor layer which contributes to conduction increases. Thus, the field effect mobility increases. It is probable that a cause of the result of (n−) with a thickness of 50 nm in FIG. 51A is that improvement in the field effect mobility which is due to an increase in the thickness of the semiconductor layer counteracts a decrease in the field effect mobility which is due to diffusion of the impurity element.

When the donor concentration is $1 \times 10^{15}$ atoms/cm$^3$, the microcrystalline semiconductor film can be regarded as not including a donor substantially, i.e., not including the impurity element which serves as a donor substantially. FIGS. 51A and 51B demonstrate that the maximum filed effect mobility increases when the microcrystalline semiconductor film includes the donor.

Embodiment 6

Since the thin film transistor of the present invention can operate at high speed, the frame frequency can be increased in operating a liquid crystal display device. Here, characteristics of a thin film transistor which can be manufactured in a pixel portion of a liquid crystal display device in which display characteristics of moving images are improved and which is capable of smooth display by quadrupling the frame frequency (e.g., 480 Hz or 400 Hz) and interpolating image data, and the concentration of the impurity element which serves as a donor which is included in a channel formation region and contributes to achieving the characteristics were calculated.

Figure 54:
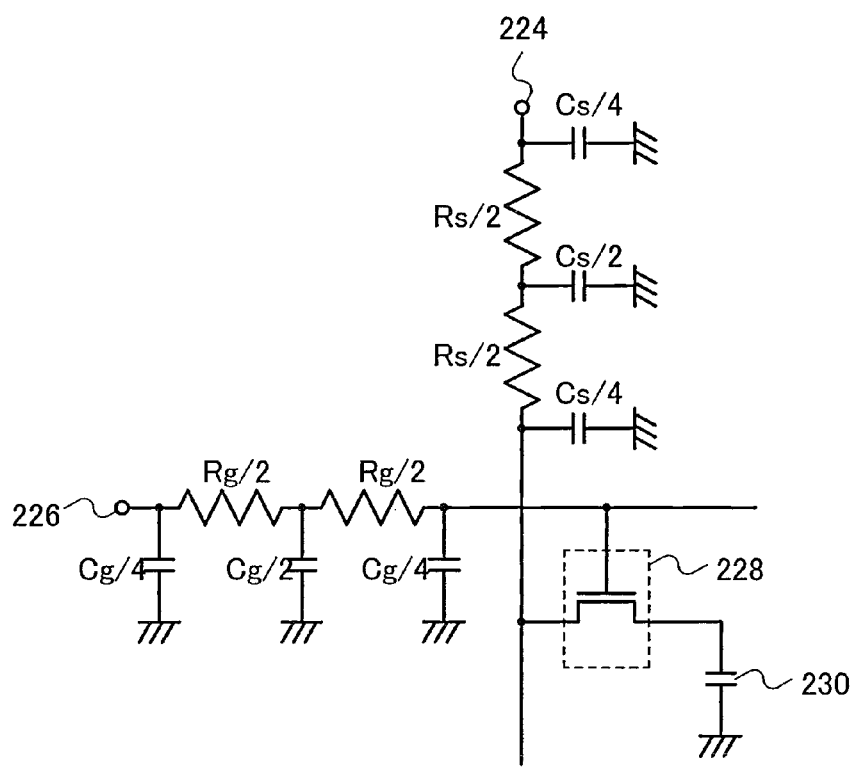
FIG. 54 is a circuit diagram used for circuit simulation.

The specification of the liquid crystal display device which is used in this simulation is as follows:
 HDTV: (number of pixels: 1920×1080) 1125p, 11.7 inches (278.4 mm×156.6 mm)
 VA mode
 pixel capacity: 88 fF
 gate signal line (sheet resistance: 0.3 Ω/square; line width: 7 μm) resistance: 11.9 kΩ; capacity: 495 pF
 video signal line (sheet resistance: 0.14 Ω/square; line width 5 μm) resistance: 4.4 kΩ; capacity: 126 pF
  pixel TFT: L/W=6 μm/15 μm
  driving voltage of the gate signal line: 24 V
  video signal: 4.5 to 17.5 V FIG. 54 is a circuit diagram which is used for the circuit simulation. A pixel TFT 228 is used in which there occurs maximum signal delay because of parasitic capacitance and wiring resistance of a video signal line 224 and a gate signal line 226. In FIG. 54, Cg, Rg, Cs, and Rs represent parasitic capacitance of the video signal line 224, wiring resistance of the video signal line 224, parasitic capacitance of the gate signal line 226, and wiring resistance of the gate signal line 226, respectively. The circuit simulation was carried out using a double-π circuit.

In the circuit shown in FIG. 54, high potential (24 V) is applied to the video signal line 224 and a video signal (17.5 V) is input to the gate signal line 226, and delay time until when the potential of a pixel electrode 230 reaches a desired value (17.5 V (video signal)−0.1 V=17.4 V) was calculated with a circuit simulator. When the delay time is less than or equal to 3.7 μs (a period in which one gate is selected in quadruple frame rate display), the pixel TFT 228 can be regarded as have the TFT characteristics which is required for the quadruple frame rate display. The above operation is repeated as model parameter of the pixel TFT 228 is changed, whereby requisites for the TFT characteristics which are necessary for the pixel TFT 228 are obtained.

Characteristics of a pixel TFT which are required for quadruple frame rate display are as follows:
 on-current: higher than or equal to $4.11×10^{-6}$ A (Vd=1 V, Vg=20 V); higher than or equal to $5.54×10^{-4}$ A (Vd=14 V, Vg=20 V)
 threshold voltage: lower than or equal to 0.5 V (Vd=1 V); lower than or equal to 1.94 V (Vd=14 V)
 subthreshold swing: less than or equal to 0.836 V/dec. (Vd=1 V); less than or equal to 0.845 V/dec. (Vd=14 V)
 field effect mobility: greater than or equal to 5.46 cm²/Vs (Vd=1 V); greater than or equal to 69.4 cm²/Vs (Vd=14 V)

The thin film transistor in which the microcrystalline silicon film is used for the channel formation region has less variation in the threshold voltage than a thin film transistor in which amorphous silicon is used for a channel formation region, and thus the threshold voltage was set to be higher than or equal to −3 V.

Figure 55:
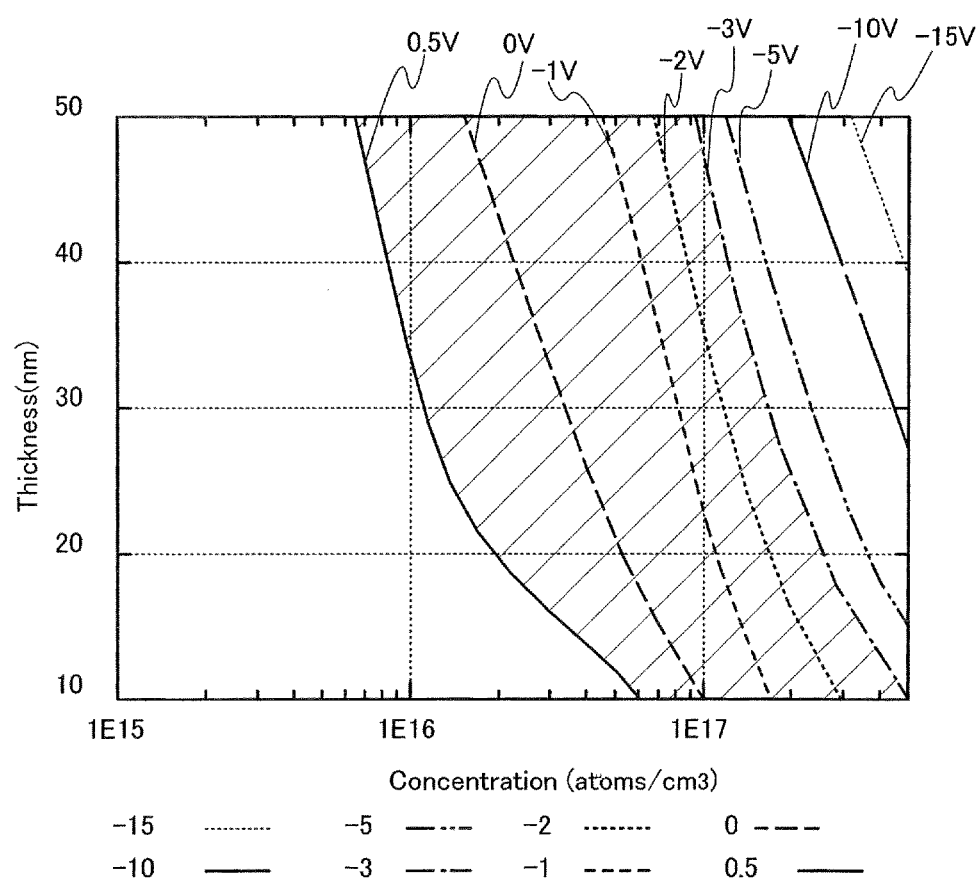
FIG. 55 is a graph illustrating thicknesses and donor concentrations of microcrystalline silicon films, and threshold values.

In FIG. 55, a curve shows a threshold value which is obtained when the thickness of the microcrystalline silicon film including the impurity element which serves as a donor is set to be from 10 to 50 nm and the donor concentration is set to be from $1×10^{15}$ to $5×10^{17}$ atoms/cm³ in the thin film transistors of the models used in Embodiment 5. The threshold value is from −3 to 1 V inclusive according to the above requisites of the TFT characteristics; thus, when the thickness of the microcrystalline silicon film including the impurity element which serves as a donor is from 10 to 50 nm, the donor concentration which satisfies the above range is from $6×10^{15}$ to $5×10^{17}$ atoms/cm³. Note that the donor concentration is shown here, which is different from the concentration of the impurity element which serves as a donor in that the donor concentration depends on the activation rate of the impurity element which serves as a donor.

Therefore, when a thin film transistor in which a microcrystalline silicon film with a donor concentration of from $8×10^{15}$ to $5×10^{17}$ atoms/cm³ is used for a channel formation region is formed in a pixel portion and is used as a switching element of a liquid crystal element, a liquid crystal display device capable of quadruple frame rate display can be manufactured.

This application is based on Japanese Patent Application serial No. 2007-262739 filed with Japan Patent Office on Oct. 5, 2007 and Japanese Patent Application serial No. 2007-267085 filed with Japan Patent Office on Oct. 12, 2007 the entire contents of which are hereby incorporated by reference.

What is claimed is:

1. A manufacturing method of a semiconductor device comprising the steps of:
 forming a first conductive film over a substrate;
 forming a second conductive film over the substrate;
 forming a first insulating film over the first conductive film and the second conductive film;
 forming a second insulating film over the first insulating film;
 forming a first opening and a recessed portion in the second insulating film by using a multi-tone photomask, wherein the first opening exposes a first part of an upper surface of the first insulating film;
 forming a second opening which exposes the second conductive film by etching the first part of the upper surface of the first insulating film;
 forming a third opening by widening the first opening, and a fourth opening by widening the recessed portion, wherein the fourth opening exposes a second part of the upper surface of the first insulating film over the first conductive film; and
 forming an electrode over the second insulating film,
 wherein the electrode is electrically connected to the second conductive film through the second opening and the third opening, and
 wherein the electrode overlaps with the first conductive film and is in contact with the second part of the upper surface of the first insulating film in the fourth opening.

2. The manufacturing method of the semiconductor device according to claim 1, wherein the multi-tone photomask includes a light-transmitting substrate provided with a light-blocking portion and a diffraction grating.

3. The manufacturing method of the semiconductor device according to claim 1, wherein the multi-tone photomask includes a light-transmitting substrate provided with a light-blocking portion and a semi-light-transmitting portion.

4. The manufacturing method of the semiconductor device according to claim 3, wherein the semi-light-transmitting portion comprises any one of materials selected from MoSiN, MoSi, MoSiO, MoSiO, MoSiON, and CrSi.

5. The manufacturing method of the semiconductor device according to claim 1, wherein the first insulating film comprises silicon and nitrogen.

6. The manufacturing method of the semiconductor device according to claim 5, wherein the first insulating film is a silicon nitride film.

7. The manufacturing method of the semiconductor device according to claim 1, wherein the second insulating film is a photosensitive organic resin.

8. The manufacturing method of the semiconductor device according to claim 1, wherein the second opening is surrounded by the third opening.

9. The manufacturing method of the semiconductor device according to claim 1, wherein the electrode, the first insulating film, and the first conductive film in the fourth opening form a capacitor element.

10. The manufacturing method of the semiconductor device according to claim 1, wherein the first opening and the recessed portion are widened by ashing on the second insulating film.

11. The manufacturing method of the semiconductor device according to claim 1, wherein a depth of the first opening is deeper than that of the recessed portion in the second insulating film.

12. The manufacturing method of the semiconductor device according to claim 1, wherein a depth of the fourth opening is deeper than that of the third opening.

13. A manufacturing method of a semiconductor device comprising the steps of:
    forming a conductive film over a substrate;
    forming a transistor comprising a gate electrode, a source electrode, and a drain electrode over the substrate;
    forming a first insulating film over the conductive film and the transistor;
    forming a second insulating film over the first insulating film;
    forming a first opening and a recessed portion in the second insulating film by using a multi-tone photomask, wherein the first opening exposes a first part of an upper surface of the first insulating film;
    forming a second opening which exposes an upper part of one of the source electrode and the drain electrode by etching the first part of the upper surface of the first insulating film;
    forming a third opening by widening the first opening, and a fourth opening by widening the recessed portion, wherein the fourth opening exposes a second part of the upper surface of the first insulating film over the conductive film; and
    forming an electrode over the second insulating film,
    wherein the electrode is electrically connected to the one of the source electrode and the drain electrode through the second opening and the third opening, and
    wherein the electrode overlaps with the conductive film and is in contact with the second part of the upper surface of the first insulating film in the fourth opening.

14. The manufacturing method of the semiconductor device according to claim 13, wherein the multi-tone photomask includes a light-transmitting substrate provided with a light-blocking portion and a diffraction grating.

15. The manufacturing method of the semiconductor device according to claim 13, wherein the multi-tone photomask includes a light-transmitting substrate provided with a light-blocking portion and a semi-light-transmitting portion.

16. The manufacturing method of the semiconductor device according to claim 15, wherein the semi-light-transmitting portion comprises any one of materials selected from MoSiN, MoSi, MoSiO, MoSiO, MoSiON, and CrSi.

17. The manufacturing method of the semiconductor device according to claim 13, wherein the first insulating film comprises silicon and nitrogen.

18. The manufacturing method of the semiconductor device according to claim 17, wherein the first insulating film is a silicon nitride film.

19. The manufacturing method of the semiconductor device according to claim 13, wherein the second insulating film is a photosensitive organic resin.

20. The manufacturing method of the semiconductor device according to claim 13, wherein the second opening is surrounded by the third opening.

21. The manufacturing method of the semiconductor device according to claim 13, wherein the electrode, the first insulating film, and the conductive film in the fourth opening form a capacitor element.

22. The manufacturing method of the semiconductor device according to claim 13, wherein the first opening and the recessed portion are widened by ashing on the second insulating film.

23. The manufacturing method of the semiconductor device according to claim 13, wherein the gate electrode of the transistor and the conductive film comprise a same material.

24. The manufacturing method of the semiconductor device according to claim 13, wherein a depth of the first opening is deeper than that of the recessed portion in the second insulating film.

25. The manufacturing method of the semiconductor device according to claim 13, wherein a depth of the fourth opening is deeper than that of the third opening.

* * * * *